(12) United States Patent
Kim et al.

(10) Patent No.: US 11,903,199 B2
(45) Date of Patent: Feb. 13, 2024

(54) THROUGH VIA STRUCTURE, SEMICONDUCTOR DEVICE INCLUDING THE THROUGH VIA STRUCTURE, AND MASSIVE DATA STORAGE SYSTEM INCLUDING THE SEMICONDUCTOR DEVICE

(71) Applicant: Samsung Electronics Co., Ltd., Suwon-si (KR)

(72) Inventors: Jeeyong Kim, Hanam-si (KR); Junghwan Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 210 days.

(21) Appl. No.: 17/351,486

(22) Filed: Jun. 18, 2021

(65) Prior Publication Data

US 2022/0302157 A1 Sep. 22, 2022

(30) Foreign Application Priority Data

Mar. 22, 2021 (KR) .................. 10-2021-0036567

(51) Int. Cl.
*H10B 43/27* (2023.01)
*H01L 23/522* (2006.01)
*H10B 41/10* (2023.01)
*H10B 41/27* (2023.01)
*H10B 41/35* (2023.01)
*H10B 43/10* (2023.01)
*H10B 43/35* (2023.01)

(52) U.S. Cl.
CPC ......... *H10B 43/27* (2023.02); *H01L 23/5226* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 41/10; H10B 43/35; H10B 41/35; H10B 43/10; H10B 41/27; H01L 23/5226
See application file for complete search history.

(56) References Cited

U.S. PATENT DOCUMENTS

| | | | |
|---|---|---|---|
| 5,290,358 A * | 3/1994 | Rubloff | ................. C23C 16/455 118/725 |
| 6,429,128 B1 * | 8/2002 | Besser | .............. H01L 21/76834 438/653 |
| 7,034,398 B2 | 4/2006 | Kajita et al. | |
| 7,445,996 B2 | 11/2008 | McDaniel | |
| 8,153,520 B1 * | 4/2012 | Chandrashekar | ... H01L 21/7684 438/457 |

(Continued)

FOREIGN PATENT DOCUMENTS

| | | |
|---|---|---|
| KR | 10-1001151 B1 | 12/2010 |
| KR | 10-2012-0033640 A | 4/2012 |

*Primary Examiner* — Lex H Malsawma
*Assistant Examiner* — Sean Ayers Winters
(74) *Attorney, Agent, or Firm* — Harness, Dickey & Pierce, P.L.C.

(57) ABSTRACT

A through via structure includes a through via and a capping pattern. The through via includes a metal pattern extending in a vertical direction, and a barrier pattern on a sidewall and a lower surface of the metal pattern. The capping pattern contacts an upper surface of the through via. A lowermost surface of an edge portion of the capping pattern is not higher than a lowermost surface of a central portion of the capping pattern.

19 Claims, 52 Drawing Sheets

(56) References Cited

U.S. PATENT DOCUMENTS

| | | |
|---|---|---|
| 8,940,635 B1 | 1/2015 | Chi et al. |
| 9,472,454 B2 | 10/2016 | Hotta et al. |
| 10,290,652 B1 | 5/2019 | Sharangpani et al. |
| 10,741,657 B2 | 8/2020 | Lee |
| 2002/0086523 A1* | 7/2002 | Barth .................. H01L 23/5226 257/E21.582 |
| 2003/0111735 A1* | 6/2003 | Lee .................... H01L 21/76868 257/E21.585 |
| 2004/0214436 A1 | 10/2004 | Dow |
| 2008/0251928 A1* | 10/2008 | Chang ............... H01L 21/76849 257/E23.161 |
| 2009/0127711 A1* | 5/2009 | Bonilla ............. H01L 21/76883 257/E21.495 |
| 2012/0252208 A1* | 10/2012 | Jang .................. H01L 21/76849 438/653 |
| 2016/0225983 A1* | 8/2016 | Lin ........................ H10N 70/20 |
| 2018/0108610 A1* | 4/2018 | Yang ..................... H01L 21/7684 |
| 2020/0035796 A1* | 1/2020 | Lee ................. H01L 21/823475 |
| 2020/0098626 A1 | 3/2020 | Chowdhury et al. |
| 2020/0203256 A1* | 6/2020 | Neal .................. H01L 23/49827 |
| 2020/0212046 A1* | 7/2020 | Ishii ....................... H10B 12/02 |
| 2020/0303284 A1* | 9/2020 | Yang ..................... H01L 23/481 |

\* cited by examiner

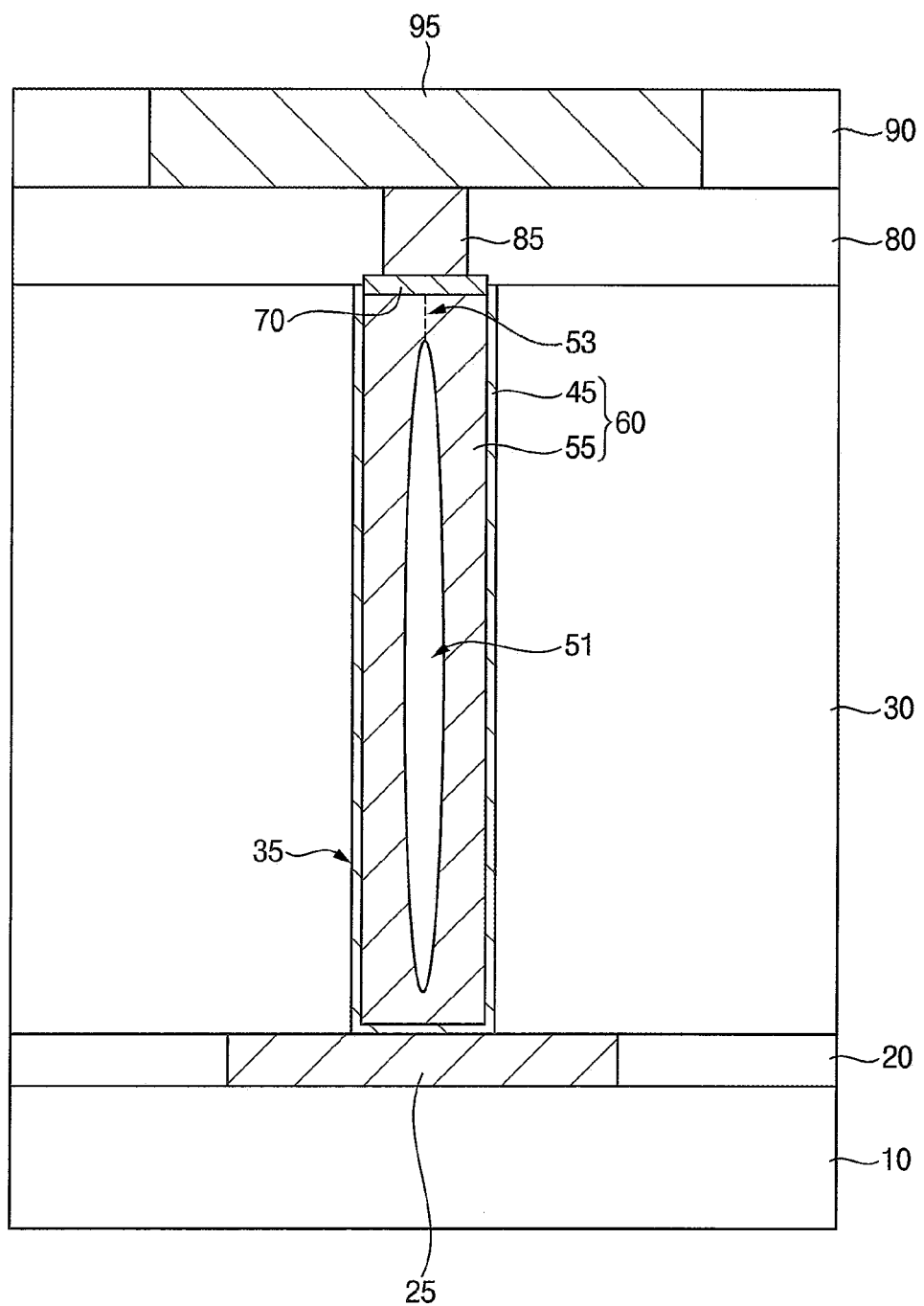

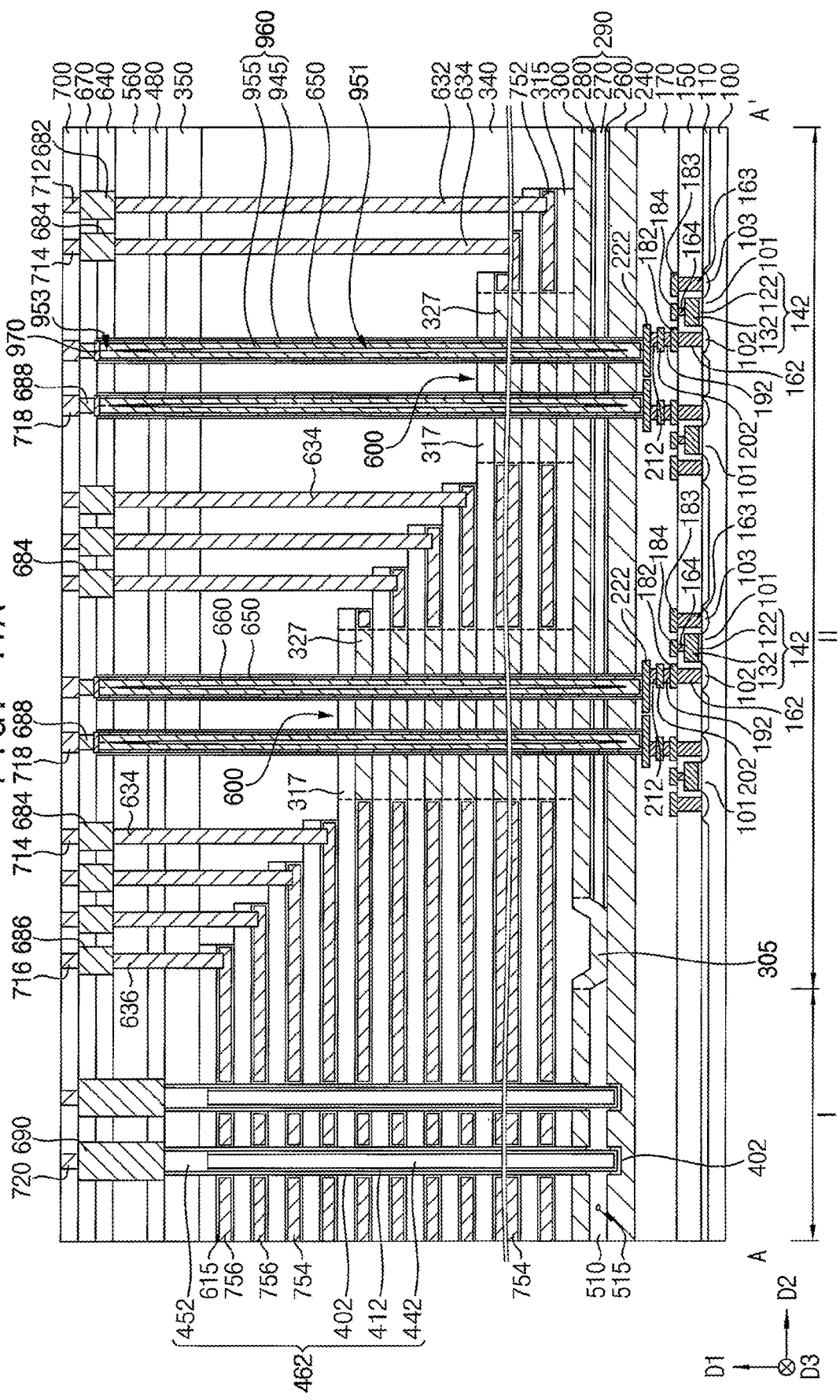

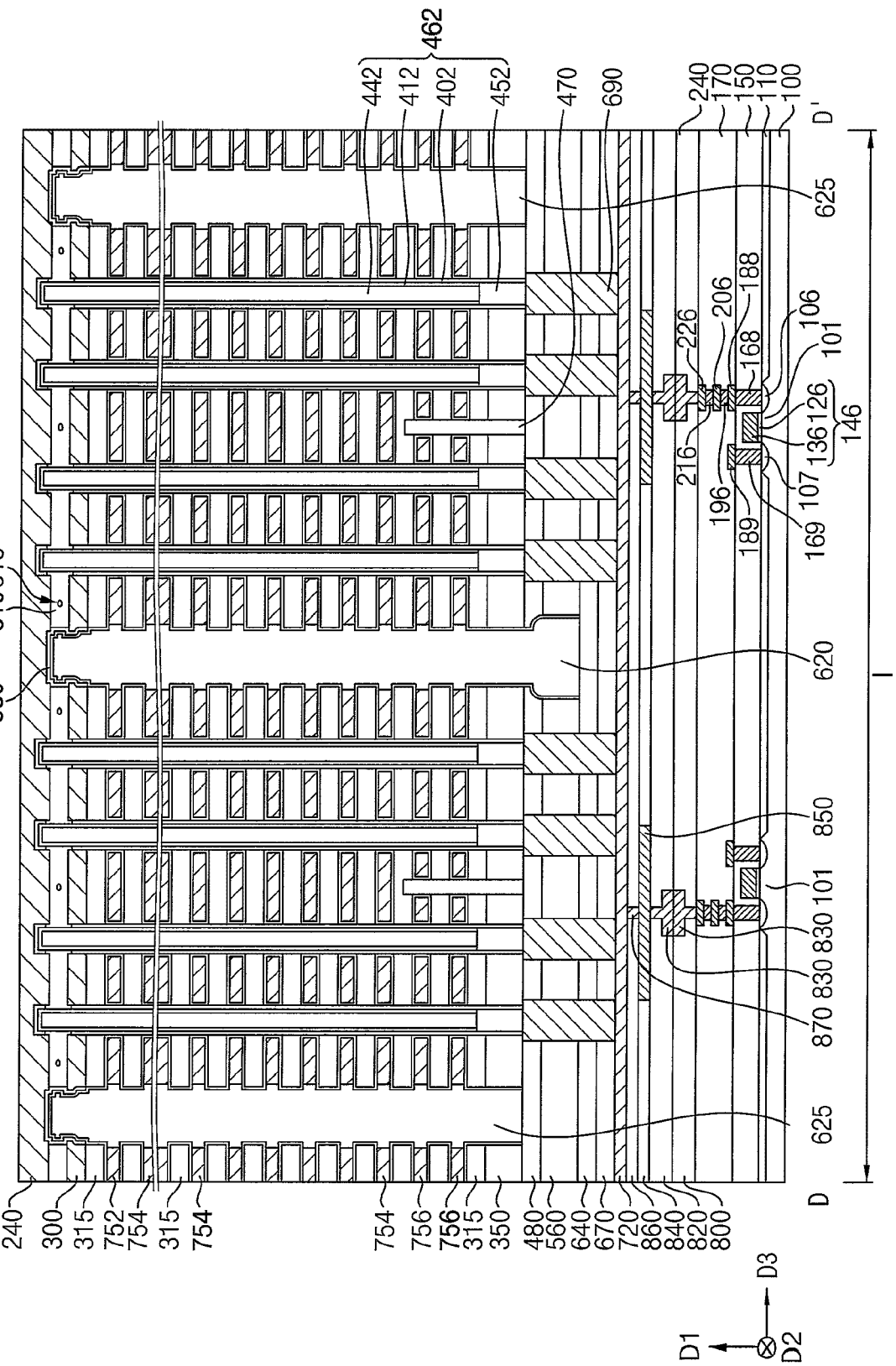

THROUGH VIA STRUCTURE, SEMICONDUCTOR DEVICE INCLUDING THE THROUGH VIA STRUCTURE, AND MASSIVE DATA STORAGE SYSTEM INCLUDING THE SEMICONDUCTOR DEVICE

CROSS-REFERENCE TO RELATED APPLICATIONS

This application claims priority under 35 USC § 119 to Korean Patent Application No. 10-2021-0036567, filed on Mar. 22, 2021 in the Korean Intellectual Property Office (KIPO), the contents of which are herein incorporated by reference in their entirety.

BACKGROUND

1. Field

The inventive concepts relate to a through via structure, a semiconductor device including the through via structure, and a massive data storage system including the semiconductor device.

2. Description of the Related Art

Electronic systems requiring data storage need high capacity semiconductor devices that can store high capacity data. Thus, a method of increasing the data storage capacity of the semiconductor device has been studied. For example, a semiconductor device including memory cells that may be 3-dimensionally stacked has been suggested.

As the number of stacks of the memory cells in the semiconductor device increases, an aspect ratio of a through via for transferring electrical signals between lower wirings and upper wirings may increase, and thus forming the through via is not easy.

SUMMARY

Example embodiments provide a through via structure having improved characteristics.

Example embodiments provide a semiconductor device including a through via structure having improved characteristics.

Example embodiments provide a massive data storage system containing a semiconductor device including a through via structure having improved characteristics.

According to an aspect of the inventive concepts, there is provided a through via structure. The through via structure may include a through via and a capping pattern. The through via may include a metal pattern extending in a vertical direction, and a barrier pattern on a sidewall and a lower surface of the metal pattern. The capping pattern may contact an upper surface of the through via. A lowermost edge portion of the capping pattern might not be higher than a lowermost central portion of the capping pattern.

According to an aspect of the inventive concepts, there is provided a through via structure. The through via structure may include an insulating interlayer, a through via, and a first capping pattern. The through via may include a metal pattern extending through the insulating interlayer in a vertical direction and including a first metal and a void, and a barrier pattern on a sidewall and a lower surface of the metal pattern and including a nitride of a second metal. The first capping pattern may contact an upper surface of the through via and include at least one of a metal silicide of the first metal or a compound of the first metal and silicon nitride. A lowermost edge portion of the first capping pattern might not be higher than a lowermost central portion of the capping pattern.

According to an aspect of the inventive concepts, there is provided a semiconductor device. The semiconductor device may include lower circuit patterns on a substrate, a common source plate (CSP) over the lower circuit patterns, a gate electrode structure on the CSP, a memory channel structure extending through the gate electrode structure on the substrate and connected to the CSP, and a through via structure. The gate electrode structure may include gate electrodes spaced apart from each other in a vertical direction perpendicular to an upper surface of the substrate, and each of the gate electrodes may extend in a second direction parallel to the upper surface of the substrate. The memory channel structure may include a channel extending in the vertical direction and a charge storage structure surrounding an outer sidewall of the channel. The through via structure may include a through via and a capping pattern. The through via may include a metal pattern and a barrier pattern on a sidewall and a lower surface of the metal pattern. The capping pattern may contact an upper surface of the through via. A lowermost edge portion of the capping pattern might not be higher than a lowermost central portion of the capping pattern.

According to an aspect of the inventive concepts, there is provided a massive data storage system. The massive data storage system may include a semiconductor device, an input/output pad, and a controller. The semiconductor device may have lower circuit patterns on a substrate, a common source plate (CSP) over the lower circuit patterns, a memory cell structure, and a through via structure. The memory cell structure may include a gate electrode structure on the CSP, and a memory channel structure extending through the gate electrode structure on the substrate and connected to the CSP. The gate electrode structure may include gate electrodes spaced apart from each other in a vertical direction perpendicular to an upper surface of the substrate, and each of the gate electrodes may extend in a second direction parallel to the upper surface of the substrate. The memory channel structure may include a channel extending in the vertical direction and a charge storage structure surrounding an outer sidewall of the channel. The through via structure may extend in the first direction on the substrate and electrically connected to at least one of the lower circuit patterns, and may include a through via and a capping pattern. The through via may include a metal pattern and a barrier pattern covering a sidewall and a lower surface of the metal pattern. The capping pattern may contact an upper surface of the through via. A lowermost edge portion of the capping pattern might not be higher than a lowermost central portion of the capping pattern. The input/output pad may be electrically connected to at least one of the lower circuit patterns. The controller may be electrically connected to the semiconductor device through the input/output pad, and may control the semiconductor device.

In the method of forming the through via structure in accordance with some example embodiments, the capping pattern may be formed on the through via, and thus a source gas for forming the through via and/or an etching gas that may be generated by the combination of the source gas and another element might not outgas. Accordingly, neighboring structures of the through via and the through via itself might not be damaged in subsequent processes. As a result, the through via may have enhanced electrical characteristics.

BRIEF DESCRIPTION OF THE DRAWINGS

FIGS. 1, 2, 3A, 3B and 3C are cross-sectional views illustrating a method of forming a through via structure in accordance with some example embodiments.

FIG. 48 is a cross-sectional view illustrating a semiconductor device in accordance with some example embodiments, which may correspond to FIG. 43.

DETAILED DESCRIPTION

The above and other aspects and features of a through via structure and a method of forming the through via structure, a semiconductor device including the through via structure and a method of manufacturing the semiconductor device, and an electronic system, e.g., a massive data storage system including the semiconductor device in accordance with example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second or third element, component, region, layer, or section without departing from the teachings of inventive concepts. Spatially relative terms, such as "higher," "vertical," "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Thus, the example terms "lower" and "upper" may encompass both an orientation of above and below. The device may be otherwise oriented (rotated 90 degrees or at other orientations) and the spatially relative descriptors used herein interpreted accordingly.

FIGS. 1, 2, 3A, 3B and 3C are cross-sectional views illustrating a method of forming a through via structure in accordance with example embodiments.

Figure 1:
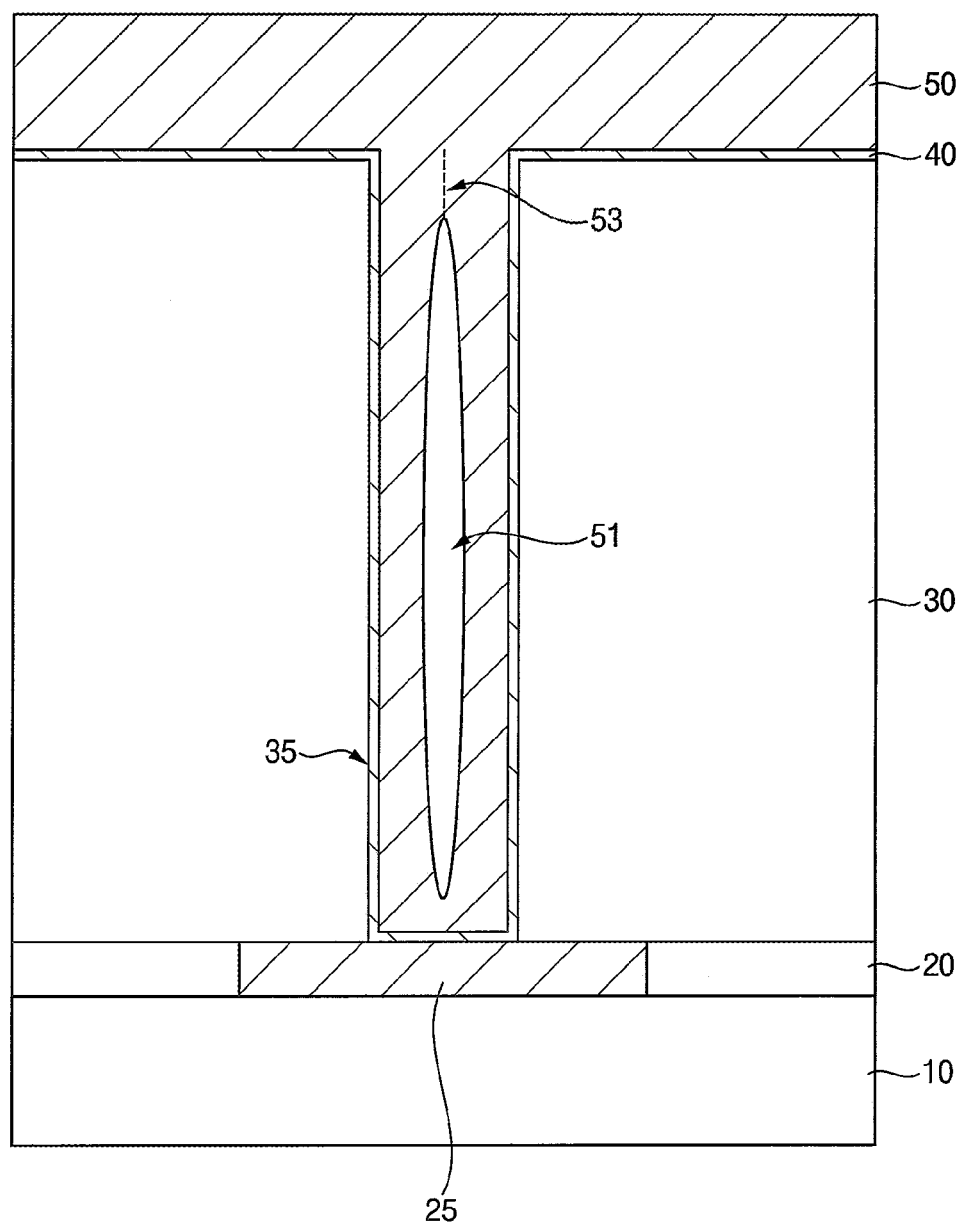

Referring to FIG. 1, a first insulating interlayer 20 may be formed on a substrate 10, a lower wiring 25 may be formed through the first insulating interlayer 20, and a second insulating interlayer 30 may be formed on the first insulating interlayer 20 and the lower wiring 25.

The substrate 10 may be, e.g., a semiconductor substrate, and may include, for example, at least one of silicon, germanium, silicon-germanium, and/or a III-V compound such as GaP, GaAs, GaSb, etc. In some embodiments, the substrate 10 may be a silicon-on-insulator (SOI) substrate or a germanium-on-insulator (GOI) substrate.

Each of the first and second insulating interlayers 20 and 30 may include an insulating material, such as an oxide (e.g., silicon oxide) and/or a low-k dielectric material (e.g., silicon carbonitride). The lower wiring 25 may include a conductive material (e.g., a metal, a metal nitride, a metal silicide, doped polysilicon, etc.).

A first opening 35 may be formed through the second insulating interlayer 30 to expose an upper surface of the lower wiring 25; a barrier layer 40 may be formed on a sidewall of the first opening 35, the exposed upper surface of the lower wiring 25, and/or an upper surface of the second insulating interlayer 30; and a metal layer 50 may be formed on the barrier layer 40 to fill the first opening 35.

In some example embodiments, each of the barrier layer 40 and the metal layer 50 may be formed by a deposition process (e.g., a chemical vapor deposition (CVD) process, an atomic layer deposition (ALD) process, etc.).

In some example embodiments, the first opening 35 may have a high aspect ratio, and thus a void 51 and/or a seam 53 may be formed in the metal layer 50.

The barrier layer 40 may include a metal nitride (e.g., at least one of titanium nitride, tantalum nitride, tungsten nitride, etc.), and the metal layer 50 may include a low resistance metal (e.g., at least one of tungsten, copper, aluminum, etc.).

Figure 2:
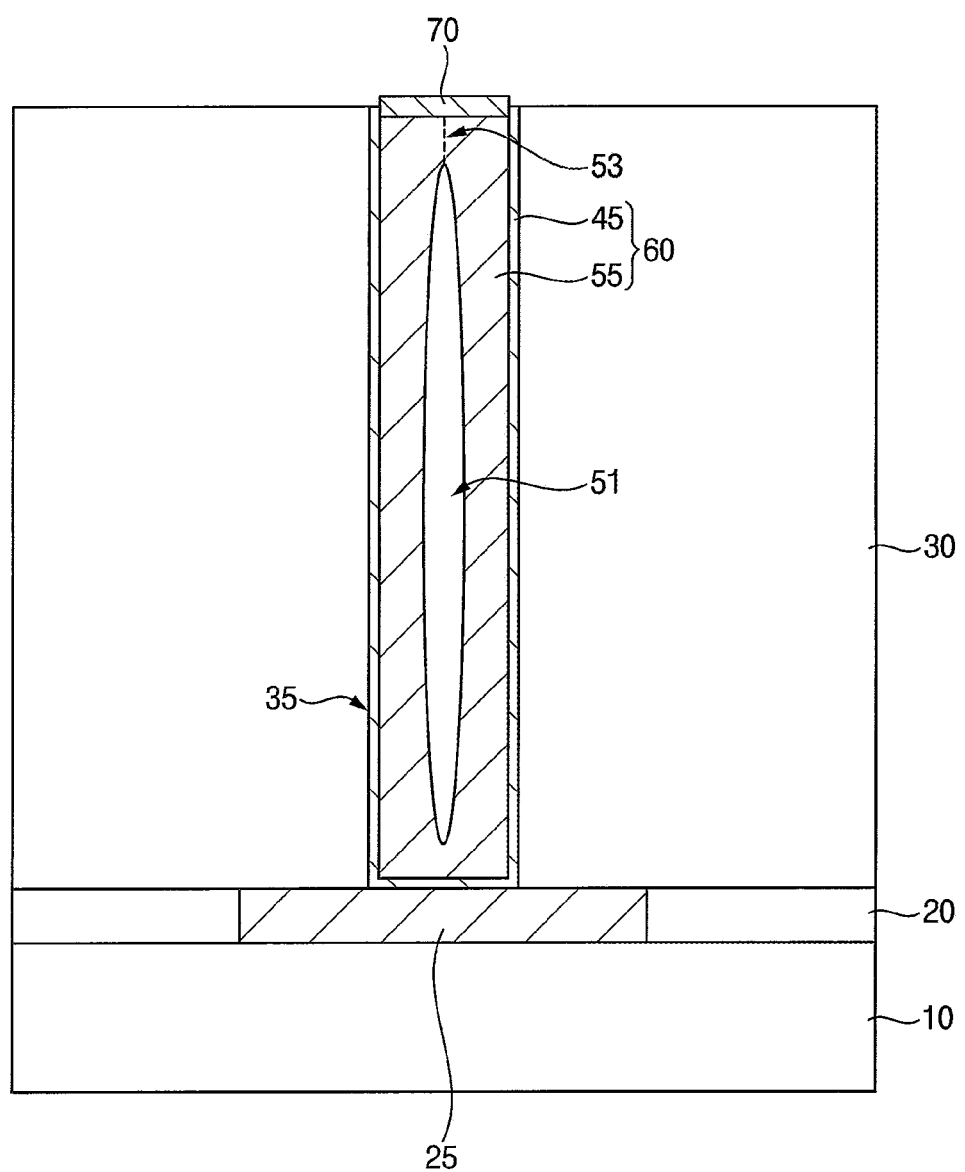

Referring to FIG. 2, after the disposition of the metal layer 50 and the barrier layer 40, an upper surface of the second insulating interlayer 30 may be exposed by removing a portion of the metal layer 50 and the barrier layer 40. For example, the metal layer 50 and the barrier layer 40 may be planarized until the upper surface of the second insulating interlayer 30 is exposed.

In some example embodiments, the planarization process may include, e.g., a chemical mechanical polishing (CMP) process and/or an etch back process. Thus, a metal pattern 55 and a barrier pattern 45 covering a lower surface and a sidewall of the metal pattern 55 may be formed in the first opening 35, and the metal pattern 55 and the barrier pattern 45 may together form a through via 60. The void 51 and/or the seam 53 may remain in the metal pattern 55, and in some cases, a top of the seam 53 may be exposed.

A first capping pattern 70 may be formed on the through via 60, for example, on the metal pattern 55. In some example embodiments, the first capping pattern 70 may include a nitride of a metal included in the metal pattern 55. For example, in some example embodiments, an annealing process may be performed under a nitride atmosphere (e.g., an ammonia (NH3) atmosphere) to selectively form the first capping pattern 70 only on the metal pattern 55 including a metal. During the annealing process, an upper portion of the metal pattern 55 may also be transformed into the first capping pattern 70. Thus, a lower surface of the first capping pattern 70 may be lower than an upper surface of the second insulating interlayer 30, and an upper surface of the first capping pattern 70 may be higher than the upper surface of the second insulating interlayer 30.

The first capping pattern 70 may include a metal nitride that may be nitridated from a metal included in the metal pattern 55. Thus, when the metal pattern 55 includes, e.g., at least one of tungsten, copper, aluminum, etc., the first capping pattern 70 may, respectively, include, e.g., at least one of tungsten nitride, copper nitride, aluminum nitride, etc.

The seam 53 may partially remain in the first capping pattern 70 after the annealing process, and/or may be removed during the annealing process.

Alternatively, an annealing process may be performed under silicon and nitride atmosphere (e.g., silane ($SiH_4$) and ammonia ($NH_3$) atmosphere) and the first capping pattern 70 on the metal pattern 55 may include a compound of a metal included in the metal pattern 55 and silicon nitride. Accordingly, when the metal pattern 55 includes, e.g., at least one of tungsten, copper, aluminum, etc., the first capping pattern 70 may, respectively, include, e.g., at least one of tungsten silicon nitride, copper silicon nitride, aluminum silicon nitride, etc.

Alternatively, the first capping pattern 70 may be formed by a deposition process through a plasma self-aligned process. For example, a first deposition process may be performed using a silicon source gas (e.g., silane ($SiH_4$)) so that an upper portion of the metal pattern 55 may be silicidated to form a metal silicide layer on the metal pattern 55. A second deposition process may be performed using a nitrogen source gas (e.g., ammonia ($NH_3$)) so that the metal silicide layer may be converted into a metal silicon nitride layer. Accordingly, the first capping pattern 70 may include a compound of the metal (e.g., at least one of tungsten, copper, aluminum, etc.) included in the metal pattern 55 and silicon nitride, and may, respectively, include, e.g., at least one of tungsten silicon nitride, copper silicon nitride, aluminum silicon nitride, etc.

In some example embodiments, before the first deposition process a pre-treatment process may be performed using radiofrequency (RF) plasma, and the second deposition process may be performed using RF plasma.

In some example embodiments, the second deposition process may be skipped, and the first capping pattern 70 may include a metal silicide, which may be formed by silicidating the metal included in the metal pattern 55. For example, when the metal pattern 55 includes, e.g., at least one of tungsten, copper, aluminum, etc., the first capping pattern 70 may, respectively, include, e.g., at least one of tungsten silicide, copper silicide, aluminum silicide, etc.

Referring to FIG. 3A, a third insulating interlayer 80 may be formed on the second insulating interlayer 30, the first capping pattern 70 and the barrier pattern 45, a second opening may be formed through the third insulating interlayer 80 to expose an upper surface of the first capping pattern 70, and an upper via 85 may be formed in the second opening to contact the upper surface of the first capping pattern 70.

In an example embodiment, after forming a third insulating interlayer 80, a cleaning process may be further performed to clean an upper surface of the third insulating interlayer 80. The third insulating interlayer 80 may include an oxide (e.g., silicon oxide) or a low-k dielectric material (e.g., silicon carbonitride), and the upper via 85 may include a conductive and/or semiconductive material (e.g., a metal, a metal nitride, a metal silicide, doped polysilicon, etc.).

A fourth insulating interlayer 90 may be formed on the third insulating interlayer 80 and the upper via 85, a third opening may be formed through the fourth insulating interlayer 90 to expose an upper surface of the upper via 85 and a portion of an upper surface of the fourth insulating interlayer 90 adjacent thereto, and an upper wiring 95 may be formed in the third opening to contact the upper surface of the upper via 85.

The fourth insulating interlayer 90 may include an oxide (e.g., silicon oxide), and/or a low-k dielectric material (e.g., silicon carbonitride) and the upper wiring 95 may include a conductive material (e.g., a metal, a metal nitride, a metal silicide, doped polysilicon, etc.).

The through via structure including the through via 60 may be formed by the above processes. In some example embodiments, the first capping pattern 70 may be formed on the through via 60, and even if the source gas used in the deposition process for forming the metal pattern 55 included in the through via 60 remains in the void 51 and/or seam 53, the source gas may be prevented from outgassing by the first capping pattern 70.

For example, the outgas sing of the source gas remaining in the void 51 and/or the seam 53 may result in the source gas combining with another element (e.g., hydrogen) to form an etching gas. In this case, the third insulating interlayer 80 on the through via 60 may be etched by the etching gas, and the metal pattern 55 included in the through via 60 may be damaged by subsequent processes. However, in accordance with example embodiments, the first capping pattern 70 may cover the void 51 and/or the seam 53, and thus the source gas might not outgas out of the void 51 and/or the seam 53, so that damage to the third insulating interlayer 80 and/or metal pattern 55 included in the through via 60 by the source gas or the etching gas generated from the source gas might not be prevented and/or mitigated.

In some embodiments, the through via structure formed by the above processes may have the following structural characteristics.

The through via structure may include the through via 60 and the first capping pattern 70, and the through via 60 may include the metal pattern 55 on the substrate 10 and extending in a vertical direction (e.g., perpendicular to the upper surface of the substrate 10) and the barrier pattern 45 covering the sidewall and the lower surface of the metal pattern 55. The first capping pattern 70 may contact the upper surface of the through via 60, and a lowermost surface of an edge portion of the first capping pattern 70 might not be higher than (e.g., may be level to and/or lower than) a lowermost surface of a central portion of the first capping pattern 70.

For example, in some example embodiments, a lower surface of the first capping pattern 70 may have a uniform height.

In some example embodiments, the first capping pattern 70 may be formed only on the upper surface of the metal pattern 55, and might not contact the uppermost surface of the barrier pattern 45. For example, the uppermost surface of the barrier pattern 45 may directly contact the third insulating interlayer 80. The upper surface of the first capping pattern 70 may be higher than an uppermost surface of the barrier pattern 45, and the lower surface of the first capping pattern 70 may be lower than the uppermost surface of the barrier pattern 45.

Figure 3B:
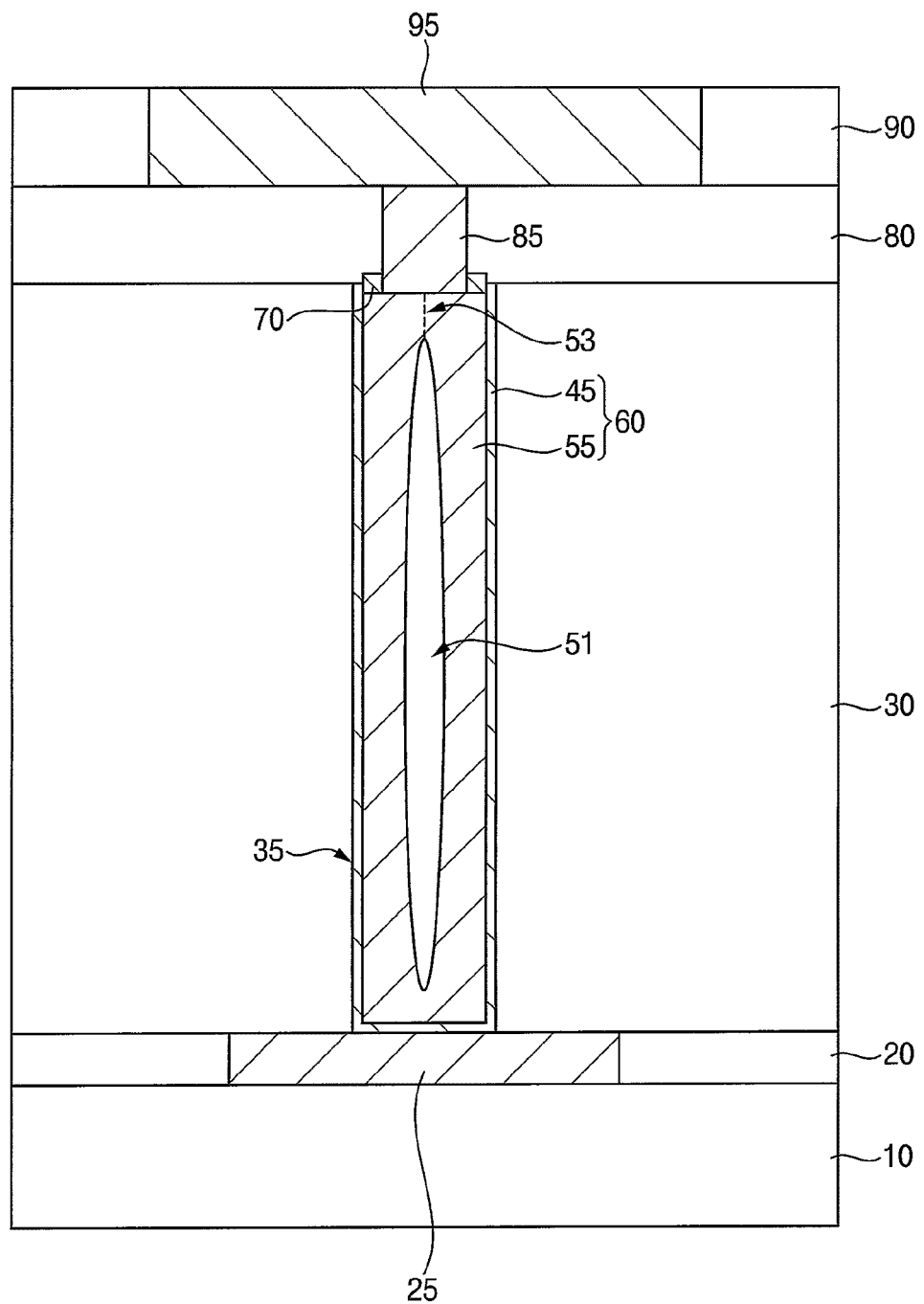

Referring to FIG. 3B, the second opening may penetrate through the first capping pattern 70 to expose the upper surface of the metal pattern 55, so that the first capping pattern 70 may remain only on an upper surface of an edge portion of the metal pattern 55, and that the upper via 85 filling the second opening may directly contact the upper surface of the metal pattern 55.

Figure 3C:
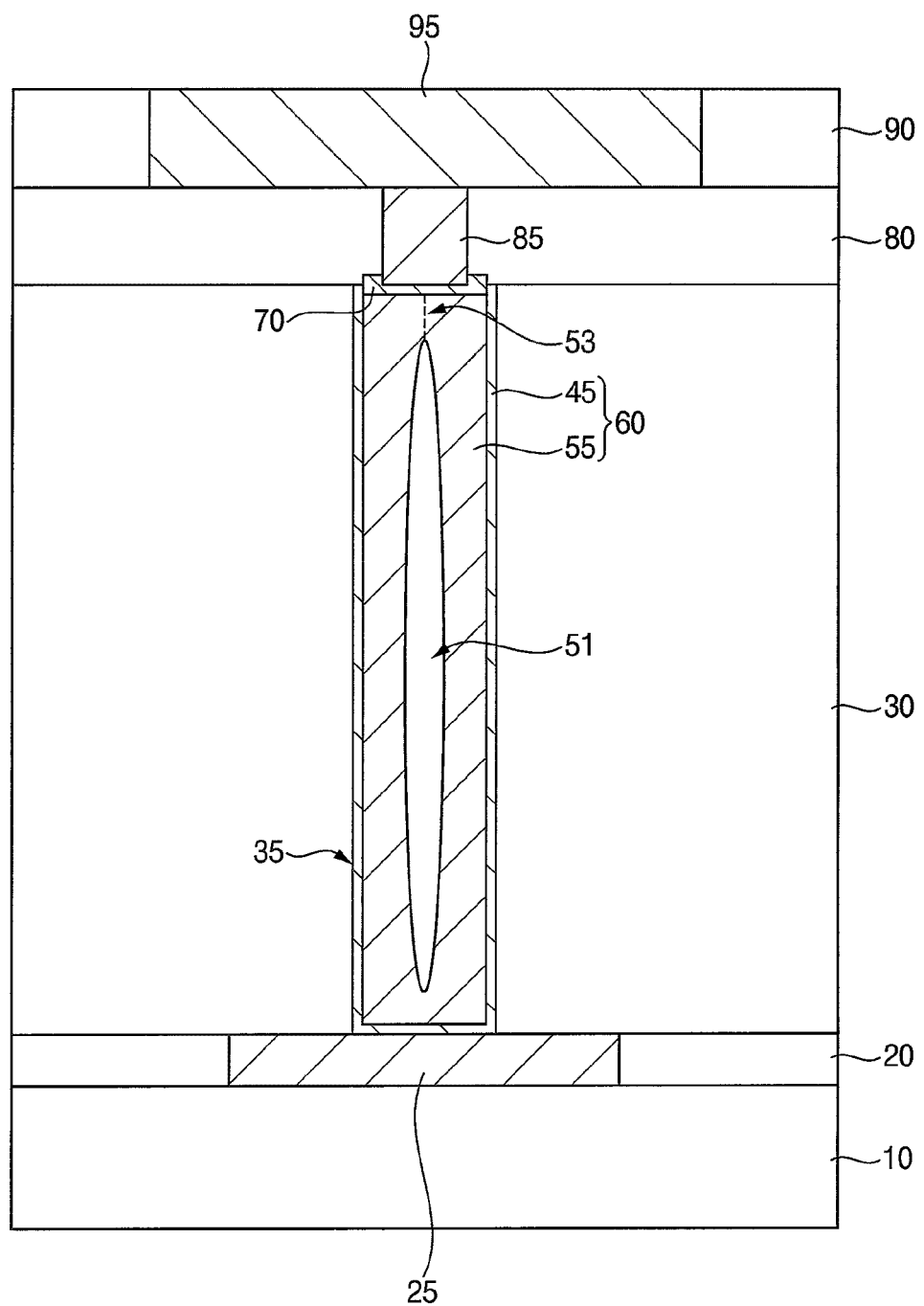

Referring to FIG. 3C, the second opening may penetrate through an upper portion of the first capping pattern 70, and thus a lower surface of the upper via 86 filling the second opening may be lower than the uppermost surface of the first capping pattern 70.

Figure 4:
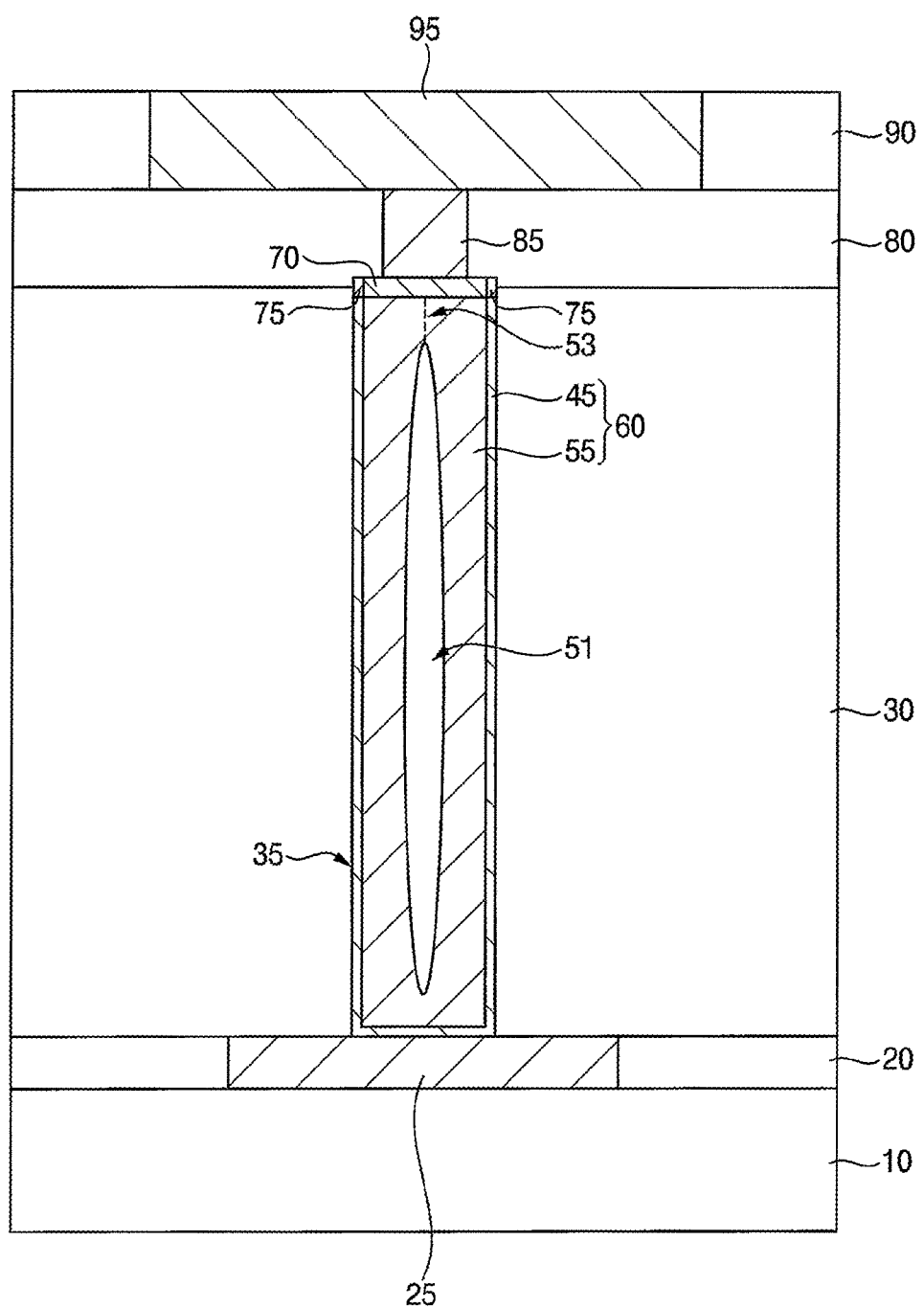
FIG. 4 is a cross-sectional view illustrating a through via structure in accordance with some example embodiments.

FIG. 4 is a cross-sectional view illustrating a through via structure in accordance with example embodiments. This through via structure may be substantially the same as or similar to that of FIG. 3A, except for a second capping pattern.

Referring to FIG. 4, the through via structure may further include a second capping pattern 75 on the barrier pattern 45.

During the annealing process or the deposition process illustrated with reference to FIG. 2, when the first capping pattern 70 is formed on the metal pattern 55 including a metal, the second capping pattern 75 may be formed on the barrier pattern 45 including a metal nitride. The second capping pattern 75 may include a compound of a metal included in the barrier pattern 45 and silicon nitride. For example, when the barrier pattern 45 includes for example, at least one of titanium nitride, tantalum nitride, tungsten nitride, etc., the second capping pattern 75 may, respectively, include at least one of titanium silicon nitride, tantalum silicon nitride, tungsten silicon nitride, etc.

The second capping pattern 75 may surround and contact a sidewall of the first capping pattern 70, and an uppermost surface of the second capping pattern 75 may be substantially coplanar with, lower, or higher than the upper surface of the first capping pattern 70.

Figure 5:
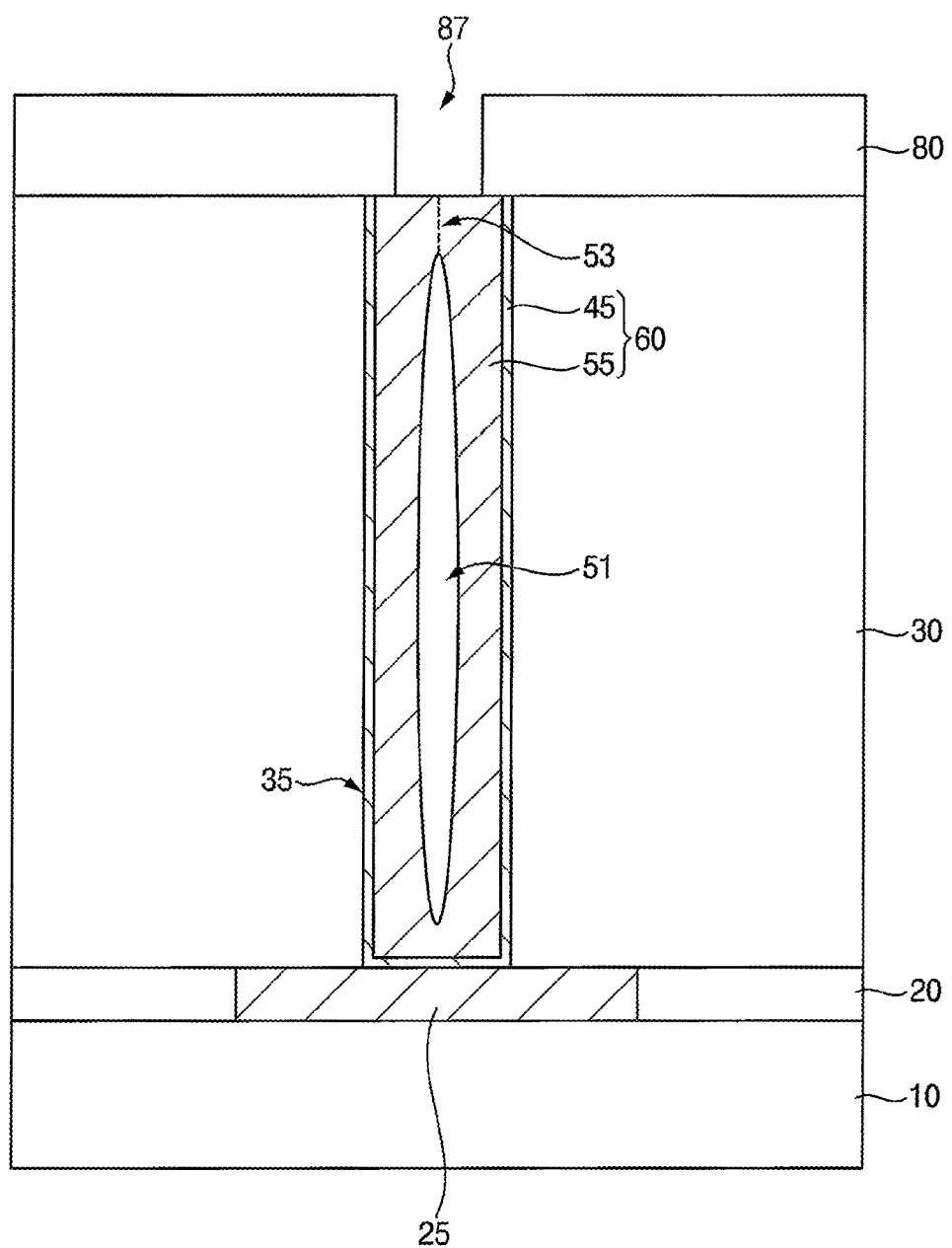
FIGS. 5 and 6 are cross-sectional views illustrating a method of forming a through via structure in accordance with comparative embodiments.
Figure 6:
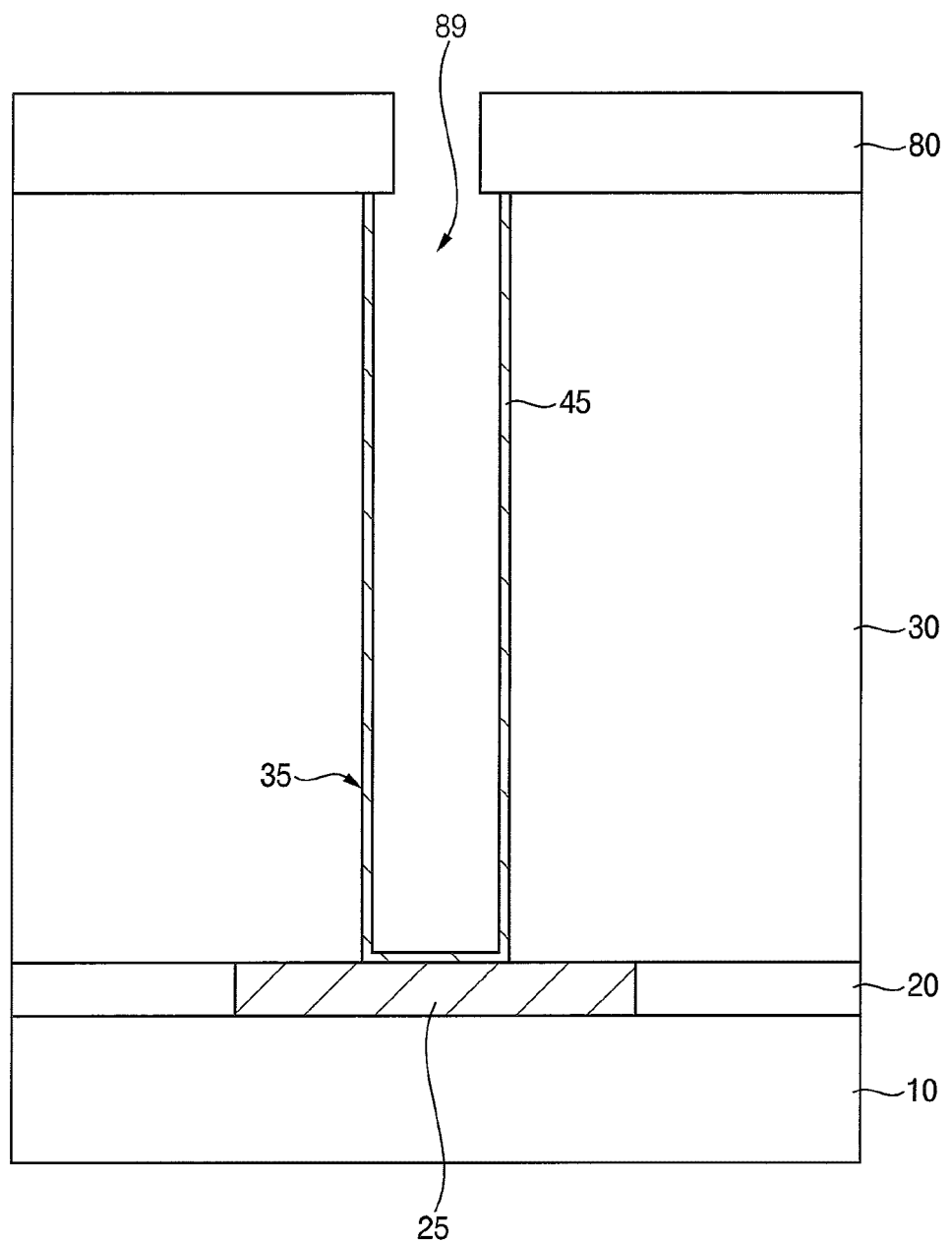

FIGS. 5 and 6 are cross-sectional views illustrating a method of forming a through via structure in accordance with a comparative embodiment.

Referring to FIG. 5, processes substantially the same as or similar to those illustrated with reference to FIGS. 1 and 2 may be performed. However, the formation of the first capping pattern 70 is not performed.

Therefore, the third insulating interlayer 80 may be formed on the second insulating interlayer 30 and the through via 60. A source gas (e.g., tungsten hexafluoride ($WF_6$) gas) remaining in the void 51 and/or the seam 53 may be combined with hydrogen (H) to form hydrogen fluoride (HF) gas, which may be a strong etching gas. Thus, when the third insulating interlayer 80 is formed, the hydrogen fluoride (HF) gas may outgas to form a fourth opening 87 through the third insulating interlayer 80.

Unlike the formation of the through via structure in accordance with example embodiments, the first capping pattern 70 is not formed on the metal pattern 55, and thus the etching gas generated by the combination of the source gas remaining in the void 51 and/or the seam 53 and hydrogen may outgas, and the fourth opening 87 may be formed through the third insulating interlayer 80 on the through via structure.

Referring to FIG. 6, after forming the third insulating interlayer 80, a cleaning process may be performed, and a cleaning solution used in the cleaning process may be provided into the through via 60 through the fourth opening 87, such that the metal pattern 55 and/or the barrier pattern 45 may be removed.

Accordingly, in the method of forming the through via structure in accordance with comparative embodiment, the through via may not be well formed in the first opening 35, and some and/or most of the first opening 35 may become empty. However, in accordance with some example embodiments, the first capping pattern 70 may be formed on the through via 60, and thus the removal of the through via 60 may be prevented during subsequent processes, and the through via structure including the through via 60 may have enhanced electrical characteristics.

Figure 7:
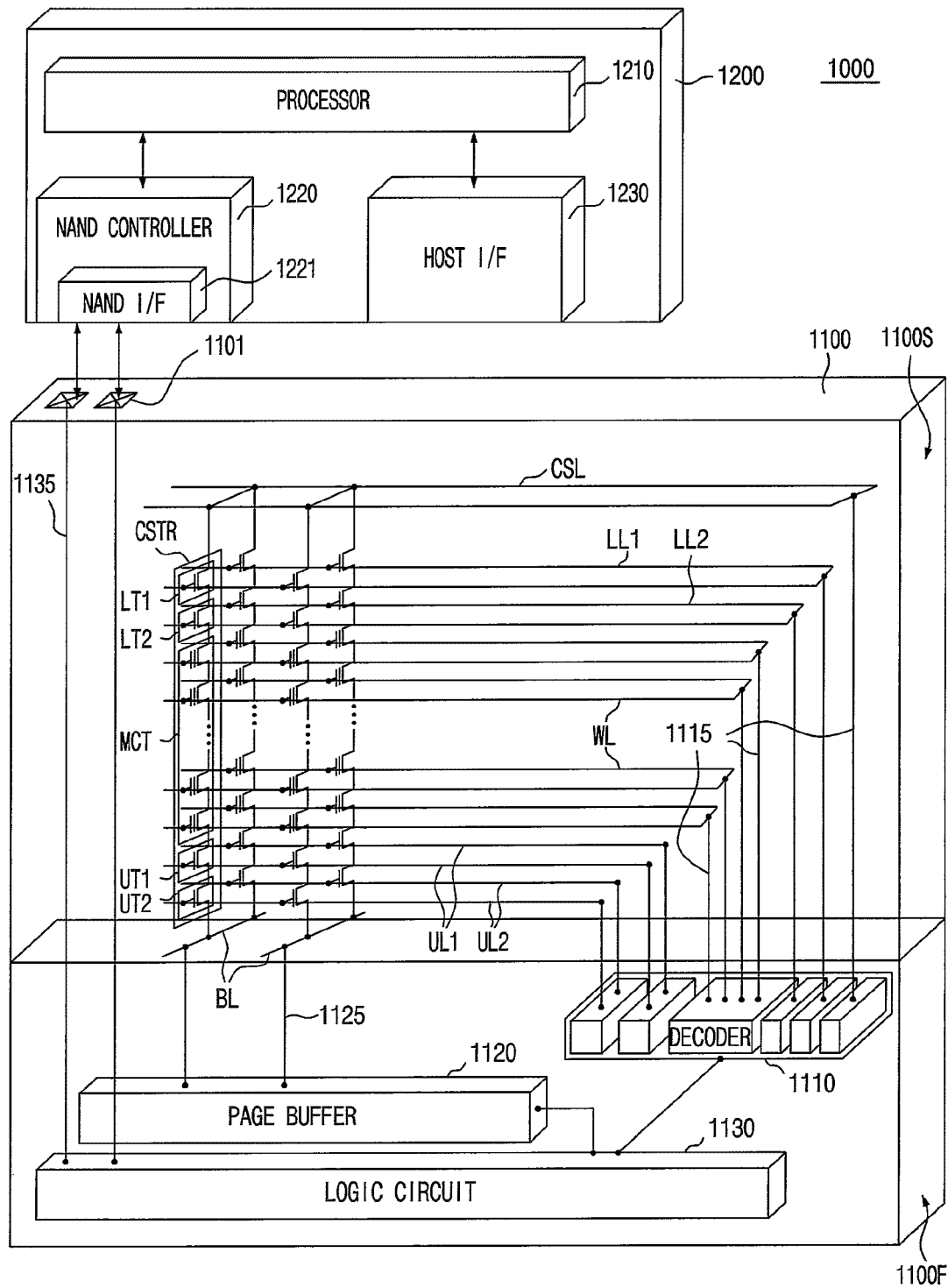
FIG. 7 is a schematic diagram illustrating an electronic system including a semiconductor device in accordance with some example embodiments.

FIG. 7 is a schematic diagram illustrating an electronic system including a semiconductor device in accordance with some example embodiments.

Referring to FIG. 7, an electronic system 1000 may include a semiconductor device 1100 and a controller 1200 electrically connected to the semiconductor device 1100. The electronic system 1000 may be a storage device including one and/or a plurality of semiconductor devices 1100 or an electronic device including a storage device. For example, the electronic system 1000 may be and/or be included in a solid state drive (SSD) device, a universal serial bus (USB), a computing system, a medical device, and/or a communication device that may include one and/or a plurality of semiconductor devices 1100.

The semiconductor device 1100 may be a non-volatile memory device, for example, a NAND flash memory device that will be illustrated with reference to FIGS. 41 to 48. The semiconductor device 1100 may include a first structure 1100F and a second structure 1100S on the first structure 1100F. In the drawing, the first structure 1100F is under the second structure 1100S, however, the example embodiments are not limited thereto; for example, the first structure 1100F may be beside and/or on the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In some example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending to the second structure 1110S in the first structure 1100F. The bit lines BL may be electrically connected to the page buffer 1120 through second connection wirings 1125 extending to the second structure 1100S in the first structure 1100F.

In the first structure 1100F, the decoder circuit 1110 and the page buffer 1120 may perform a control operation for at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending to the second structure 1100S in the first structure 1100F.

The controller 1200 may include a processor 1210, a NAND controller 1220, and a host interface 1230. The electronic system 1000 may include a plurality of semiconductor devices 1100, and in this case, the controller 1200 may control the plurality of semiconductor devices 1100.

The processor 1210 may control operations of the electronic system 1000 including the controller 1200. The processor 1210 may be operated by firmware, and may control the NAND controller 1220 to access the semiconductor device 1100. The NAND controller 1220 may include a NAND interface 1221 for communicating with the semiconductor device 1100. Through the NAND interface 1221, control command for controlling the semiconductor device 1100, data to be written in the memory cell transistors MCT of the semiconductor device 1100, data to be read from the memory cell transistors MCT of the semiconductor device 1100, etc., may be transferred. The host interface 1230 may provide communication between the electronic system 1000 and an outside host. When control command is received from the outside host through the host interface 1230, the processor 1210 may control the semiconductor device 1100 in response to the control command.

Figure 8:
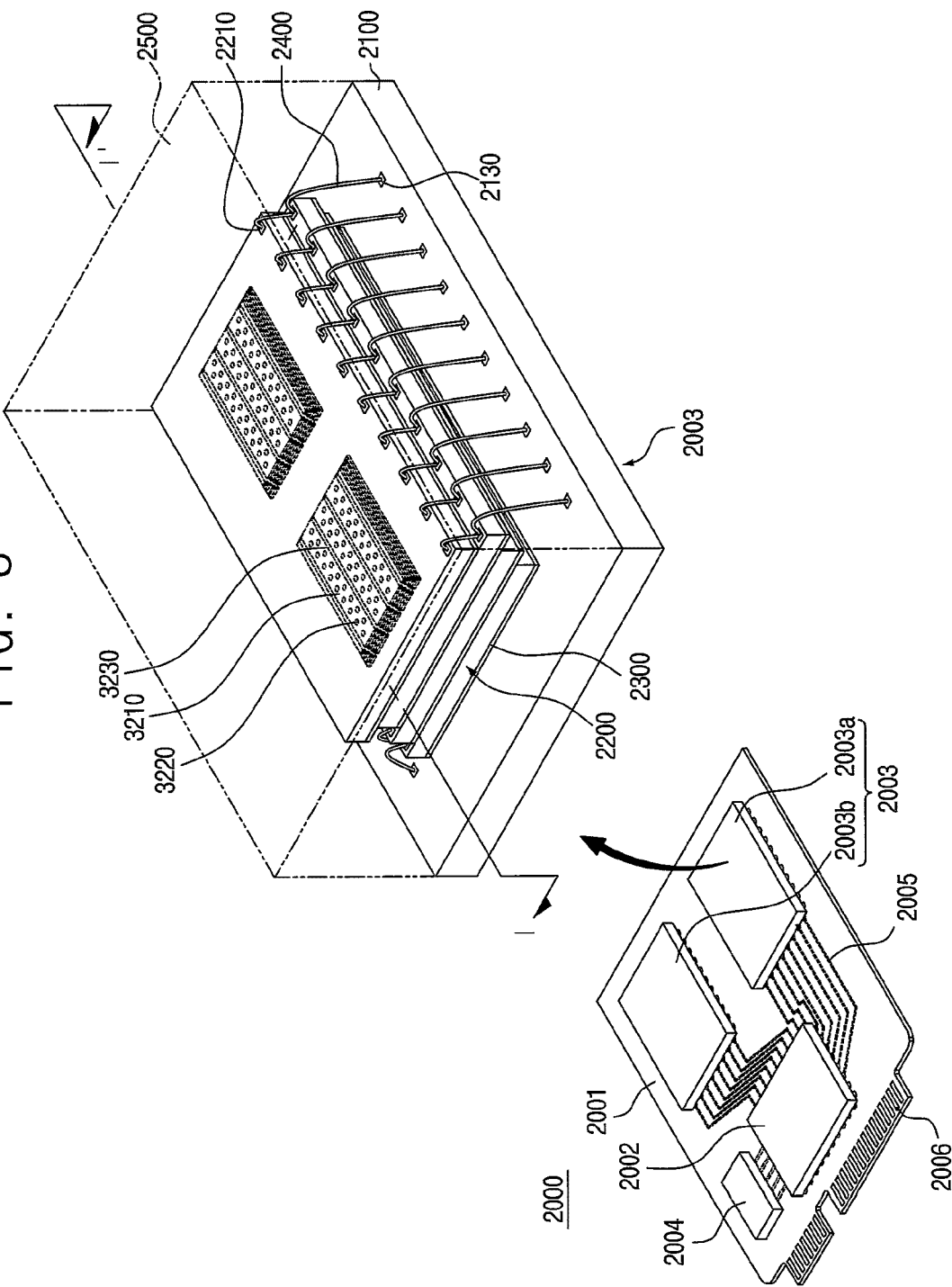
FIG. 8 is a schematic perspective view illustrating an electronic system including a semiconductor device in accordance with some example embodiments.

FIG. 8 is a schematic perspective view illustrating an electronic system including a semiconductor device in accordance with some example embodiments.

Referring to FIG. 8, an electronic system 2000 may include a main substrate 2001, a controller 2002 mounted on the main substrate 2001, at least one semiconductor package 2003, and a dynamic random access memory (DRAM) device 2004. The semiconductor package 2003 and the DRAM device 2004 may be connected to the controller 2002 by wiring patterns 2005 on the main substrate 2001.

The main substrate 2001 may include a connector 2006 having a plurality of pins connected to an outside host. The number and layout of the plurality pins in the connector 2006 may be changed depending on a communication interface between the electronic system 2000 and an outside host (not illustrated). In some example embodiments, the electronic system 2000 may communicate with the outside host according to one of a USB, peripheral component interconnect express (PCI-Express), serial advanced technology attachment (SATA), M-Phy for universal flash storage (UFS), etc. In some example embodiments, the electronic system 2000 may be operated by power source provided from the outside host through the connector 2006. The electronic system 2000 may further include power management integrated circuit (PMIC) (not illustrated) for distributing the power source provided from the outside host to the controller 2002 and the semiconductor package 2003.

The controller 2002 may write data in the semiconductor package 2003 and/or read data from the semiconductor package 2003, and may enhance the operation speed of the electronic system 2000.

The DRAM device 2004 may be a buffer memory for reducing the speed difference between the semiconductor package 2003 for storing data and the outside host. The DRAM device 2004 included in the electronic system 2000 may serve as a cache memory, and may provide a space for temporarily storing data during the control operation for the semiconductor package 2003. If the electronic system 2000 includes the DRAM device 2004, the controller 2002 may further include a DRAM controller for controlling the DRAM device 2004 in addition to the NAND controller for controlling the semiconductor package 2003.

The semiconductor package 2003 may include first and second semiconductor packages 2003a and 2003b spaced apart from each other. The first and second semiconductor packages 2003a and 2003b may be semiconductor packages each of which may include a plurality of semiconductor chips 2200. Each of the first and second semiconductor packages 2003a and 2003b may include a package substrate 2100, the semiconductor chips 2200, bonding layers 2300 disposed under the semiconductor chips 2200, a connection structure 2400 for electrically connecting the semiconductor chips 2200 and the package substrate 2100, and a mold layer 2500 covering the semiconductor chips 2200 and the connection structure 2400 on the package substrate 2100. Though only the first and second semiconductor packages 2003a and 2003b are illustrated, the number of the semiconductor packages is not so limited, and the electronic system 2000 may include more or fewer semiconductor packages.

The package substrate 2100 may be, for example, a printed circuit board (PCB) including package upper pads 2130. Each semiconductor chip 2200 may include at least one input/output pad 2210. The at least one input/output pad 2210 may correspond to the input/output pad 1101 of FIG. 7. Each semiconductor chip 2200 may include gate electrode structures 3210, memory channel structures 3220 extending through the gate electrode structures 3210, and division structures 3230 for dividing the gate electrode structures 3210. Each semiconductor chip 2200 may include a semiconductor device that will be illustrated with reference to FIGS. 41 to 48.

In some example embodiments, the connection structure 2400 may be a bonding wire for electrically connecting the input/output pad 2210 and the package upper pads 2130. For example, in each of the first and second semiconductor packages 2003a and 2003b, the semiconductor chips 2200 may be electrically connected with each other by a bonding wire method, and may be electrically connected to the package upper pads 2130 of the package substrate 2100. Alternatively, in each of the first and second semiconductor packages 2003a and 2003b, the semiconductor chips 2200 may be electrically connected with each other by a connection structure including a through silicon via (TSV), instead of the connection structure 2400 of the bonding wire method.

In some example embodiments, the controller 2002 and the semiconductor chips 2200 may be included in one package. In example embodiments, the controller 2002 and the semiconductor chips 2200 may be mounted on an interposer substrate different from the main substrate 2001, and the controller 2002 and the semiconductor chips 2200 may be connected with each other by a wiring on the interposer substrate.

Figure 9:
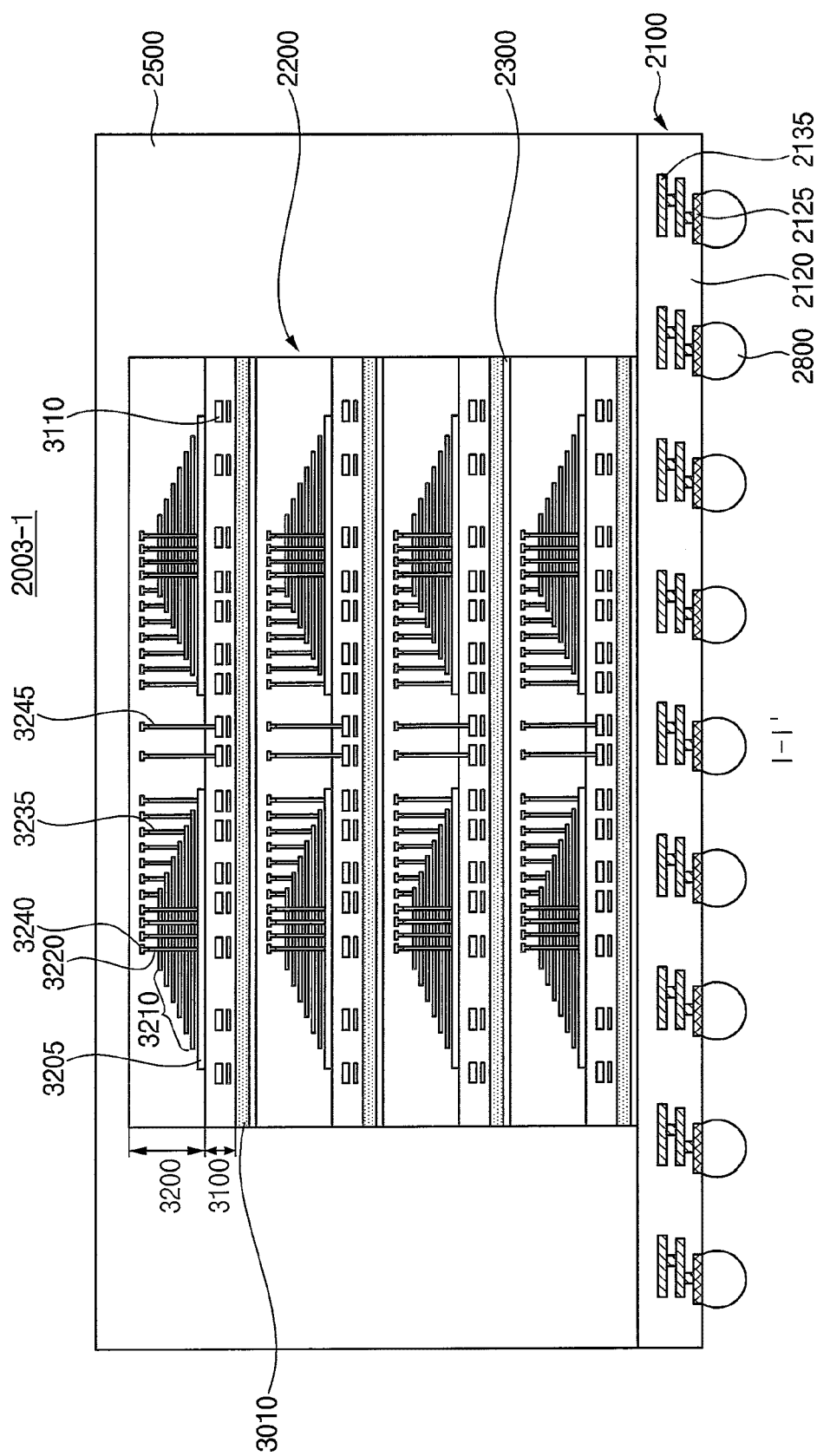
FIGS. 9 and 10 are schematic cross-sectional views illustrating semiconductor packages each of which may include a semiconductor device in accordance with some example embodiments.
Figure 10:
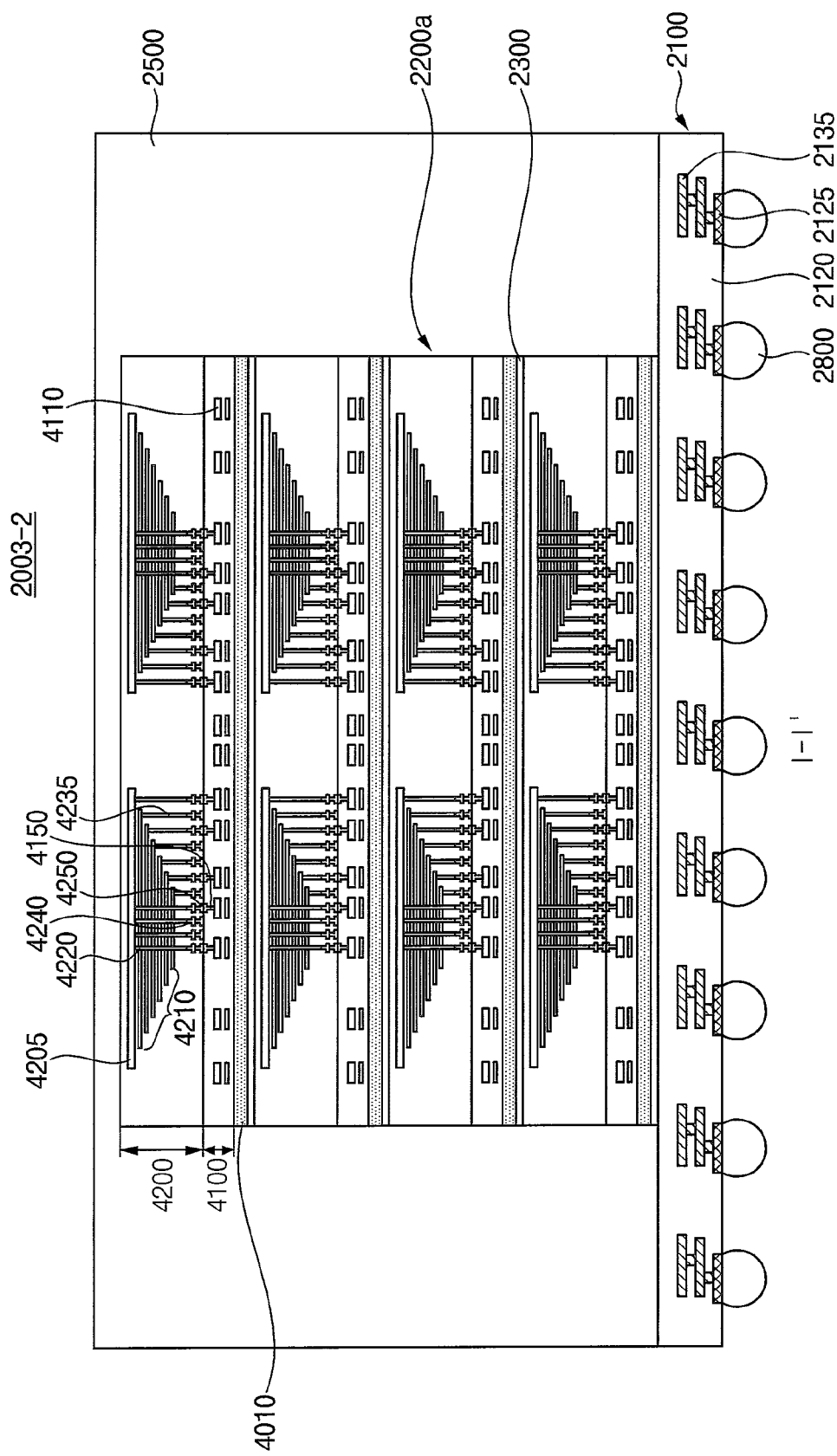

FIGS. 9 and 10 are schematic cross-sectional views illustrating semiconductor packages each of which may include a semiconductor device in accordance with some example embodiments. FIGS. 9 and 10 illustrate example embodiments of the semiconductor package 2003 shown in FIG. 8, and show a cross-section taken along a line I-I' of the semiconductor package 2003 in FIG. 8.

Referring to FIG. 9, in the semiconductor package 2003-1, the package substrate 2100 may be a PCB. The package substrate 2100 may include a substrate body part 2120, the package upper pads 2130 (refer to FIG. 2) on an upper surface of the substrate body part 2120, package lower pads 2125 on and/or exposed through a lower surface of the substrate body part 2120, and inner wirings 2135 electrically connecting the package upper pads 2130 and the package lower pads 2125 in an inside of the substrate body part 2120. The package upper pads 2130 may be electrically connected to the connection structures 2400. The package lower pads 2125 may be connected to wiring patterns 2005 of the main substrate 2010 in the electronic system 2000 through conductive connection parts 2800, as shown in FIG. 2.

Each semiconductor chip 2200 may include a semiconductor substrate 3010, and a first structure 3100 and a second structure 3200 sequentially stacked on the semiconductor substrate 3010. The first structure 3100 may include a peripheral circuit region in which peripheral circuit wirings 3110 may be formed. The second structure 3200 may include a common source line 3205, a gate electrode structure 3210 on the common source line 3205, memory channel structures 3220 and division structures 3230 (refer to FIG. 8) extending through the gate electrode structure 3210, bit lines 3240 electrically connected to the memory channel structures 3220, and gate connection wirings 3235 electrically connected to the word lines WL of the gate electrode structure 3210 (refer to FIG. 7).

Each semiconductor chip 2200 may include a through wiring 3245 being electrically connected to the peripheral circuit wirings 3110 of the first structure 3100 and extending in the second structure 3200. The through wiring 3245 may be disposed at an outside of the gate electrode structure 3210, and some through wirings 3245 may extend through the gate electrode structure 3210. Each semiconductor chip 2200 may further include the input/output pad 2210 (refer to FIG. 8) electrically connected to the peripheral circuit wirings 3110 of the first structure 3100.

Referring to FIG. 10, in a semiconductor package 2003-2, each semiconductor chip 2200-2 may include a semiconductor substrate 4010, a first structure 4100 on the semiconductor substrate 4010, and a second structure 4200 on and bonded with the first structure 4100 by a wafer bonding method.

The first structure 4100 may include a peripheral circuit region in which a peripheral circuit wiring 4110 and first bonding structures 4150 may be formed. The second structure 4200 may include a common source line 4205, a gate electrode structure 4210 between the common source line 4205 and the first structure 4100, memory channel structures 4220 and the division structure 3230 (refer to FIG. 8) extending through the gate electrode structure 4210, and second bonding structures 4250 electrically connected to the memory channel structures 4220 and the word lines WL (refer to FIG. 7) of the gate electrode structure 4210. For example, the second bonding structures 4250 may be electrically connected to the memory channel structures 4220 and the word lines WL (refer to FIG. 7) through the bit lines 4240 electrically connected to the memory channel structures 4220 and the gate connection wirings 4235 electrically connected to the word lines WL (refer to FIG. 7), respectively. The first bonding structures 4150 of the first structure 4100 and the second bonding structures 4250 of the second structure 4200 may contact each other to be bonded with each other. The first bonding structures 4150 and the second bonding structures 4250 may include a conductive material such as a metal (e.g., copper).

Each semiconductor chip 2200-2 may further include the input/output pad 2210 (refer to FIG. 8) electrically connected to the peripheral circuit wirings 4110 of the first structure 4100.

The semiconductor chips 2200-1 of FIG. 9 and/or the semiconductor chips 2200-2 of FIG. 10 may be electrically connected with each other by the connection structures 2400 in a bonding wire method. However, in some example embodiments, semiconductor chips such as the semiconductor chips 2200 of FIG. 9 and/or the semiconductor chips 2200a of FIG. 10 in the same semiconductor package may be electrically connected with each other by a connection structure including a TSV.

FIGS. 11 to 44 are plan views and cross-sectional views illustrating a method of manufacturing a vertical memory device in accordance with some example embodiments. Particularly, FIGS. 11-12, 16, 21-22, 27, 34, 37, and 39 are the plan views, and the FIGS. 13-15, 17-20, 23-26, 28-33, 35-36, 38, and 40-44 are the cross-sectional views.

FIGS. 13-14, 17 and 40-41 are cross-sectional views taken along lines A-A', respectively, of corresponding plan views, each of FIGS. 18-20 and 42 includes cross-sectional views taken along lines B-B' and C-C', respectively, of a corresponding plan view, FIGS. 23-26, 28-30, 32, 35, 38 and 43 are cross-sectional views taken along lines D-D' of corresponding plan views, respectively, and FIGS. 31, 33, 36 and 44 are cross-sectional views taken along lines E-E' of corresponding plan views, respectively. FIGS. 12 to 44 are drawings of region X in FIG. 11, and FIG. 20 includes enlarged cross-sectional views of regions Y and Z, respectively, of FIG. 19.

This method may include processes substantially the same as or similar to those illustrated with reference to FIGS. 1 to 3A, and repeated explanations thereon are omitted herein. The semiconductor device may include one of the through via structures shown in FIGS. 3B, 3C and 4C, instead of the through via structure shown in FIG. 3A.

Figure 11:
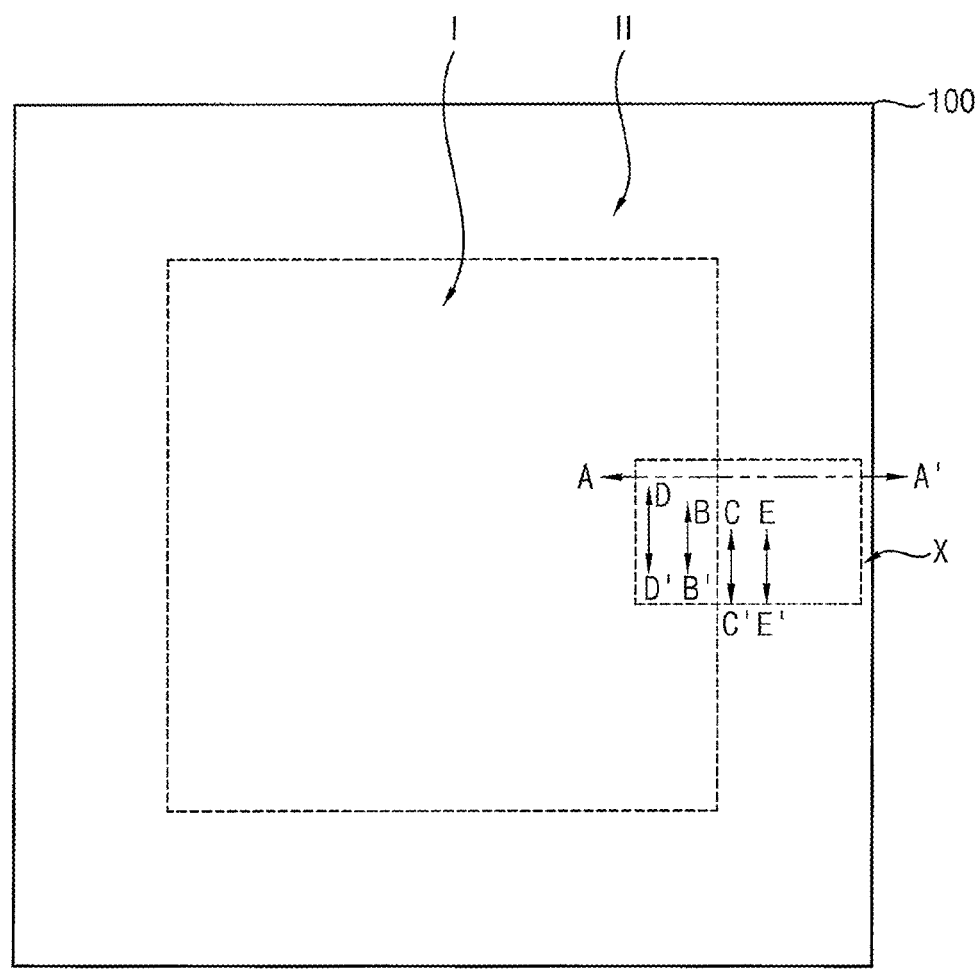
FIGS. 11 to 44 are plan views and cross-sectional views illustrating a method of manufacturing a vertical memory device in accordance with some example embodiments.

Referring to FIG. 11, a substrate 100 may include a first region I and a second region II surrounding the first region I.

In example embodiments, the first region I may be a cell array region, the second region II be a pad region and/or extension region, and the first and second regions I and II together may form a cell region. For example, memory cells, each of which may include a gate electrode, a channel, and a charge storage structure, may be formed on the first region I of the substrate 100, and upper contact plugs for transferring electrical signals to the memory cells and pads of the gate electrodes contacting the upper contact plugs may be formed on the second region II of the substrate 100. In the drawing, the second region II entirely surrounds the first region I, however, the example embodiments are not limited thereto. For example, the second region II may be formed only on each of opposite sides of the first region I in a first direction D1 or a second direction D2 substantially parallel to an upper surface of the substrate 100.

The substrate 100 may further include a third region surrounding the second region II, and upper circuit patterns for applying electrical signals to the memory cells through the upper contact plugs may be formed on the third region of the substrate 100.

Hereinafter, only structures in the region X partially including the first and second regions I and II of the substrate 100 will be illustrated.

Figure 12:
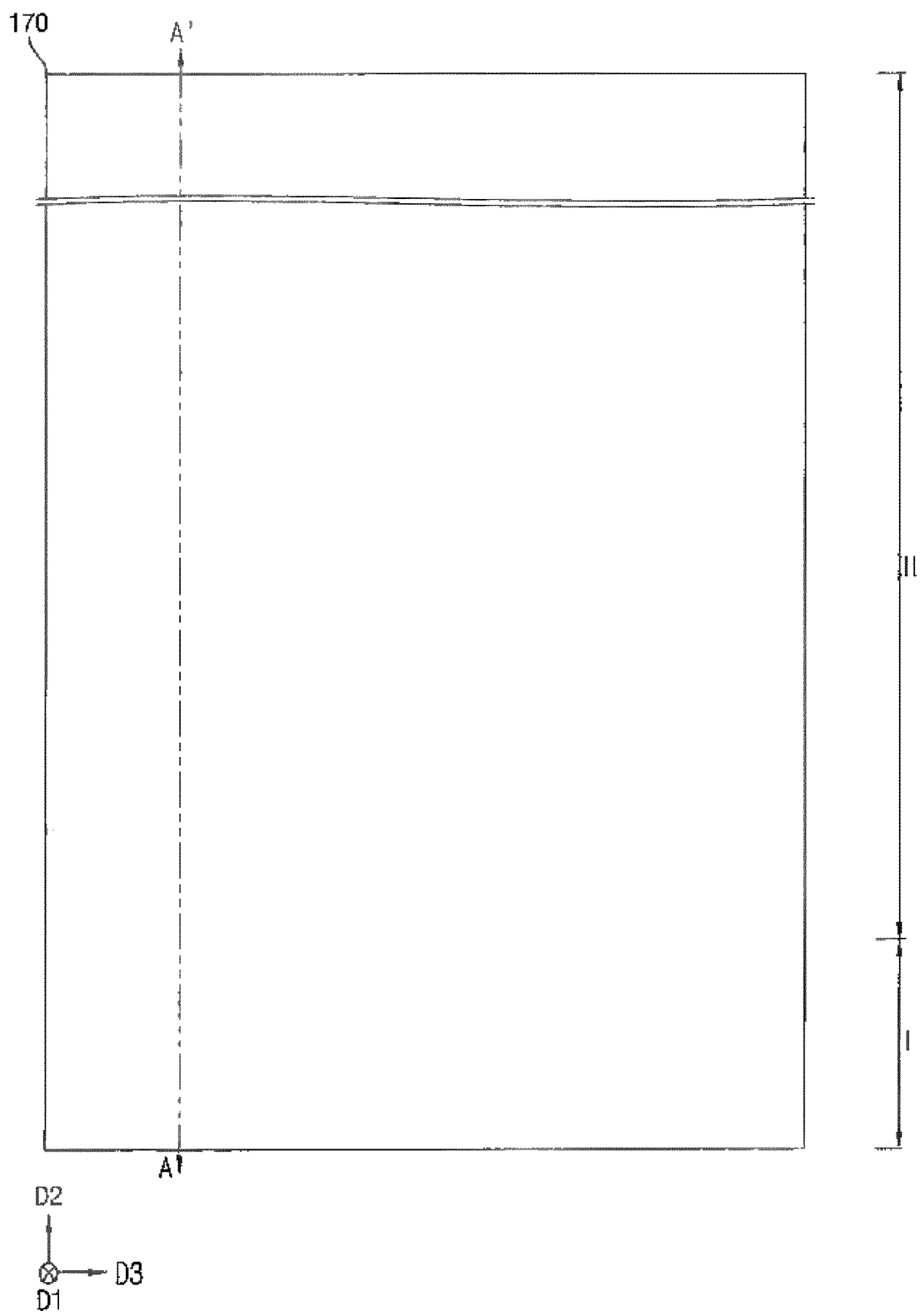
Figure 13:
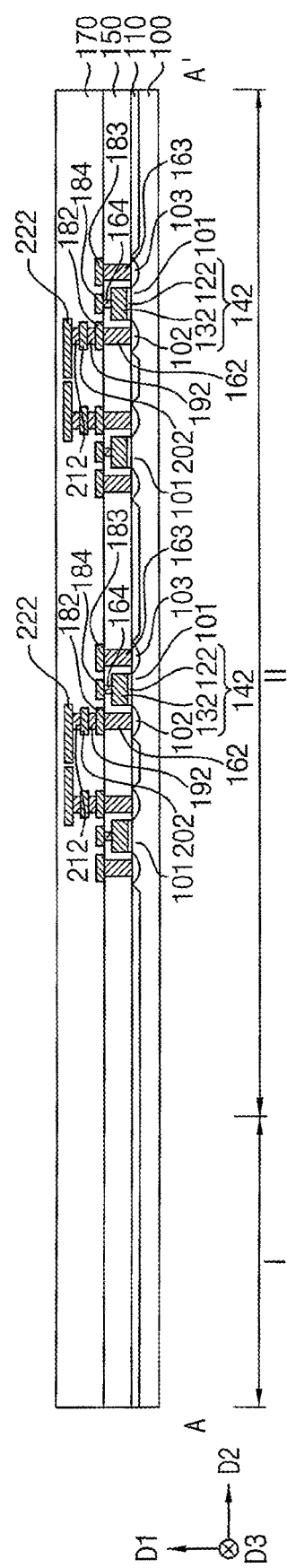

Referring to FIGS. 12 and 13, lower circuit patterns may be formed on the substrate 100, and fifth and sixth insulating interlayers 150 and 170 including an oxide (e.g., silicon oxide) may be formed on the substrate 100 to cover the lower circuit patterns.

The substrate 100 may include a field region on which an isolation pattern 110 is formed and an active region 101 on which no isolation pattern is formed. The isolation pattern 110 may be formed by a shallow trench isolation (STI) process, and may include an oxide (e.g., silicon oxide).

In some example embodiments, the semiconductor device may have a cell over periphery (COP) structure. For example, the lower circuit patterns may be formed on the substrate 100, and memory cells, upper contact plugs, and upper circuit patterns may be formed over the lower circuit patterns. The lower circuit patterns may include, for example, transistors, lower contact plugs, lower wirings, lower vias, etc.

Figure 18:
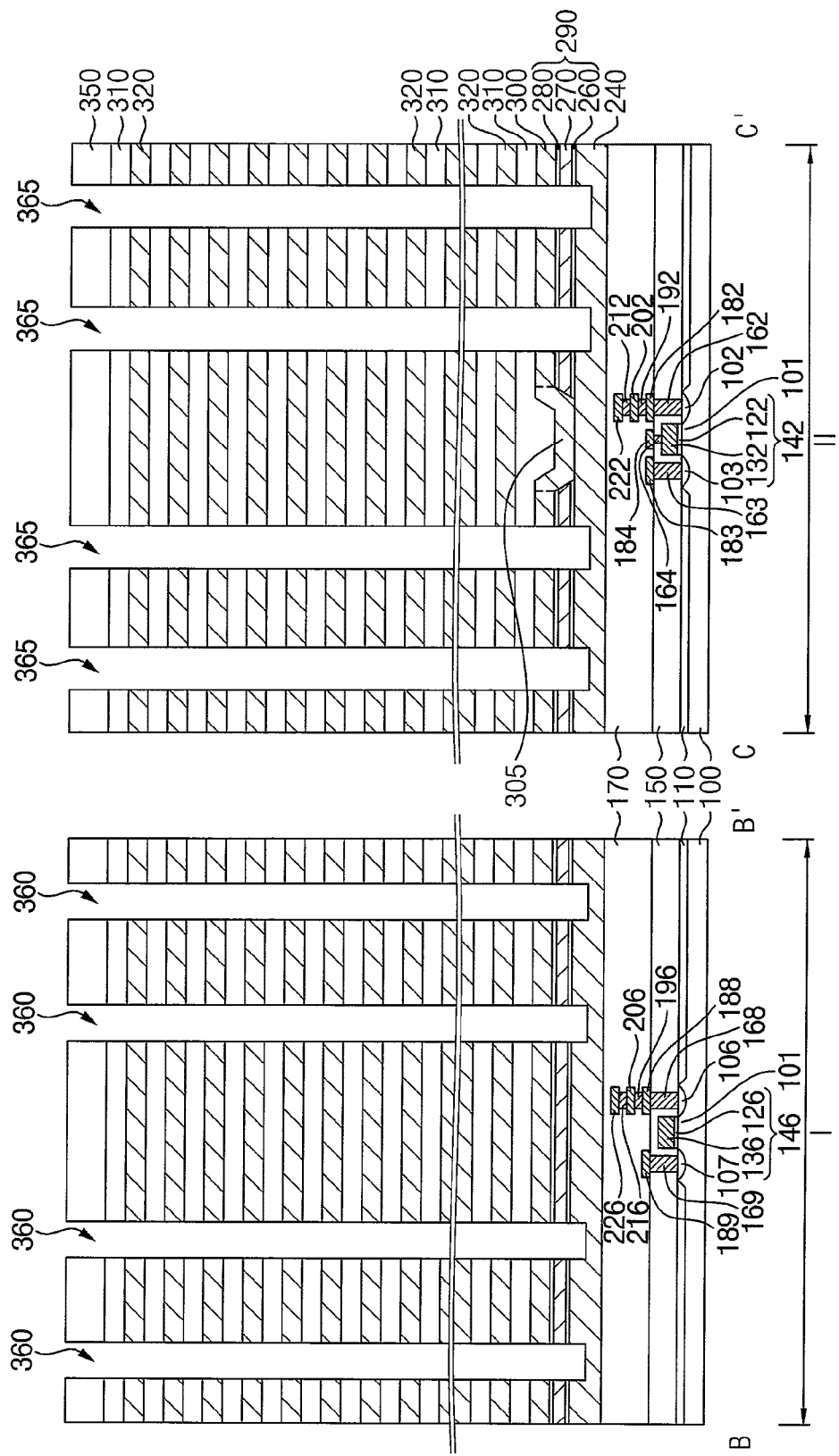

Referring to FIG. 18 together with FIGS. 12 and 13, for example, first and second transistors may be formed, respectively, on the second and first regions II and I of the substrate 100. The first transistor may include a first lower gate structure 142 on the substrate 100 and first and second regions 102 and 103, serving as source/drain regions, at upper portions of the active region 101 adjacent to the first lower gate structure 142, and the second transistor may include a second lower gate structure 146 on the substrate 100 and third and fourth regions 106 and 107, serving as source/drain regions, at upper portions of the active region 101 adjacent to the second lower gate structure 146. In some example embodiments, the first, second, third, and/or fourth regions 102, 103, 106, and/or 107 may be formed in the substrate 100 by doping the substrate.

The first lower gate structure 142 may include a first lower gate insulation pattern 122 and a first lower gate electrode 132 sequentially stacked on the substrate 100, and the second lower gate structure 146 may include a second lower gate insulation pattern 126 and a second lower gate electrode 136 sequentially stacked on the substrate 100.

The fifth insulating interlayer 150 may be formed on the substrate 100 to cover the first and second transistors, with first, second, fourth and fifth lower contact plugs 162, 163, 168 and 169 extending through the fifth insulating interlayer 150 to contact the first to fourth impurity regions 102, 103, 106 and 107, respectively and a third lower contact plug 164 extending through the fifth insulating interlayer 150 to contact the first lower gate electrode 132 may be formed. A sixth lower contact plug extending through the fifth insulating interlayer 150 to contact the second lower gate electrode 136 may be further formed.

First to fifth lower wirings 182, 183, 184, 188 and 189 may be formed on the fifth insulating interlayer 150 to contact upper surfaces of the first to fifth lower contact plugs 162, 163, 164, 168, and 169, respectively. A first lower via 192, a sixth lower wiring 202, a third lower via 212 and an eighth lower wiring 222 may be sequentially stacked on the first lower wiring 182, and a second lower via 196, a seventh lower wiring 206, a fourth lower via 216 and a ninth lower wiring 226 may be sequentially stacked on the fourth lower wiring 188.

The sixth insulating interlayer 170 may be formed on the fifth insulating interlayer 150 to cover the first to ninth lower wirings 182, 183, 184, 188, 189, 202, 206, 222 and 226 and the first to fourth lower vias 192, 194, 212, and 216.

Each element included in the lower circuit patterns may be formed by, e.g., a patterning process and/or a damascene process.

Figure 14:
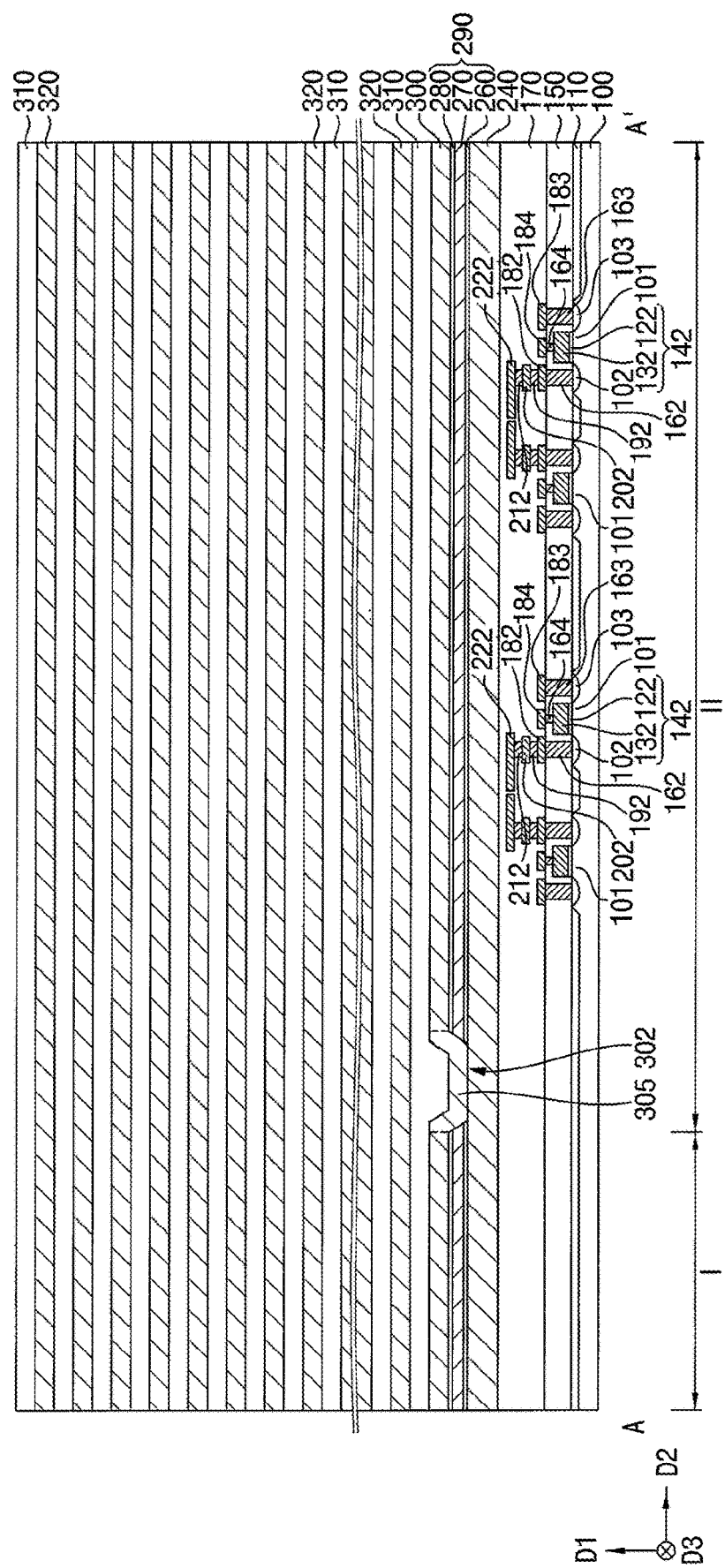

Referring to FIG. 14, a common source plate (CSP) 240 and a first sacrificial layer structure 290 may be sequentially formed on the sixth insulating interlayer 170, the first sacrificial layer structure 290 may be partially removed to form a fifth opening 302 exposing an upper surface of the CSP 240, and a first support layer 300 may be formed on an upper surface of the first sacrificial layer structure 290 and the exposed upper surface of the CSP 240.

The CSP 240 may include polysilicon doped with, e.g., n-type impurities. In some example embodiments, the CSP 240 may include a plurality of layers. For example, the CSP 240 may include a metal silicide layer and a doped polysilicon layer (e.g., doped with n-type impurities) sequentially stacked. The metal silicide layer may include, e.g., tungsten silicide.

The first sacrificial layer structure 290 may include first, second, and third sacrificial layers 260, 270 and 280 sequentially stacked in a first direction D1 substantially perpendicular to the upper surface of the substrate 100. In some embodiments, the first and third sacrificial layers 260 and 280 may include an oxide (e.g., silicon oxide) and the second sacrificial layer 270 may include a nitride (e.g., silicon nitride).

The fifth opening 302 may have various layouts in a plan view. For example, a plurality of fifth openings 302 may be formed to be spaced apart from each other in each of the second direction D2 and a third direction D3 substantially parallel to the upper surface of the substrate 100 and crossing the second direction D2 on the first region I of the substrate 100. Additionally, the fifth opening 302 may extend in the third direction D3 on a portion of the second region II of the substrate 100 adjacent to the first region I, and a plurality of fifth openings 302 each of which may extend in the second direction D2 may be spaced apart from each other in the third direction D3 on the second region II of the substrate 100. FIG. 14 shows the fifth opening 302 extends in the third direction D3 on the portion of the second region II adjacent to the first region I of the substrate 100.

The first support layer 300 may include a material having an etching selectivity with respect to the first to third sacrificial layers 260, 270 and 280. For example, in an example embodiment, the first and third sacrificial layers 260 and 280 include silicon oxide and the second sacrificial layer 270 may include silicon nitride, the first support layer 300 may include e.g., polysilicon doped with n-type impurities. The first support layer 300 may have a uniform thickness, and thus a first recess may be formed on a portion of the first support layer 300 in the fifth opening 302. Hereinafter, the portion of the first support layer 300 in the fifth opening 302 may be referred to as a support pattern 305.

An insulation layer 310 and a fourth sacrificial layer 320 may be alternately and repeatedly stacked on the first support layer 300 and the support pattern 305, and thus a mold layer including the insulation layers 310 and the fourth sacrificial layers 320 may be formed. The insulation layer 310 may include an oxide (e.g., silicon oxide), and the fourth sacrificial layer 320 may include a material having an etching selectivity with respect to the insulation layer 310 (e.g., a nitride such as silicon nitride).

Figure 16:
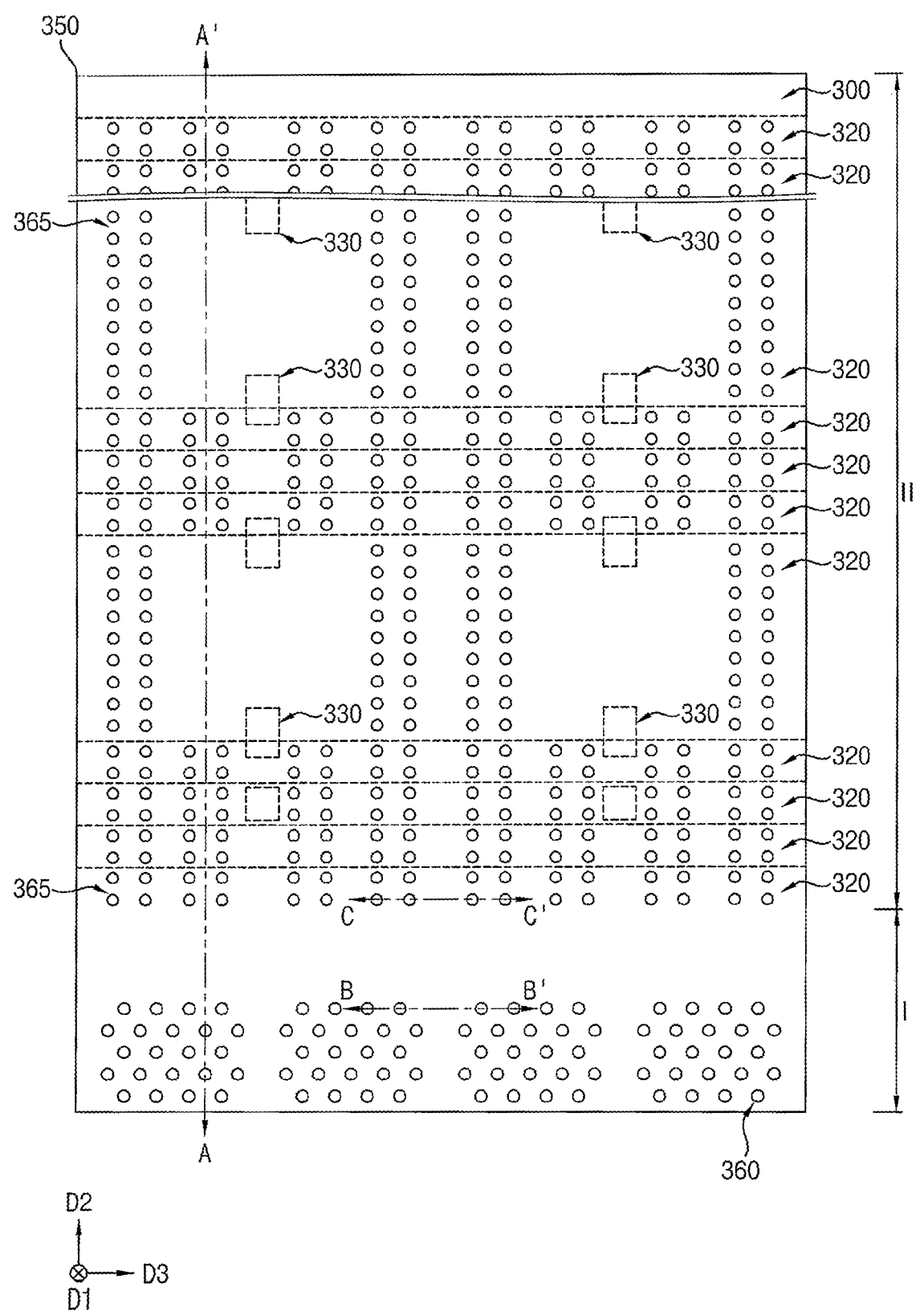

Referring to FIG. 16 together with FIG. 14, a first division pattern 330 may be formed through a lowermost one of the fourth sacrificial layers 320. The first division pattern 330 may be formed on the second region II of the substrate 100, and may include an oxide (e.g., silicon oxide). In some example embodiments, a plurality of first division patterns 330 may be formed to be spaced apart from each other in each of the second and third directions D2 and D3.

Figure 15:
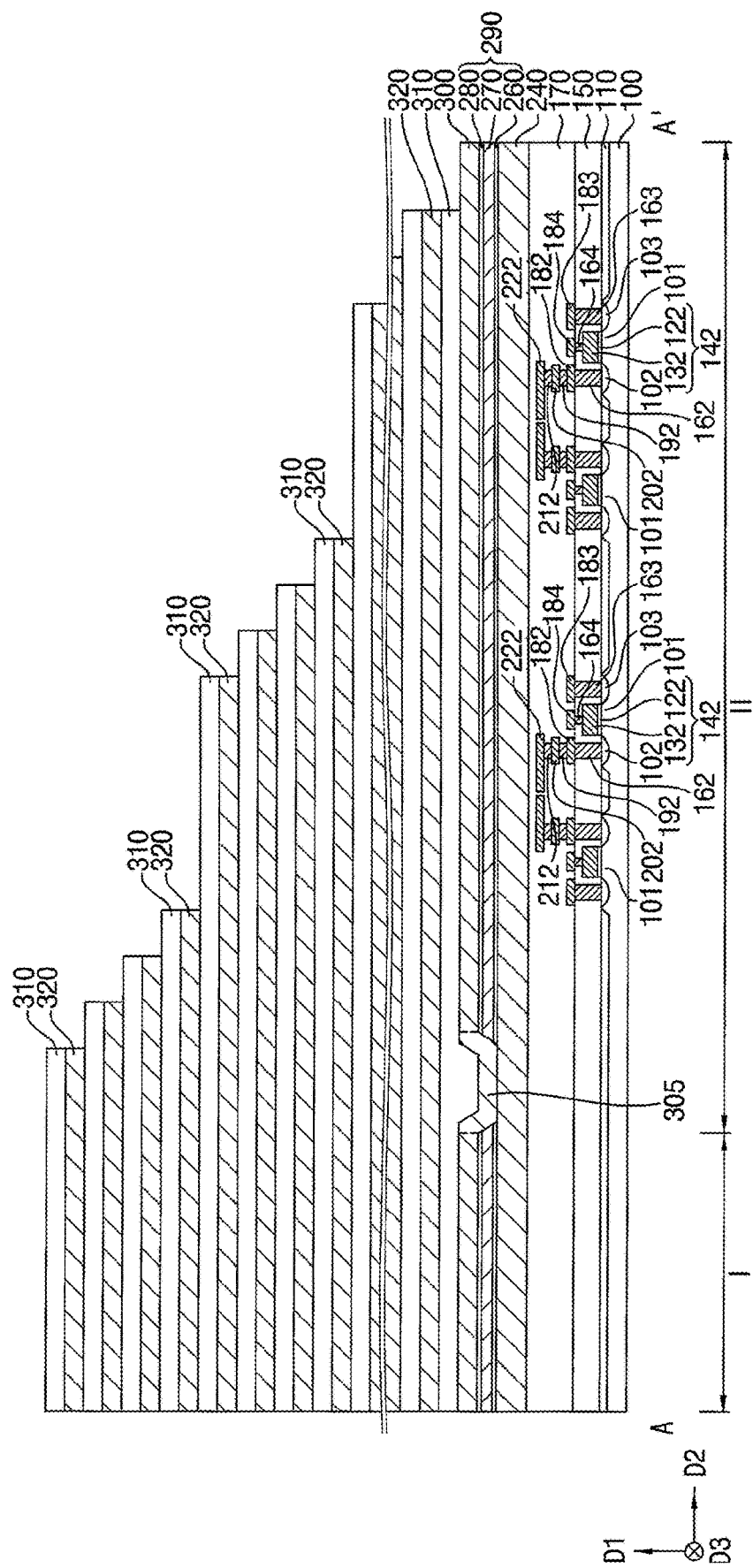

Referring to FIG. 15, a photoresist pattern may be formed on an uppermost one of the insulation layers 310, and the uppermost one of the insulation layers 310 and an uppermost one of the fourth sacrificial layers 320 may be etched using the photoresist pattern as an etching mask. Thus, one of the insulation layers 310 directly under the uppermost one of the fourth sacrificial layers 320 may be partially exposed.

A trimming process in which an area of the photoresist pattern is reduced by a given ratio may be performed, and the uppermost one of the insulation layers 310, the uppermost one of the fourth sacrificial layers 320, the exposed one of the insulation layers 310, and one of the fourth sacrificial layers 320 directly under the exposed one of the insulation layers 310 may be etched using the photoresist pattern having the reduced area as an etching mask. The trimming process and the etching process may be alternately and repeatedly performed to form a mold having a staircase shape including a plurality of step layers each of which may include one fourth sacrificial layer 320 and one insulation layer 310 sequentially stacked.

Hereinafter, the "step layer" may be defined as not only an exposed portion but also a non-exposed portion of the fourth sacrificial layer 320 and the insulation layer 310 at the same level, and the exposed portion thereof may be defined as a "step." In some example embodiments, the steps may be arranged in the second direction D2. The steps may also be arranged in the third direction D3.

In some example embodiments, lengths in the second direction D2 of the steps included in the mold may be uniform except for lengths of some of the steps, which may be greater than the lengths of other ones. Hereinafter, ones of the steps having relatively small lengths may be referred to as first steps, and other ones of the steps having relatively large lengths may be referred to as second steps. The steps may include a pattern of steps, and may include, for example, sets of first steps divided by a second step. FIG. 15 shows two second steps. Though FIG. 15 illustrates the sets of first steps including three steps, the example embodiments are not limited thereto. The steps will be denoted by dotted lines in plan views, hereinafter.

The mold may be formed on the first support layer 300 and the support pattern 305 on the first and second regions I and II of the substrate 100, and an edge of the upper surface of the first support layer 300 may not be covered by the mold. For example, the edge of the upper surface of the first support layer 300 may be exposed. The steps of the mold may be formed on the second region II of the substrate 100.

Figure 17:
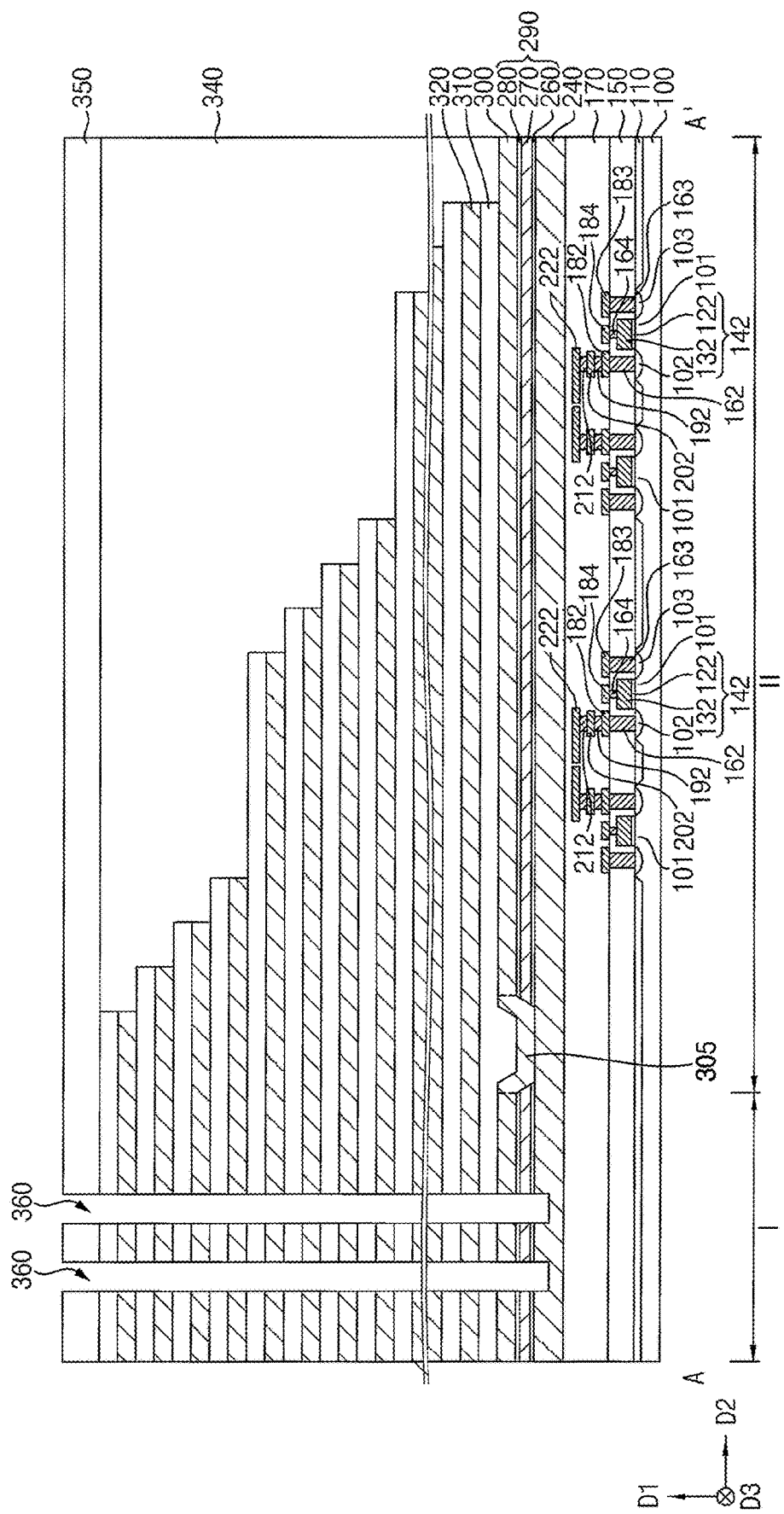

Referring to FIGS. 16 to 18, a seventh insulating interlayer 340 including an oxide (e.g., silicon oxide) may be formed on the CSP 240 to cover the mold and the first support layer 300, and may be planarized until an upper surface of the uppermost one of the insulation layers 310 of the mold is exposed. Thus, a sidewall of the mold may be covered by the seventh insulating interlayer 340. An eighth insulating interlayer 350 including an oxide (e.g., silicon oxide) may be formed on upper surfaces of the mold and the third insulating interlayer 340.

A channel hole 360 extending in the first direction D1 may be formed through the eighth insulating interlayer 350, the mold, the first support layer 300 and the first sacrificial layer structure 290 on the first region I of the substrate 100 to expose an upper surface of the CSP 240, and a dummy channel hole 365 extending in the first direction D1 may be formed through the seventh and eighth insulating interlayers 340 and 350, a portion of the mold, the first support layer 300 and the first sacrificial layer structure 290 on the second region II of the substrate 100 to expose an upper surface of the CSP 240. In some example embodiments, a plurality of channel holes 360 may be formed in each of the second and third directions D2 and D3 on the first region I of the substrate 100, and a plurality of dummy channel holes 365 may be formed in each of the second and third directions D2 and D3 on the second region II of the substrate 100.

The channel holes 360 and the dummy channel holes 365 may be simultaneously formed by the same etching process and/or may be sequentially formed by independent etching processes.

Figure 19:
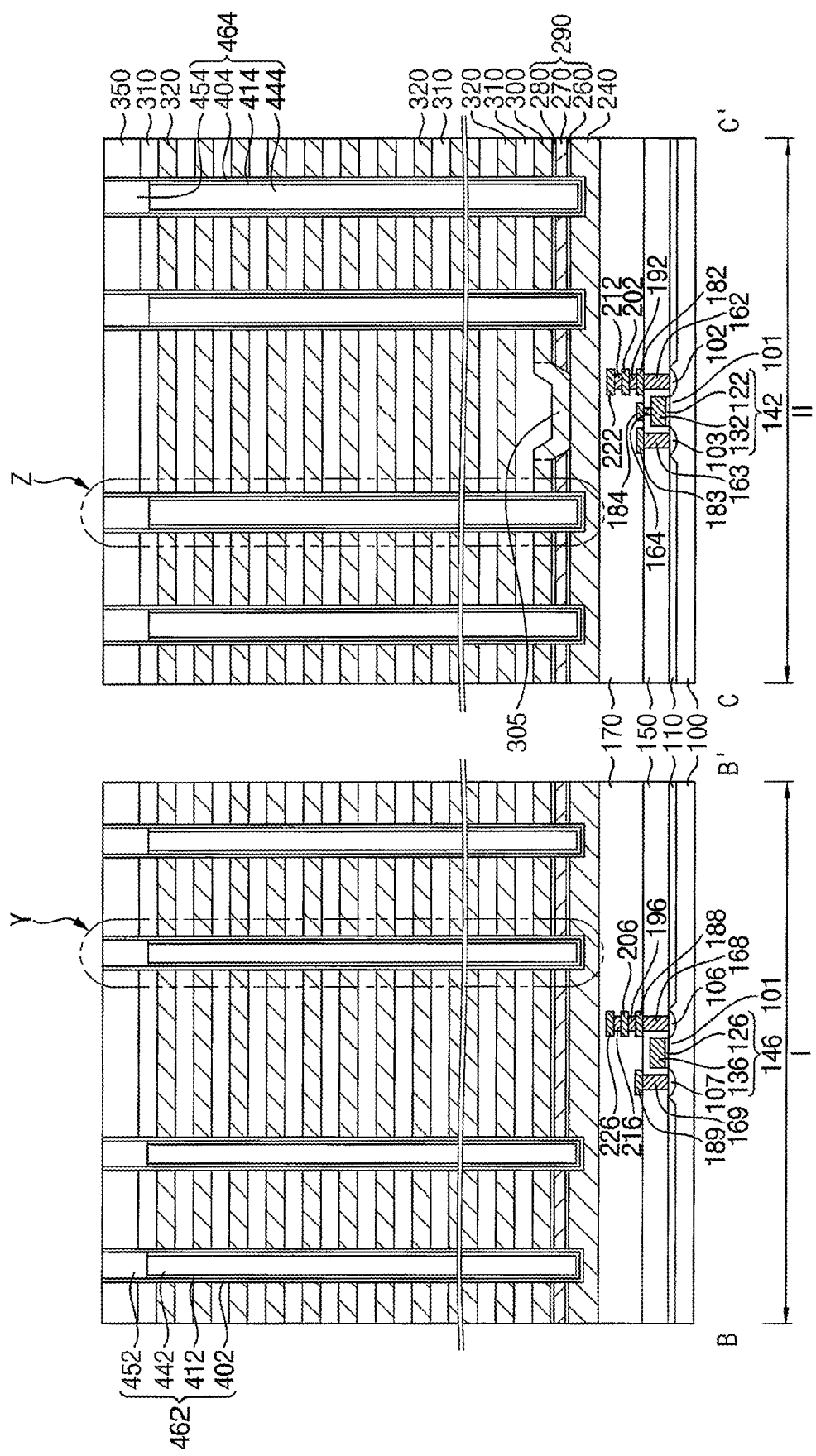
Figure 20:
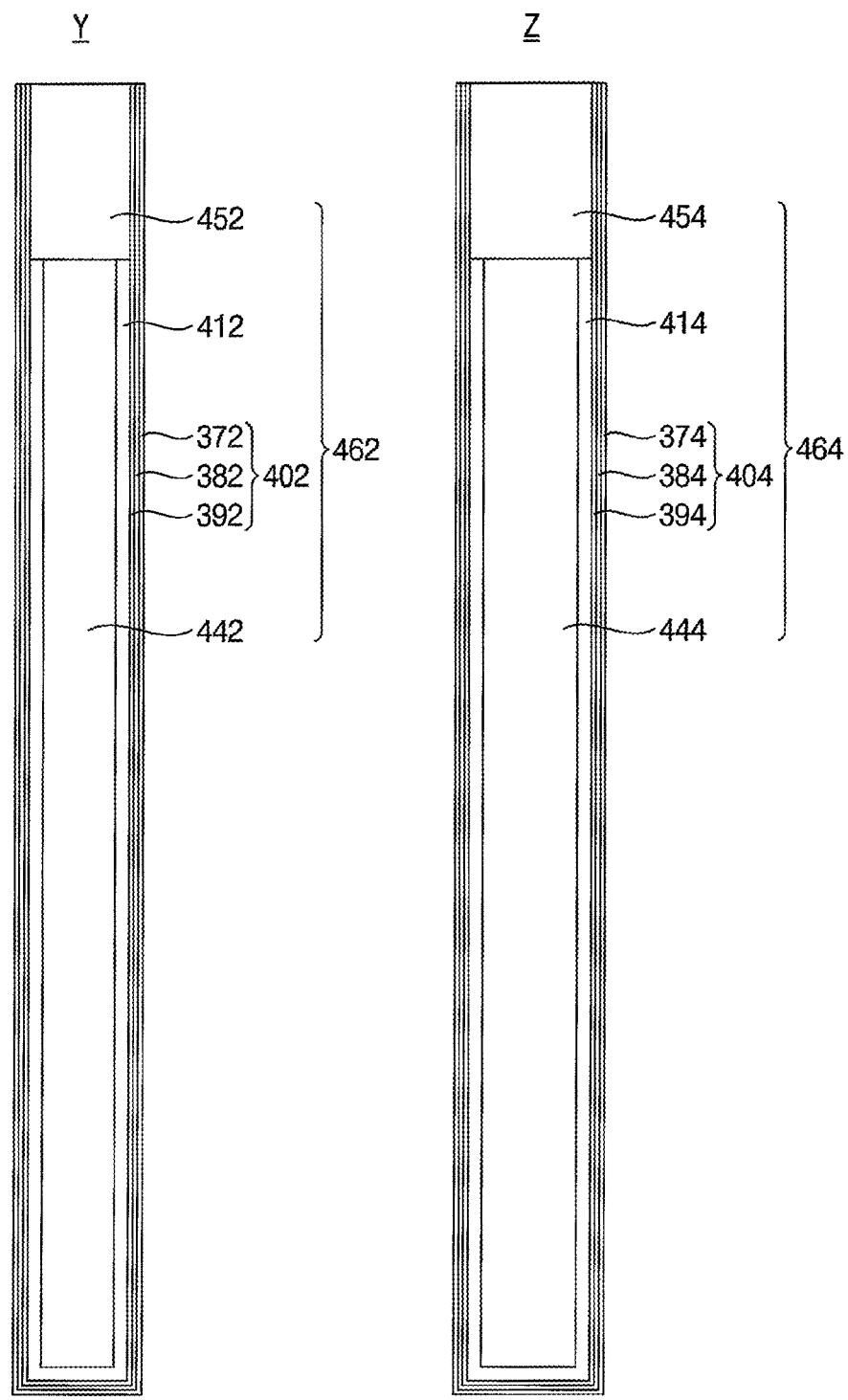

Referring to FIGS. 19 and 20, a charge storage structure layer and a channel layer may be sequentially formed on sidewalls of the channels hole 360 and the dummy channel hole 365, the exposed upper surface of the CSP 240, and an upper surface of the eighth insulating interlayer 350, and a filling layer may be formed on the channel layer to fill the channel holes 360 and the dummy channel holes 365.

In some example embodiments, the charge storage structure layer may include a first blocking layer, a charge storage layer, and a tunnel insulation layer sequentially stacked. The first blocking layer and the tunnel insulation layer may include an oxide (e.g., silicon oxide), the charge storage layer may include a nitride (e.g., silicon nitride), the channel layer may include a semiconductor material (e.g., polysilicon or single crystalline silicon that is undoped or lightly doped with impurities), and the filling layer may include an oxide (e.g., silicon oxide).

The filling layer, the channel layer, and the charge storage structure layer may be planarized until an upper surface of the eighth insulating interlayer 350 is exposed. Thus, a charge storage structure 402, a channel 412 and a first filling pattern 442 may be formed in the channel hole 360, and a dummy charge storage structure 404, a dummy channel 414 and a second filling pattern 44 may be formed in the dummy channel hole 365. The charge storage structure 402 may include a first blocking pattern 372, a charge storage pattern 382 and a tunnel insulation pattern 392 sequentially stacked, and the dummy charge storage structure 404 may include a dummy blocking pattern 374, a dummy charge storage pattern 384 and a dummy tunnel insulation pattern 394 sequentially stacked.

Upper portions of the first filling pattern 442 and the channel 412 may be removed to form a second recess, and upper portions of the second filling pattern 444 and the dummy channel 414 may be removed to form a third recess. Third and fourth capping patterns 452 and 454 may be formed to fill the second and third recesses, respectively. Each of the third and fourth capping patterns 452 and 454 may include a semiconductor and/or conductive material (e.g., doped or undoped polysilicon).

The charge storage structure a, the channel 412, the first filling pattern 442, and the third capping pattern 452 in the channel hole 360 may form a memory channel structure 462, and the dummy charge storage structure 404, the dummy channel 414, the second filling pattern 444 and the fourth capping pattern 454 in the dummy channel hole 365 may form a dummy memory channel structure 464. The dummy memory channel structure 464 may serve neither as a memory unit for storing data channel nor a channel in which charge carrier may move, but may prevent the mold from leaning or falling down, and thus may be referred to as a support structure 464.

In some example embodiments, each of the memory channel structure 462 and the support structure 464 may have a shape of a pillar extending in the first direction D1. In example embodiments, a plurality of memory channel structures 462 may be formed in each of the second and third directions D2 and D3 on the first region I of the substrate 100, and a plurality of support structures 464 may be formed in each of the second and third directions D2 and D3 on the second region II of the substrate 100.

Figure 21:
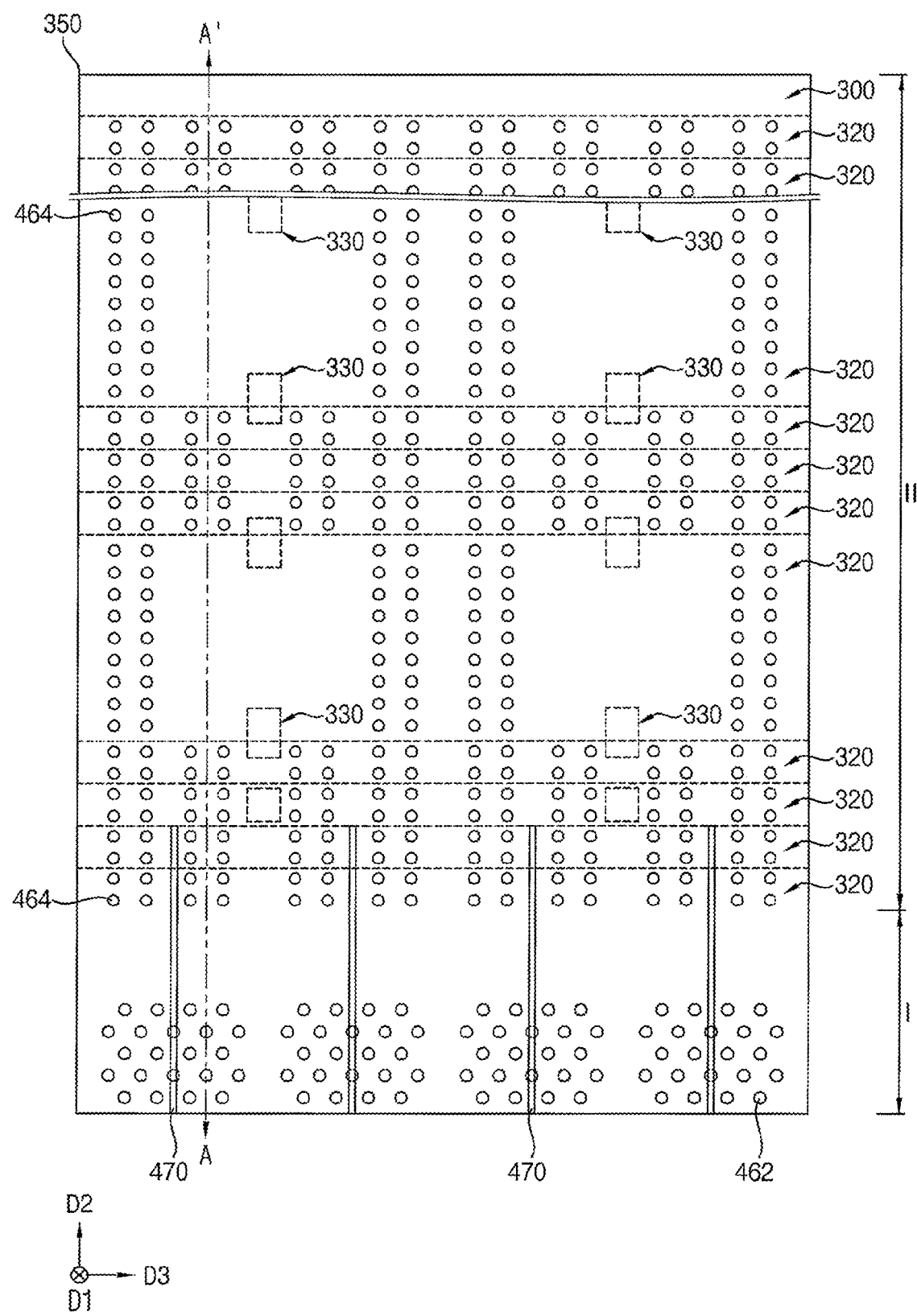

Referring to FIG. 21, the eighth insulating interlayer 350 and some of the insulation layers 310 and the fourth sacrificial layers 320 may be partially etched to form a sixth opening extending in the second direction D2, and a second division pattern 470 may be formed in the sixth opening.

In some example embodiments, the second division pattern 470 may extend through an upper portion of some of the memory channel structures 462. The second division pattern 470 may also extend through the eighth insulating interlayer 350, ones of the fourth sacrificial layers 320 at two upper levels, and ones of the insulation layers 310 at two upper levels, and may further extend through one of the insulation layers 310 at a third level from above. The second division pattern 470 may extend in the second direction D2 on the first and second regions I and II of the substrate 100, and may extend through upper two step layers of the mold. Thus, the fourth sacrificial layers 320 at two upper levels of the mold may be divided in the third direction D3 by the second division pattern 470.

Figure 22:
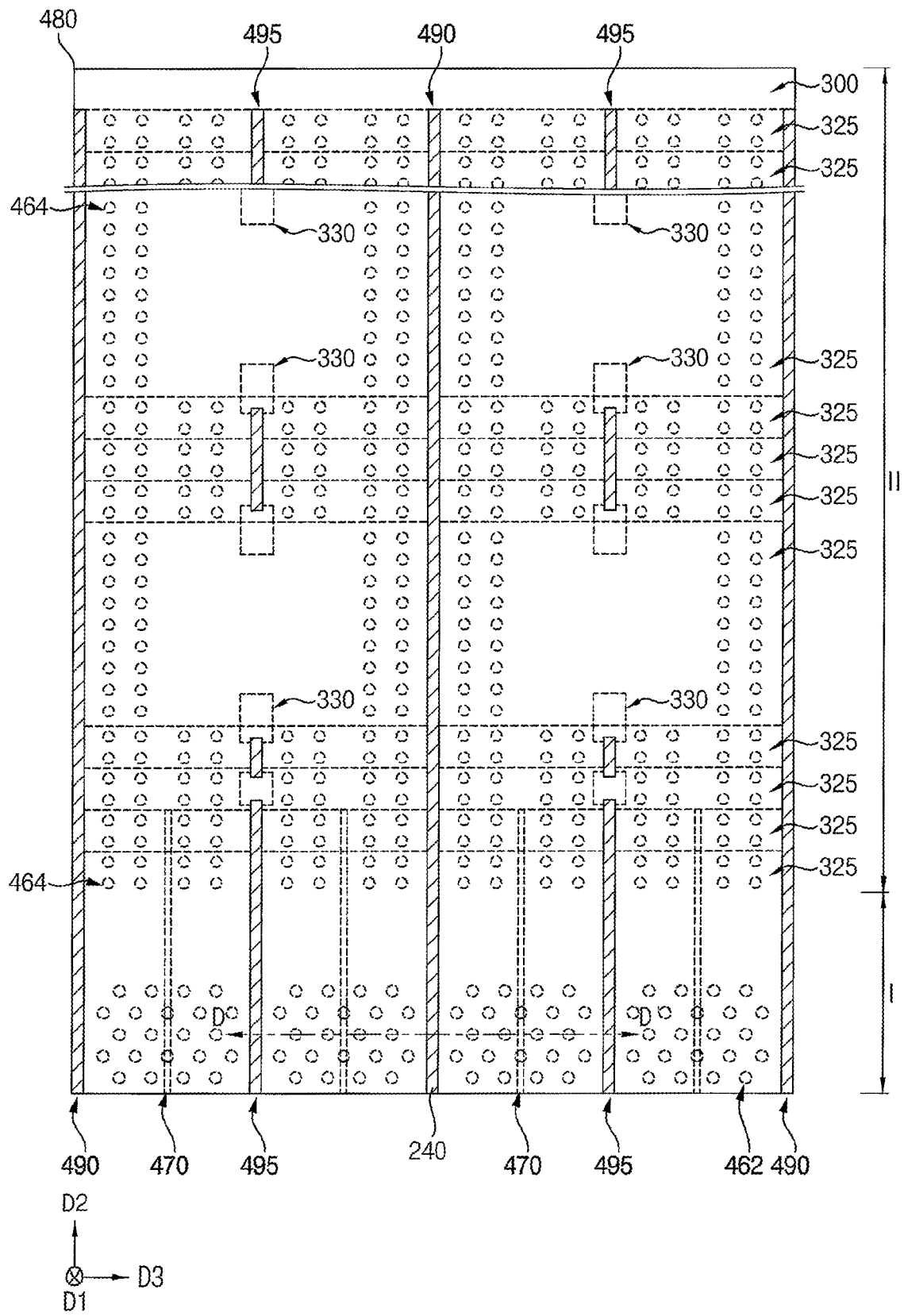
Figure 23:
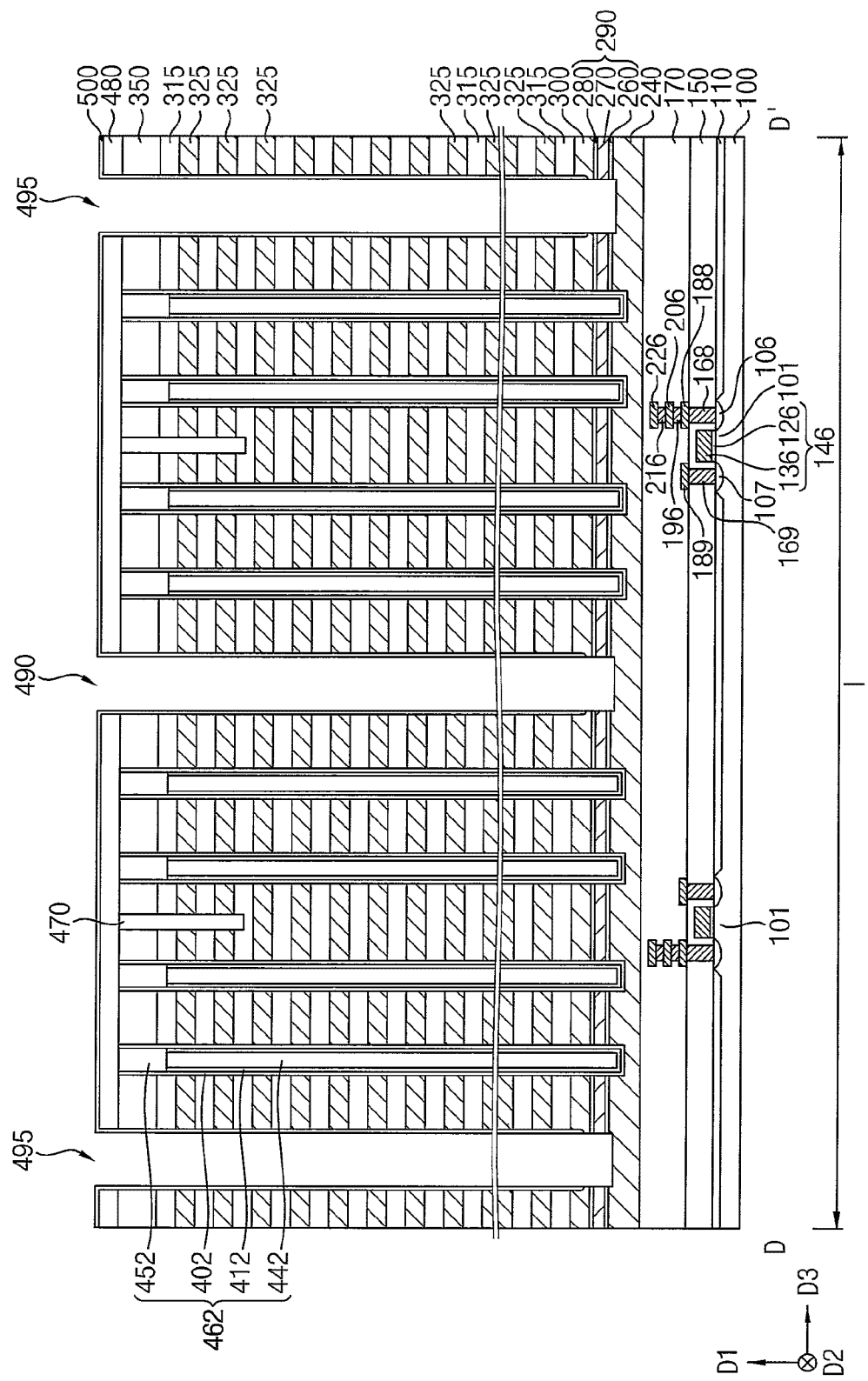

Referring to FIGS. 22 and 23, a ninth insulating interlayer 480 including an oxide (e.g., silicon oxide) may be formed on the eighth insulating interlayer 350, the memory channel structure 462, the support structure 464, and the second division pattern 470, and seventh and eighth openings 490 and 495 may be formed through the seventh to ninth insulating interlayers 340, 350, and 480 and the mold by an etching process.

In example embodiments, the seventh opening 490 may extend in the second direction D2 on the first and second regions I and II of the substrate 100, and may extend to opposite ends in the second direction D2 of the mold. In example some embodiments, a plurality of seventh openings 490 may be spaced apart from each other in the third direction D3. Thus, the mold may be divided into a plurality of parts in the third direction D3 by the seventh openings 490. As the seventh opening 490 is formed, the insulation layers 310 and the fourth sacrificial layers 320 of the mold may be divided into first insulation patterns 315 and fourth sacrificial patterns 325, respectively.

In some example embodiments, the eighth opening 495 may continuously extend in the second direction D2 on the first region I of the substrate 100. A plurality of eighth openings 495 may be spaced apart from each other in the second direction D2 on the second region II of the substrate 100. The eighth openings 495 arranged in the second direction D2 may be formed between neighboring ones of the seventh openings 490 in the third direction D3. The eighth openings 495 may be spaced apart from each other in the second direction D2, which may be different from the seventh opening 490 continuously extending in the second direction D2 to opposite ends in the second direction D2 of the mold, and thus the mold may not entirely divided in the third direction D3 by the eighth opening 495. In some example embodiments, a portion of the mold between neighboring ones of the eighth openings 495 in the second direction D2 may at least partially overlap the first division pattern 330 in the first direction D1.

Each of the eighth openings 495 may continuously extend in the second direction D2 on the first region I of the substrate 100, and may continuously extend to end portions in the second direction D2 of the step layers of the mold at upper two levels even on the second region II of the substrate 100. Thus, the fourth sacrificial patterns 325 at the upper two levels of the mold may be divided by the eighth opening 495 and the second division patterns 470 at opposite sides in the third direction D3 of the eighth opening 495.

Even though the mold may be divided into a plurality of parts spaced apart from each other in the third direction D3 each of which may extend in the second direction D2 by the etching process for forming the seventh and eighth openings 490 and 495, the support structures 464 and the memory channel structures 462 extending through the mold may prevent and/or mitigate the mold from leaning or falling down.

In example embodiments, the etching process may be performed until the seventh and eighth openings 490 and 495 expose an upper surface of the first support layer 300, and further extend through an upper portion of the first support layer 300.

A first spacer layer may be formed on sidewalls of the seventh and eighth openings 490 and 495 and an upper surface of the ninth insulating interlayer 480, and may be anisotropically etched so that portions of the first spacer layer on bottoms of the seventh and eighth openings 490 and 495 may be removed to form a first spacer 500. Thus, an upper surface of the first support layer 300 may be partially exposed.

The exposed first support layer 300 and a portion of the first sacrificial layer structure 290 thereunder may be removed to enlarge the seventh and eighth openings 490 and 495 downwardly. Accordingly, each of the seventh and eighth openings 490 and 495 may expose an upper surface of the CSP 240, and further extend through an upper portion of the CSP 240.

In some example embodiments, the first spacer 500 may include a material having an etching selectivity with respect to the first sacrificial layer structure 290 (e.g., undoped polysilicon). When the first sacrificial layer structure 290 is partially removed, the sidewalls of the seventh and eighth openings 490 and 495 may be covered by the first spacer 500, and thus the first insulation patterns 315 and the fourth sacrificial patterns 325 included in the mold may not be removed.

Figure 24:
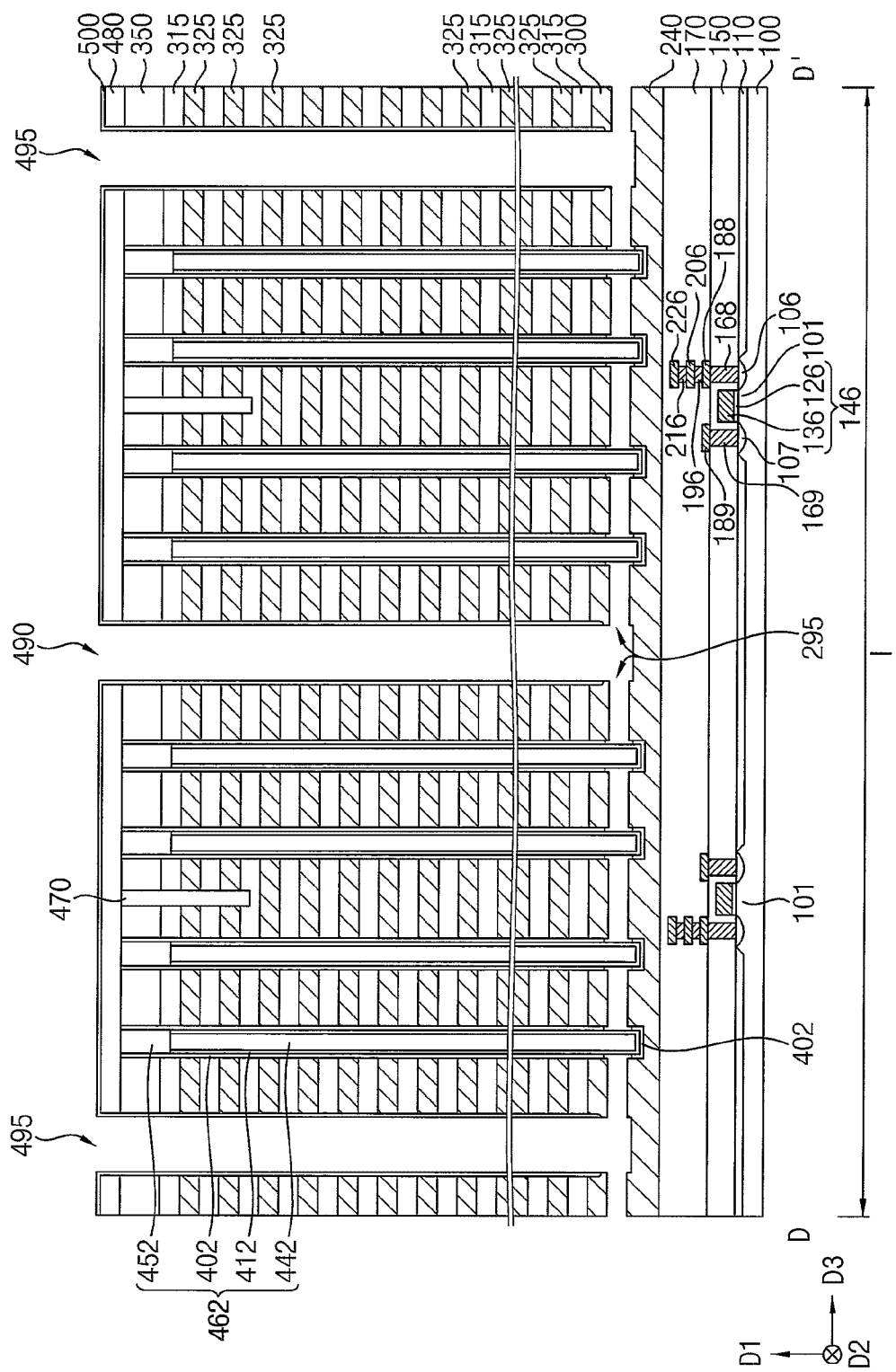

Referring to FIG. 24, the first sacrificial layer structure 290 exposed by the seventh and eighth openings 490 and 495 may be removed by, e.g., a wet etching process to form a first gap 295.

The wet etching process may be performed using an acid (e.g., hydrofluoric acid (HF) and/or phosphoric acid ($H_3PO_4$). In some example embodiments, the seventh and eighth openings 490 and 495 may extend through the support pattern 305 instead of extending through the first support layer 300 and the first sacrificial layer structure 290 on the second region II of the substrate 100, and thus the first sacrificial layer structure 290 might not be removed from the second region II of the substrate 100 by the wet etching process.

As the first gap 295 is formed, a lower portion of the first support layer 300 and an upper surface of the CSP 240 may be exposed. Additionally, a sidewall of the charge storage structure 402 may be partially exposed by the first gap 295, and the exposed sidewall of the charge storage structure 402 may also be removed to expose an outer sidewall of the channel 412. Accordingly, the charge storage structure 402 may be divided into an upper portion extending through the mold to cover most portion of the outer sidewall of the channel 412 and a lower portion covering a lower surface of the channel 412 on the CSP 240.

Figure 25:
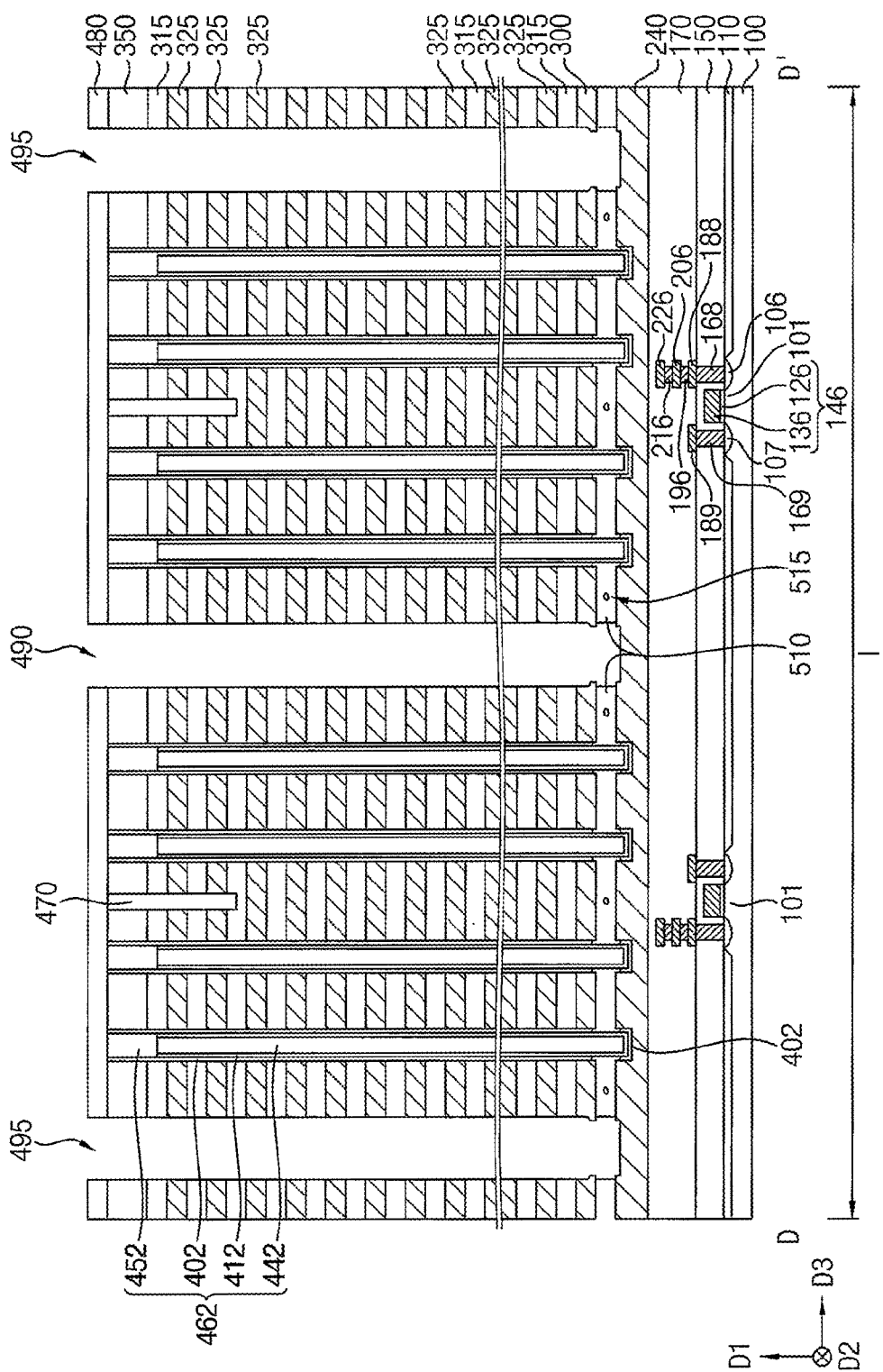

Referring to FIG. 25, after removing the first spacer 500, a channel connection layer may be formed on the sidewalls of the seventh and eighth openings 490 and 495 and in the first gap 295, and a portion of the channel connection layer in the seventh and eighth openings 490 and 495 may be removed to form a channel connection pattern 510 in the first gap 295.

As the channel connection pattern 510 is formed, the channels 412 between neighboring ones of the seventh and eighth openings 490 and 495 in the third direction D3 may be connected with each other. The channel connection pattern 510 may include a semiconductor material (e.g., polysilicon doped with n-type impurities or undoped polysilicon).

An air gap 515 may be formed in the channel connection pattern 510.

Figure 26:
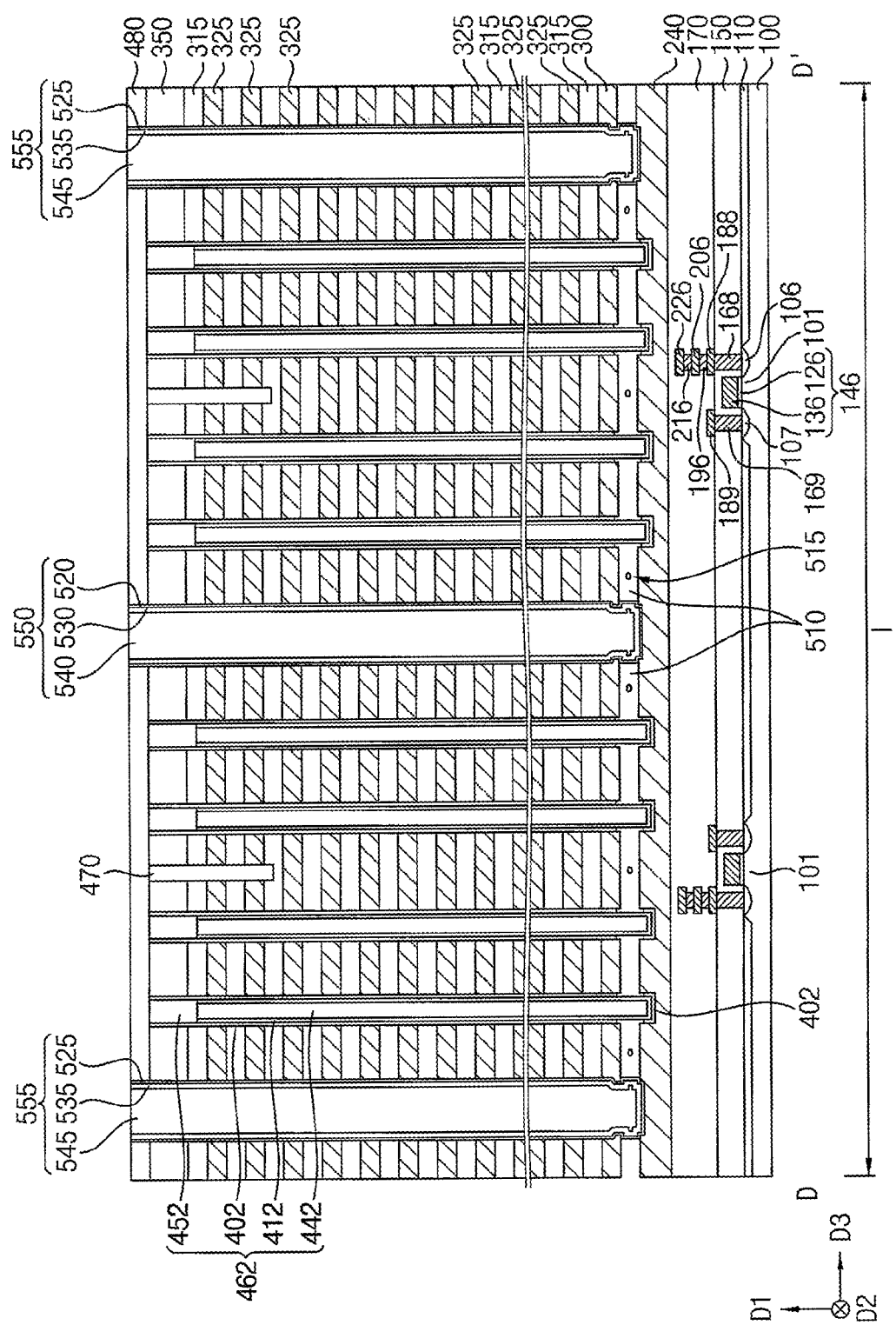

Referring to FIG. 26, second and third sacrificial layer structures 550 and 555 may be formed in the seventh and eighth openings 490 and 495, respectively.

The second and third sacrificial layer structures 550 and 555 may be formed by sequentially forming an etch stop layer and a second spacer layer on the sidewalls of the seventh and eighth openings 490 and 495 and the exposed upper surface of the CSP 240, forming a fifth sacrificial layer on the second spacer layer to fill the seventh and eighth openings 490 and 495, and planarizing the fifth sacrificial layer, the second spacer layer, and the etch stop layer until the upper surface of the ninth insulating interlayer 480 is exposed.

The second sacrificial layer structure 550 may include a first etch stop pattern 520, a second spacer 530, and a fifth sacrificial pattern 540 sequentially stacked, the third sacrificial layer structure 555 may include a second etch stop pattern 525, a third spacer 535, and a sixth sacrificial pattern 545 sequentially stacked.

The etch stop layer may include a material having an etching selectivity with respect to the fourth sacrificial pattern 325, e.g., an oxide such as silicon oxide. The second spacer layer may include, e.g., a nitride such as silicon nitride, and/or the fifth sacrificial layer may include, e.g., polysilicon or silicon oxide.

Figure 27:
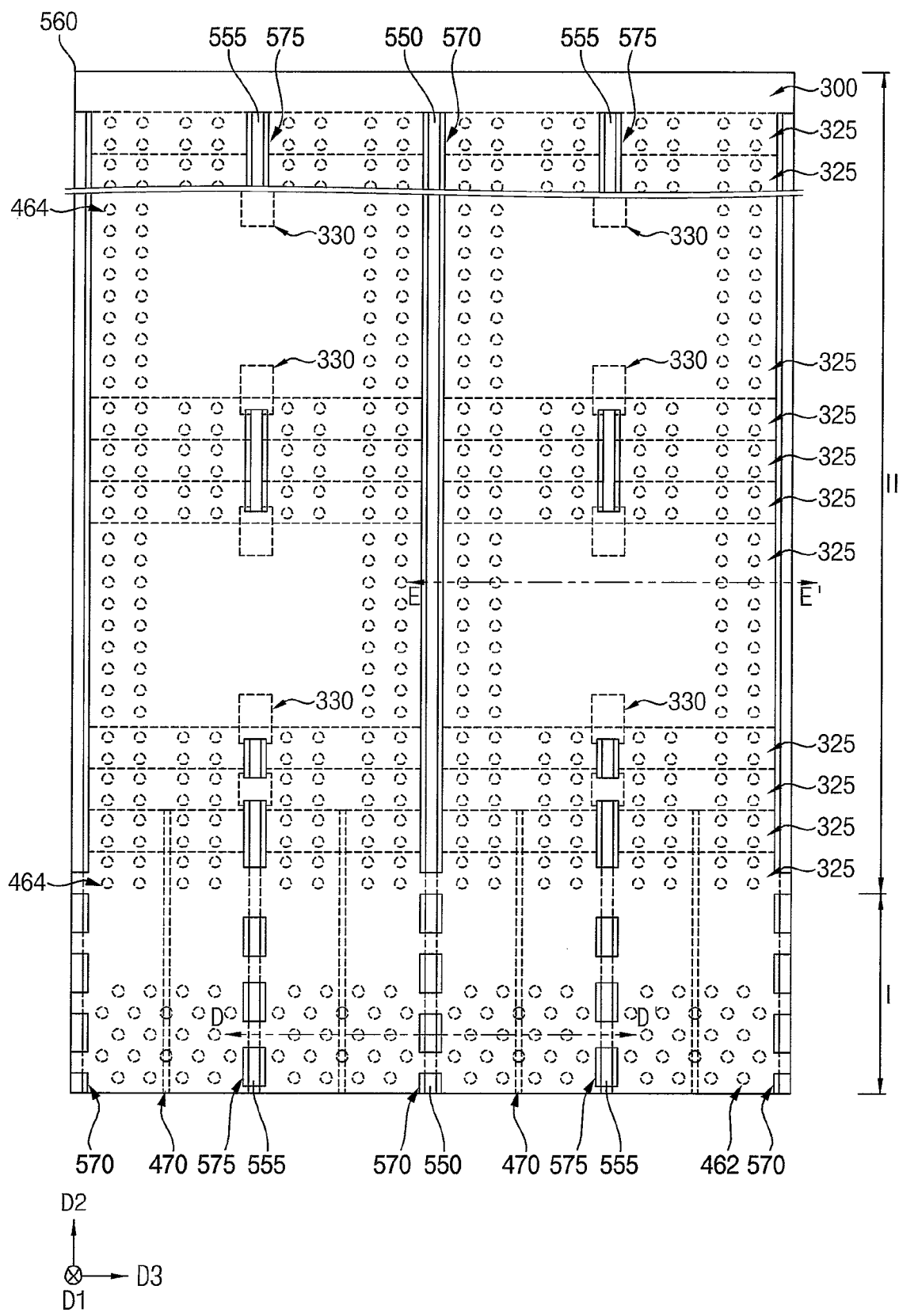
Figure 28:
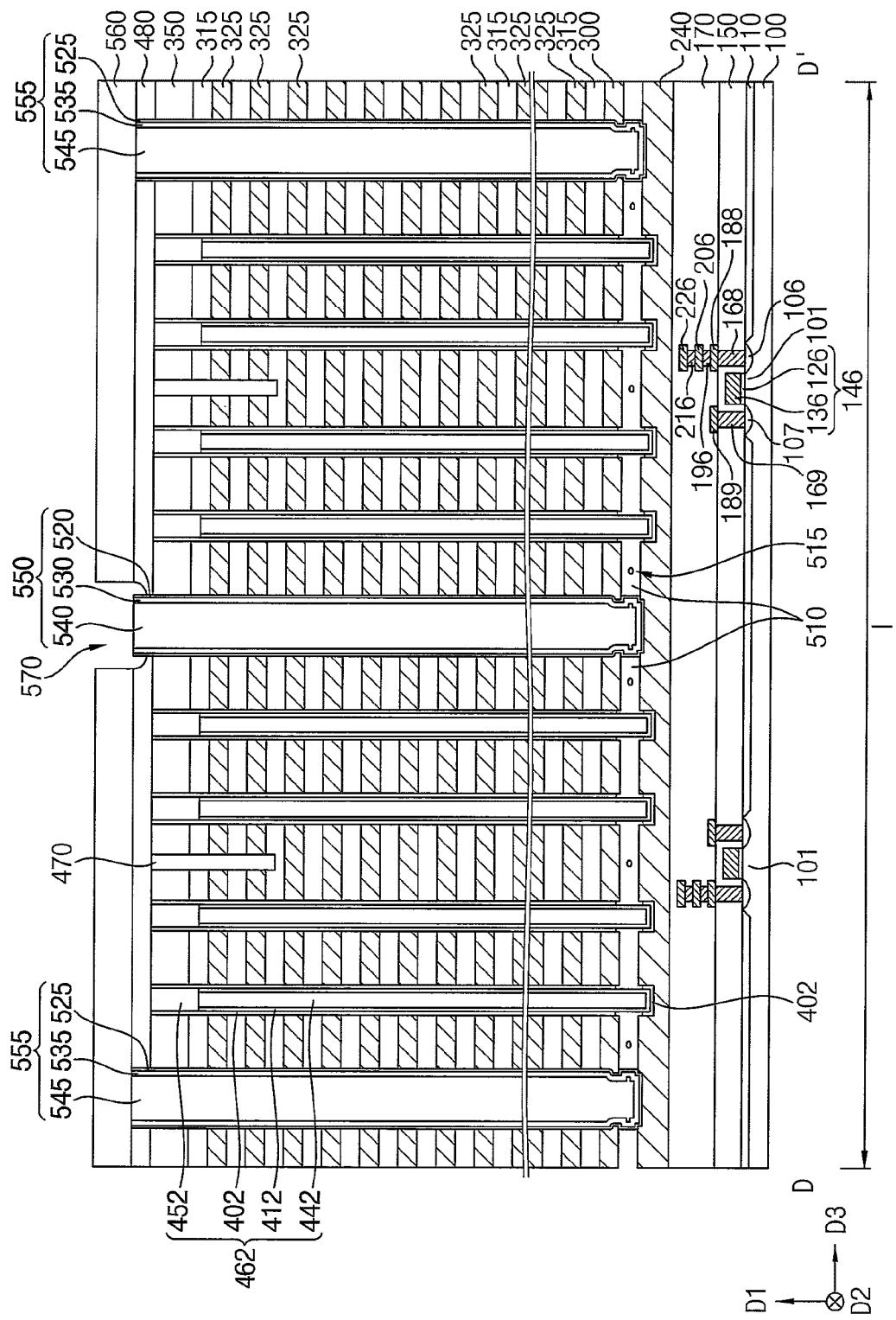

Referring to FIGS. 27 and 28, a second support layer 560 may be formed on the ninth insulating interlayer 480, and the second and third sacrificial layer structures 550 and 555, and may be partially etched to form ninth and tenth openings 570 and 575.

In example embodiments, the ninth opening 570 may overlap the second sacrificial layer structure 550 in the first direction D1. In the drawing, the ninth opening 570 continuously extends in the second direction D2 on the second region II of the substrate 100, and a plurality of ninth openings 570 is spaced apart from each other in the second direction D2 on the first region I of the substrate 100. However, the example embodiments are not limited thereto, and a plurality of ninth openings 570 may be spaced apart from each other in the second direction D2 even on the second region II of the substrate 100. In some example embodiments, the ninth opening 570 may have a width in the third direction D3 greater than that of the second sacrificial layer structure 550. However, the example embodiments may not be limited thereto.

In some example embodiments, the tenth opening 575 may overlap the third sacrificial layer structure 555 in the first direction D1. Thus, a plurality of tenth openings 575 may be spaced apart from each other in the second direction D2 on the second region II of the substrate 100. A plurality of tenth openings 575 may also be spaced apart from each other in the second direction D2 on the same third sacrificial layer structure 555, even on the first region I of the substrate 100. In some example embodiments, the tenth opening 575 may have a width in the third direction D3 greater than that of the third sacrificial layer structure 555; however, the example embodiments are not limited thereto.

In some example embodiments, the ninth and tenth openings 570 and 575 may be arranged in a zigzag pattern in the second direction D2 on the first region I of the substrate 100. The ninth and tenth openings 570 and 575 may partially overlap each other in the third direction D3.

The second support layer 560 may include an oxide (e.g., silicon oxide).

Figure 29:
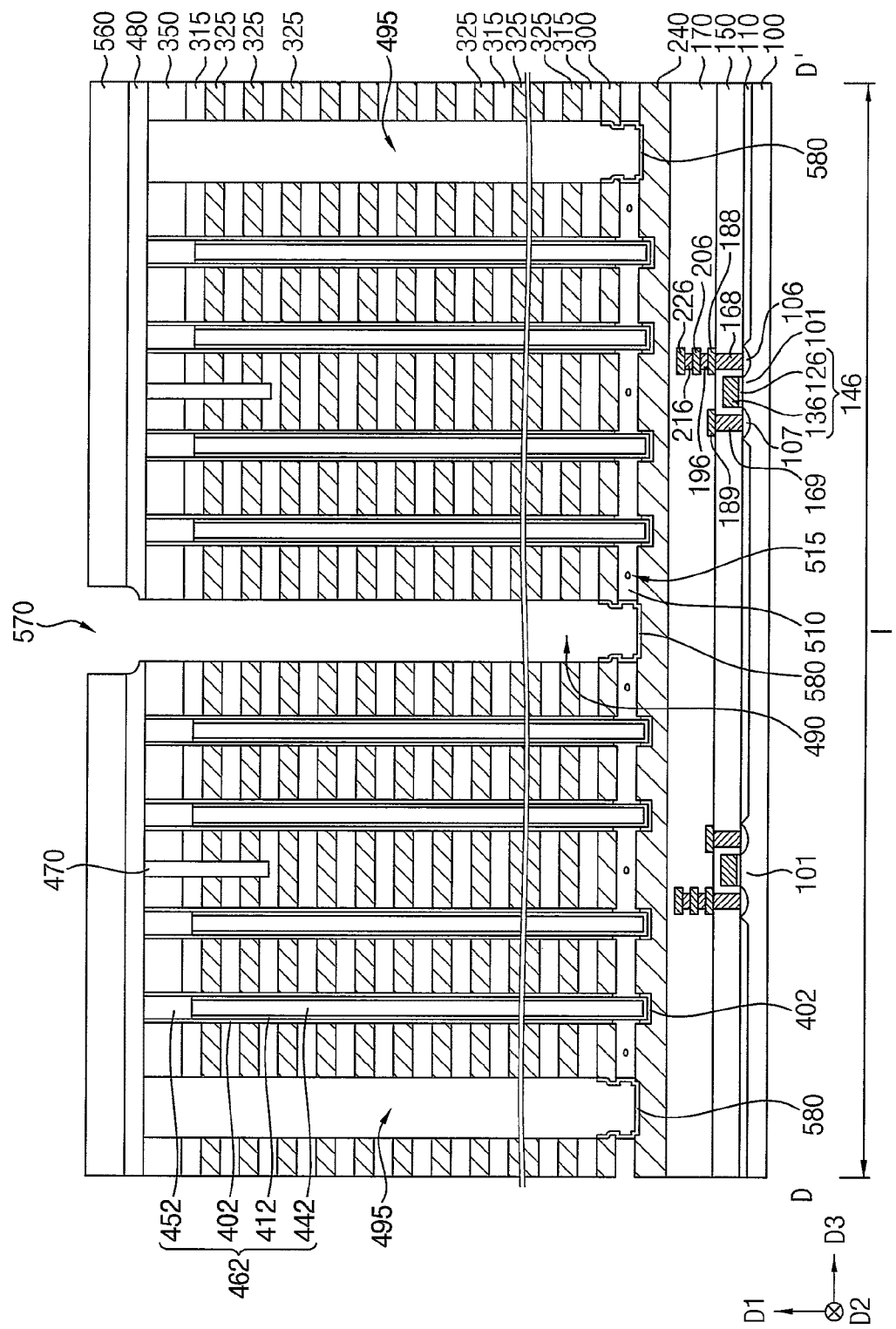

Referring to FIG. 29, the second and third sacrificial layer structures 550 and 555 may be removed by an etching process through the ninth and tenth openings 570 and 575, and thus the seventh and eighth openings 490 and 495 may be formed again.

As illustrated above, the ninth and tenth openings 570 and 575 might not entirely expose but partially cover upper surfaces of the second and third sacrificial layer structures 550 and 555, respectively, on the first region I of the substrate 100, and thus, even though the seventh and eighth openings 490 and 495 are formed again by the etching process, the upper surfaces of the second and third sacrificial layer structures 550 and 555 may be at least partially covered by the second support layer 560. Accordingly, the mold might not lean or fall down in the third direction D3. A plurality of eighth openings 495 is spaced apart from each other in the second direction D2 on the second region II of the substrate 100 so that a portion of the mold remain between the eighth openings 495, and the support structures 464 extend through the mold, and thus the mold may not lean or fall down in the third direction D3 due to the portion of the mold and the support structures 464.

In some example embodiments, the second and third sacrificial layer structures 550 and 555 may be removed by a wet etching process.

An oxidation process may be performed on a layer structure including silicon and exposed by the seventh and eighth openings 490 and 495 to form a protection layer 580. In example some embodiments, as the oxidation process is performed, the protection layer 580 may be formed on the upper surface of the CSP 240 exposed by the seventh and eighth openings 490 and 495, a sidewall of the channel connection pattern 510, and a sidewall of the first support layer 300.

Figure 30:
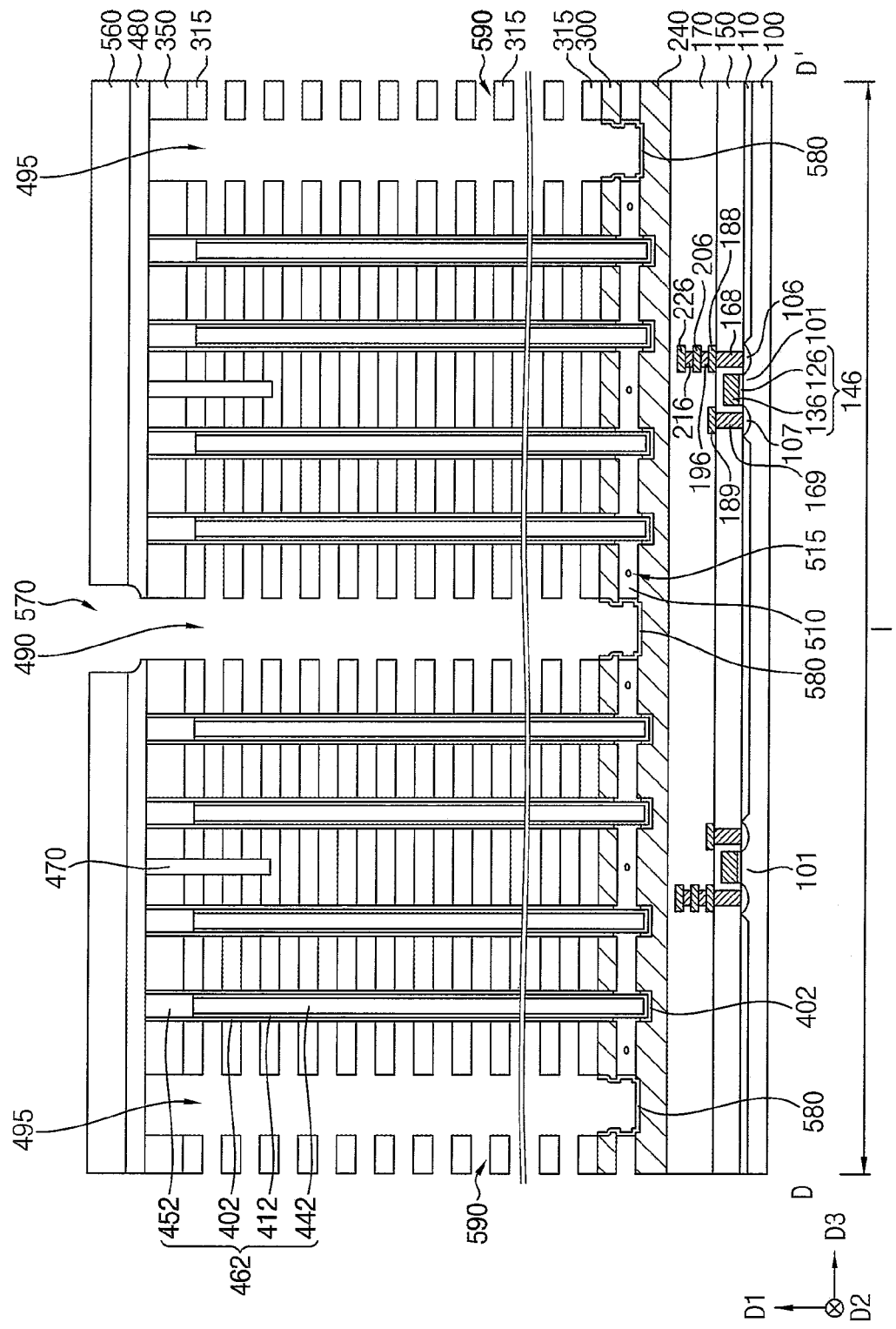
Figure 31:
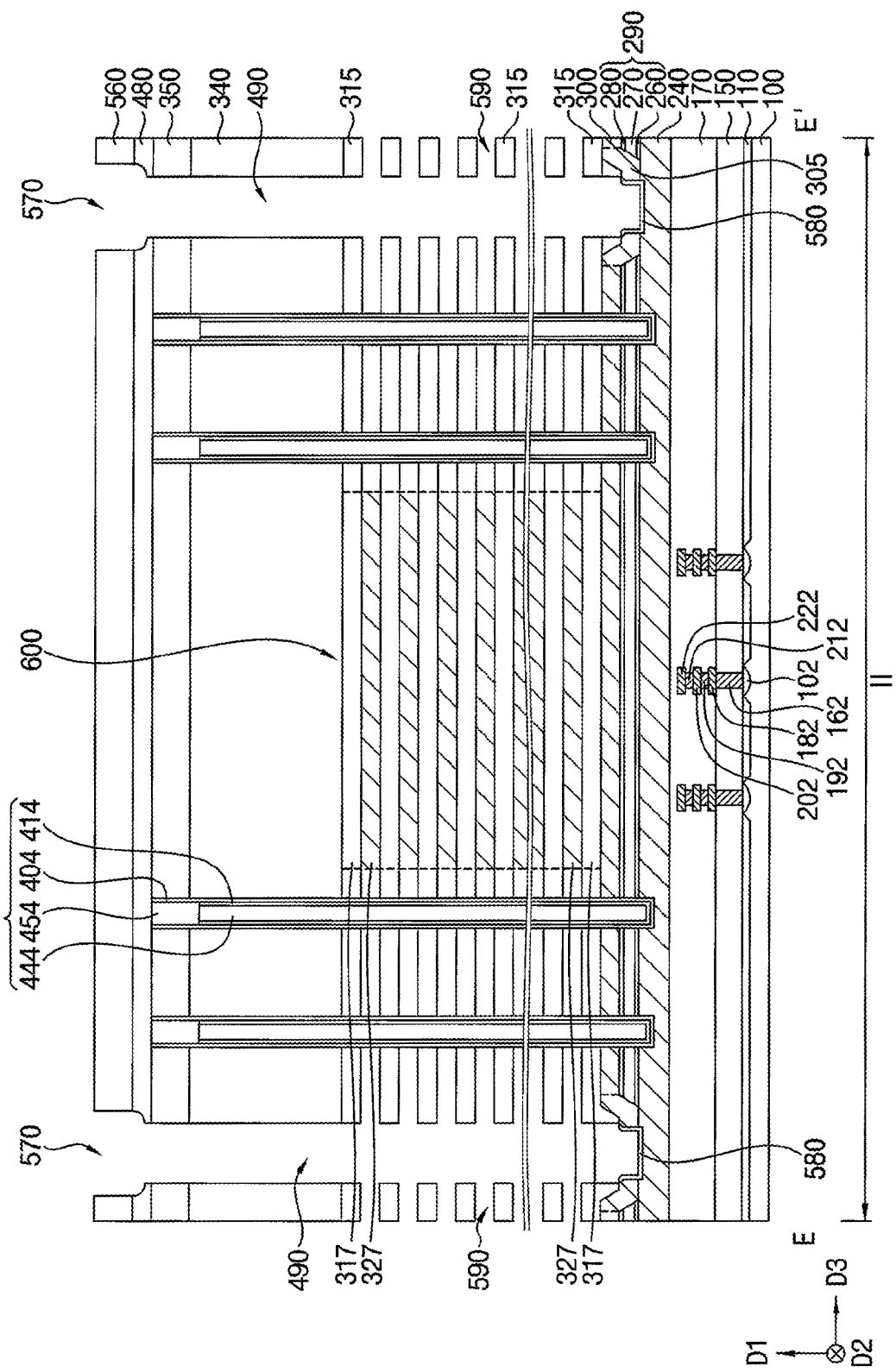

Referring to FIGS. 30 and 31, the fourth sacrificial patterns 325 exposed by the seventh and eighth openings 490 and 495 may be removed to form a second gap 590 between the first insulation patterns 315, and an outer sidewall of the charge storage structure 402 included in the memory channel structure 462 and an outer sidewall of the dummy charge storage structures 404 included in the support structure 464 may be partially exposed by the second gap 590.

In example embodiments, the fourth sacrificial patterns 325 may be removed by a wet etching process using an acid (e.g., phosphoric acid ($H_3PO_4$) and/or sulfuric acid ($H_2SO_4$)).

The wet etching process may be performed through the seventh and eighth openings 490 and 495, and a portion of the fourth sacrificial pattern 325 between the seventh and eighth openings 490 and 495 may be entirely removed by an etching solution provided through the seventh and eighth openings 490 and 495 in two ways. The etching solution may be provided only through the seventh opening 490 at an area where the eighth opening 495 is not formed between the seventh openings 490 on the second region II of the substrate 100, and thus the fourth sacrificial pattern 325 might not be entirely removed but may partially remain, which may be referred to as a third insulation pattern 327. Additionally, a portion of the first insulation pattern 315 overlapping the third insulation patterns 327 in the first direction D1 may be referred to as a second insulation pattern 317. The second and third insulation patterns 317 and 327 alternately and repeatedly stacked in the first direction D1 may form an insulation pattern structure 600.

For example, the insulation pattern structure 600 may extend through a portion of the mold on the second region II of the substrate 100, and may have a shape of a rectangle, ellipse, circle, or a rectangle with concave opposite sides in the second direction D2. In some example embodiments, the insulation pattern structure 600 may extend through the second step having a relatively large length in the second direction D2 in each mold.

Figure 32:
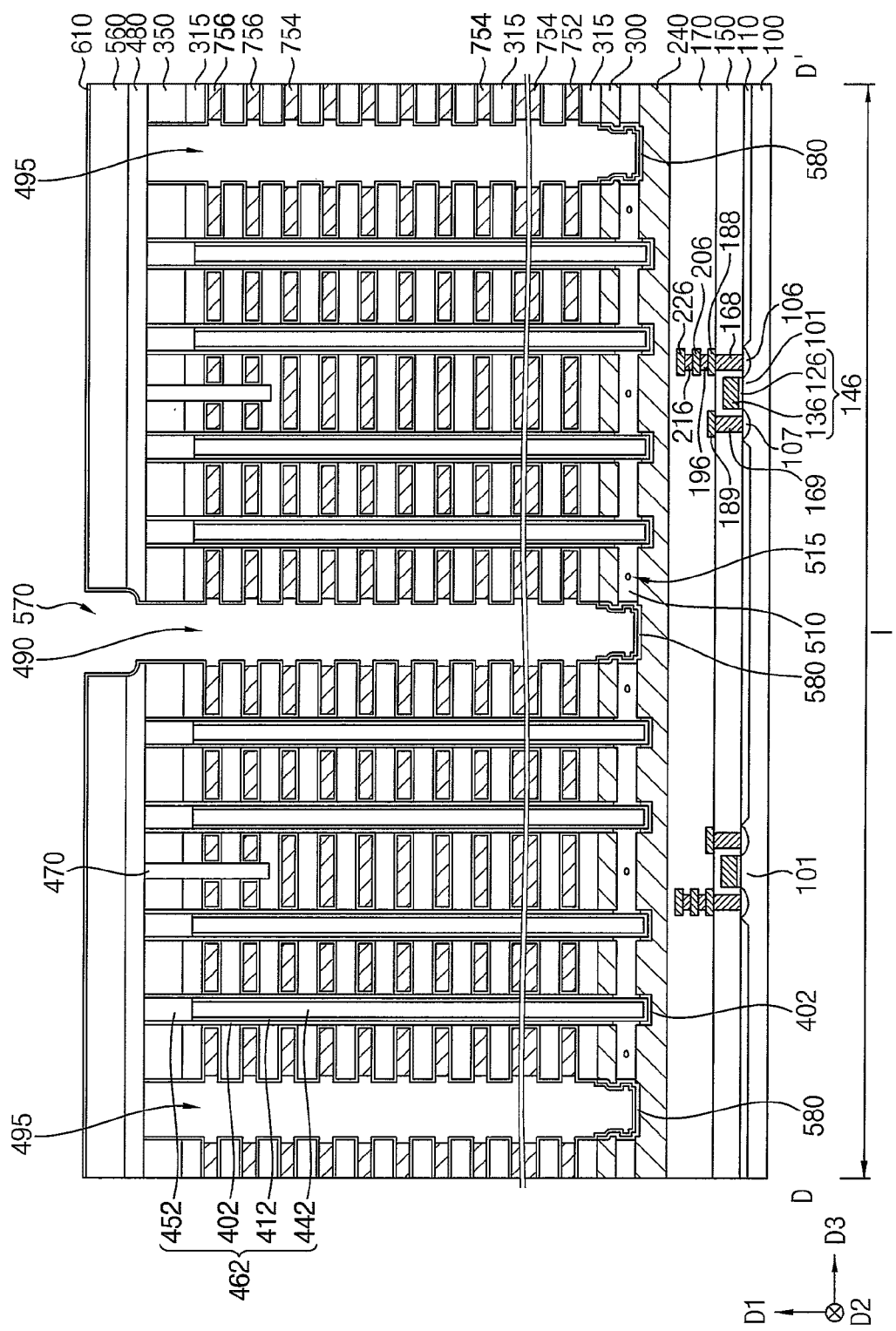
Figure 33:
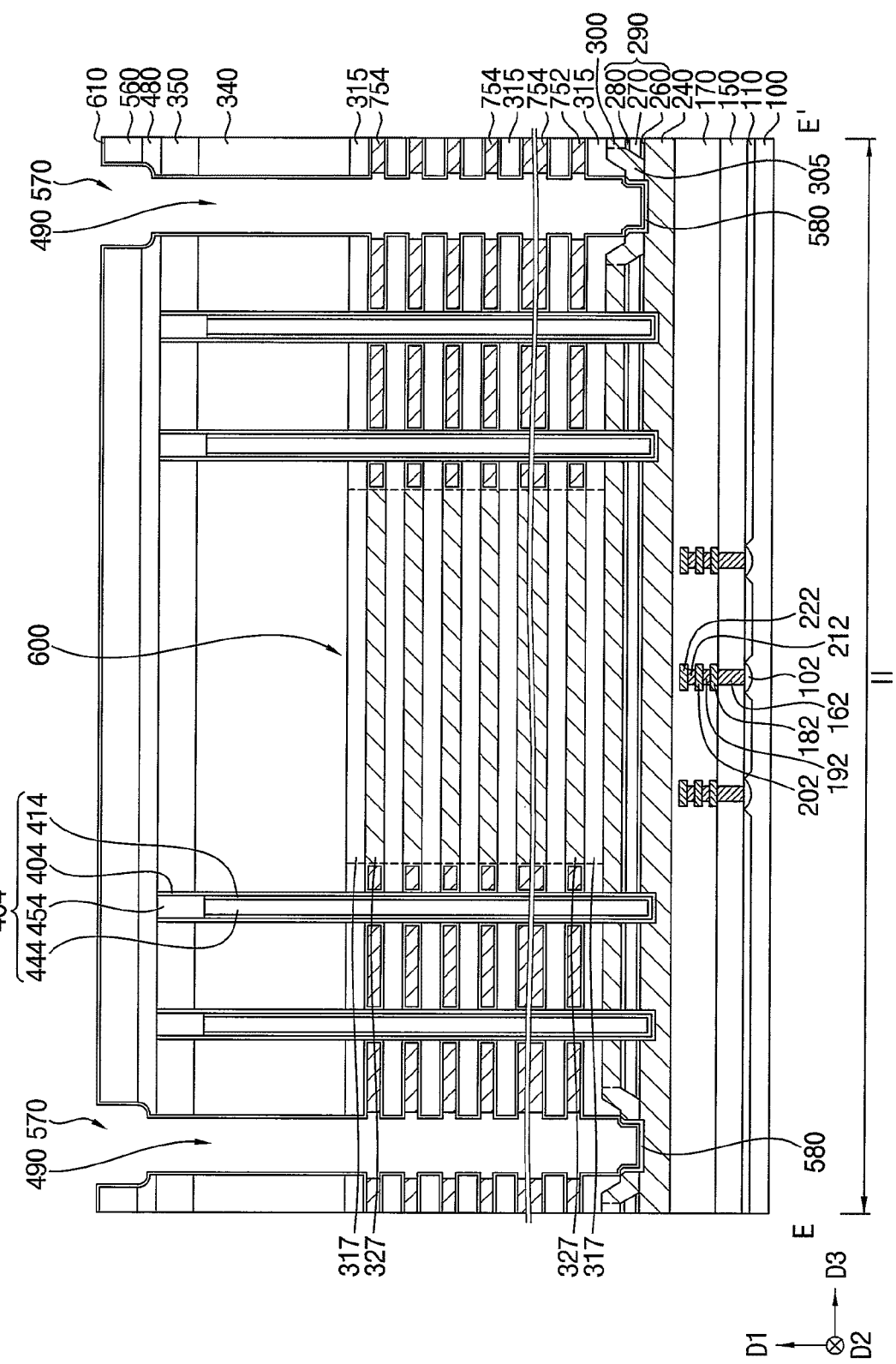

Referring to FIGS. 32 and 33, a second blocking layer 610 may be formed on the outer sidewall of the charge storage structure 402 and the outer sidewall of the dummy charge storage structure 404 exposed by the seventh and eighth openings 490 and 495, inner walls of the second gaps 590, surfaces of the first insulation patterns 315, an upper surface of the protection layer 580, a sidewall and an upper surface of the ninth insulating interlayer 480, and a sidewall and an upper surface of the second support layer 560, and a gate electrode layer may be formed on the second blocking layer 610.

The gate electrode layer may include a gate barrier layer and a gate conductive layer sequentially stacked. The gate electrode layer may include a low resistance metal, and the gate barrier layer may include a metal nitride. The second blocking layer 610 may include a metal oxide (e.g., aluminum oxide, hafnium oxide, zirconium oxide, etc.).

The gate electrode layer may be partially removed to form a gate electrode in each of the second gaps 590. In some example embodiments, the gate electrode layer may be partially removed by a wet etching process. As a result, the fourth sacrificial pattern 325 in the mold having the staircase shape including the fourth sacrificial pattern 325 and the first insulation pattern 315 sequentially stacked as a step layer may be replaced with the gate electrode and the second blocking layer 610 covering lower and upper surfaces of the gate electrode.

In some example embodiments, the gate electrode may extend in the second direction D2, and a plurality of gate electrodes may be spaced apart from each other in the first direction D1 to form a gate electrode structure. The gate electrodes may be staked in a staircase shape in which extension lengths in the second direction D2 decrease, in a stepwise manner, from a lowermost level toward an uppermost level. An end portion in the second direction D2 of each of the gate electrodes that is not overlapped with upper gate electrodes in the first direction D1, e.g., the step of each of the step layers may be referred to as a pad. The gate electrode structure may include first pads having a relatively short length in the second direction D2 and second pads having a relatively large length in the second direction D2. The numbers of the first and second pads might not be limited.

Additionally, a plurality of gate electrode structures may be formed in the third direction D3. The gate electrode structures may be spaced apart from each other in the third direction D3 by the seventh openings 490. As illustrated above, the eighth opening 495 might not extend in the second direction D2 to opposite ends in the second direction D2 of the gate electrode structure, but a plurality of eighth openings 495 may be spaced apart from each other in the second direction D2, and thus the gate electrode structure might not be divided by the eighth openings 495. However, one of the gate electrodes at a lowermost level may be divided in the third direction D3 by the eighth openings 495, the first division pattern 330 and the insulation pattern structure 600, and each one of the gate electrodes at upper two levels may be divided in the third direction D3 by the eighth opening 495 and the second division pattern 470.

In some example embodiments, the gate electrode structure may include first to third gate electrodes 752, 754, and 756 sequentially stacked in the first direction D1. In some example embodiments, the first gate electrode 752 may be formed at a lowermost level, and may serve as a ground selection line (GSL). The third gate electrode 756 may be formed at an uppermost level and/or a second level from the upper surface, and may serve as a string selection line (SSL). The second gate electrode 754 may be formed at a plurality of levels between the first and third gate electrodes 752 and 756, and may serve as word lines, respectively. However, the numbers of levels at which the first to third gate electrodes 752, 754, and 756 are formed might not be limited to the above, and may be varied.

In example embodiments, a memory block that may be formed between neighboring ones of the seventh openings 490 in the third direction D3 and include the first to third gate electrodes 752, 754 and 756, the charge storage structures 402 and the channels 412 may include two GSLs, one word line and four SSLs at each level, however, the example embodiments are not limited thereto.

Figure 34:
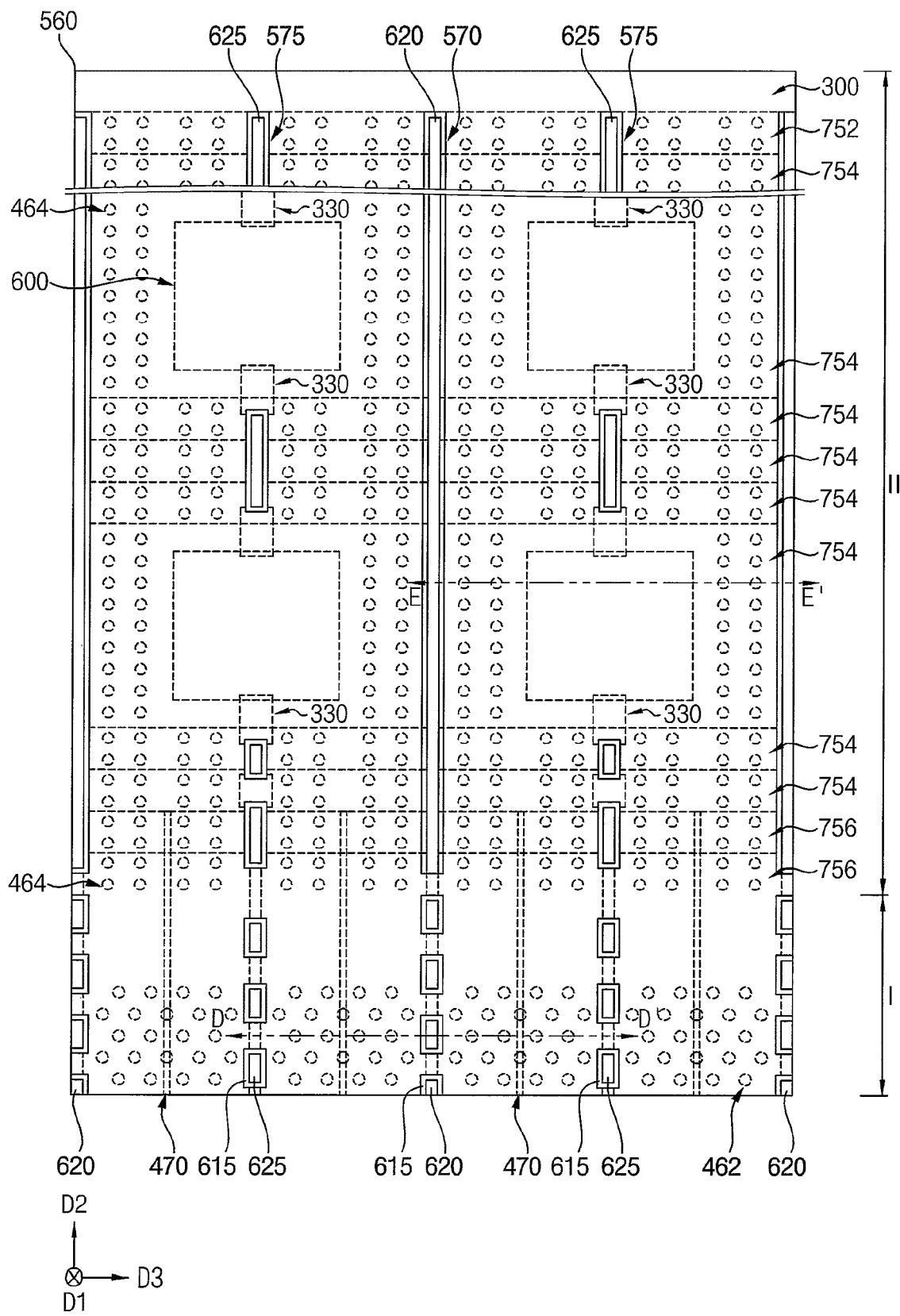
Figure 35:
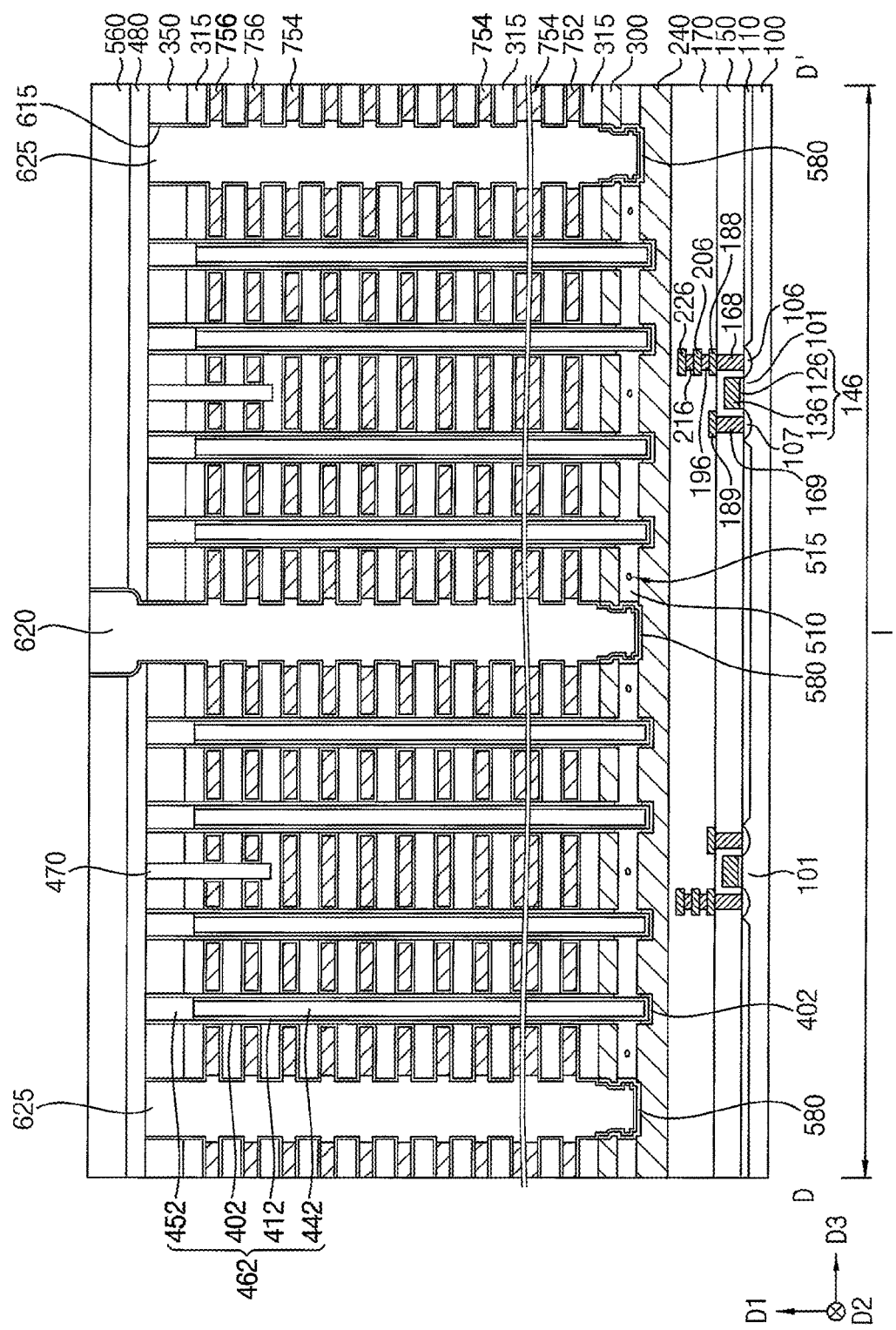
Figure 36:
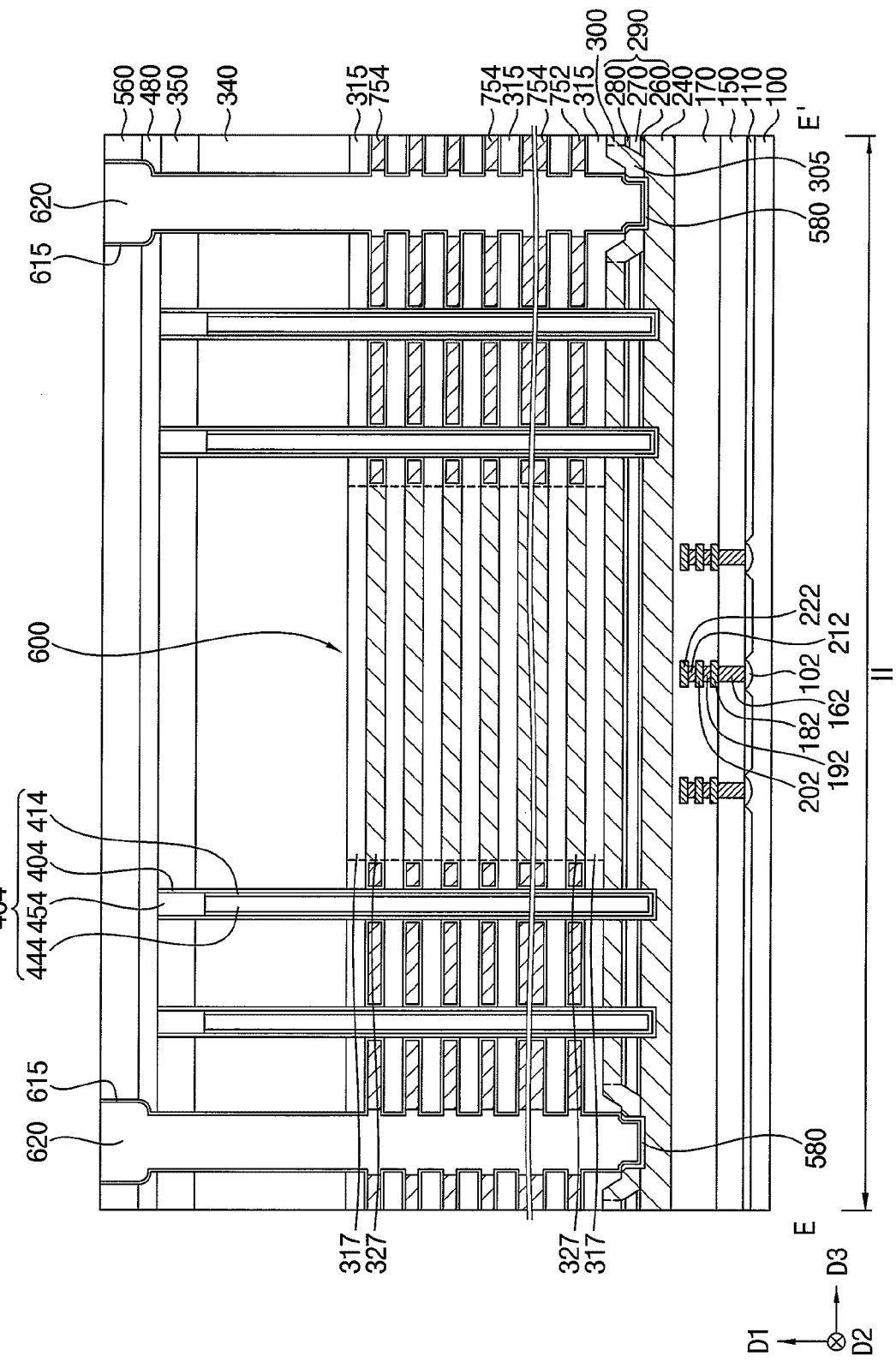

Referring to FIGS. 34 to 36, a third division pattern 620 filling the seventh and ninth openings 490 and 570 and a fourth division pattern 625 filling the eighth and tenth openings 495 and 575 may be formed on the second blocking layer 610, and may be planarized until an upper surface of the second support layer 560 is exposed. Thus, the second blocking layer 610 may be transformed into a second blocking pattern 615.

The third and fourth division patterns 620 and 625 may include an oxide, e.g., silicon oxide.

Figure 37:
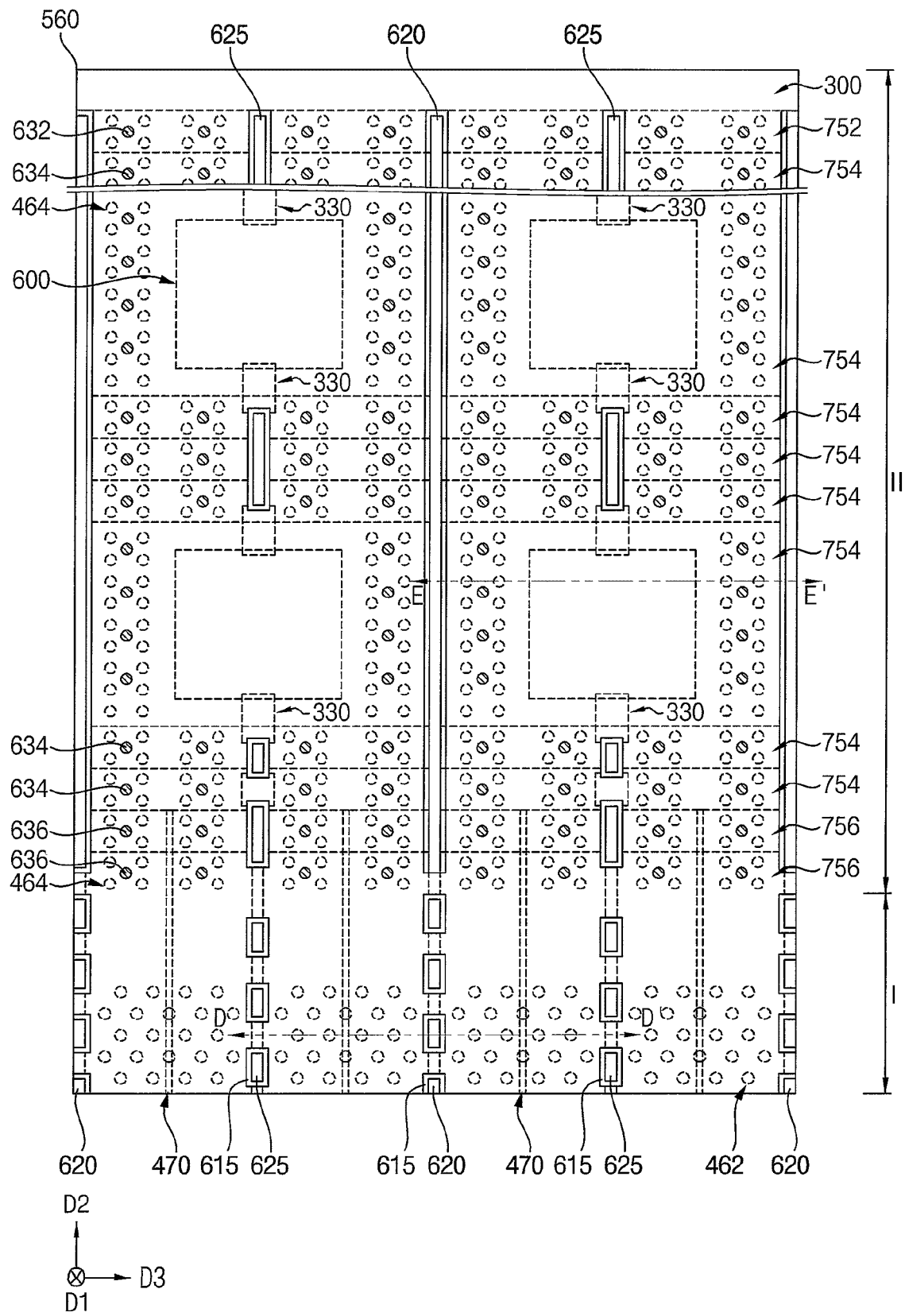
Figure 38:
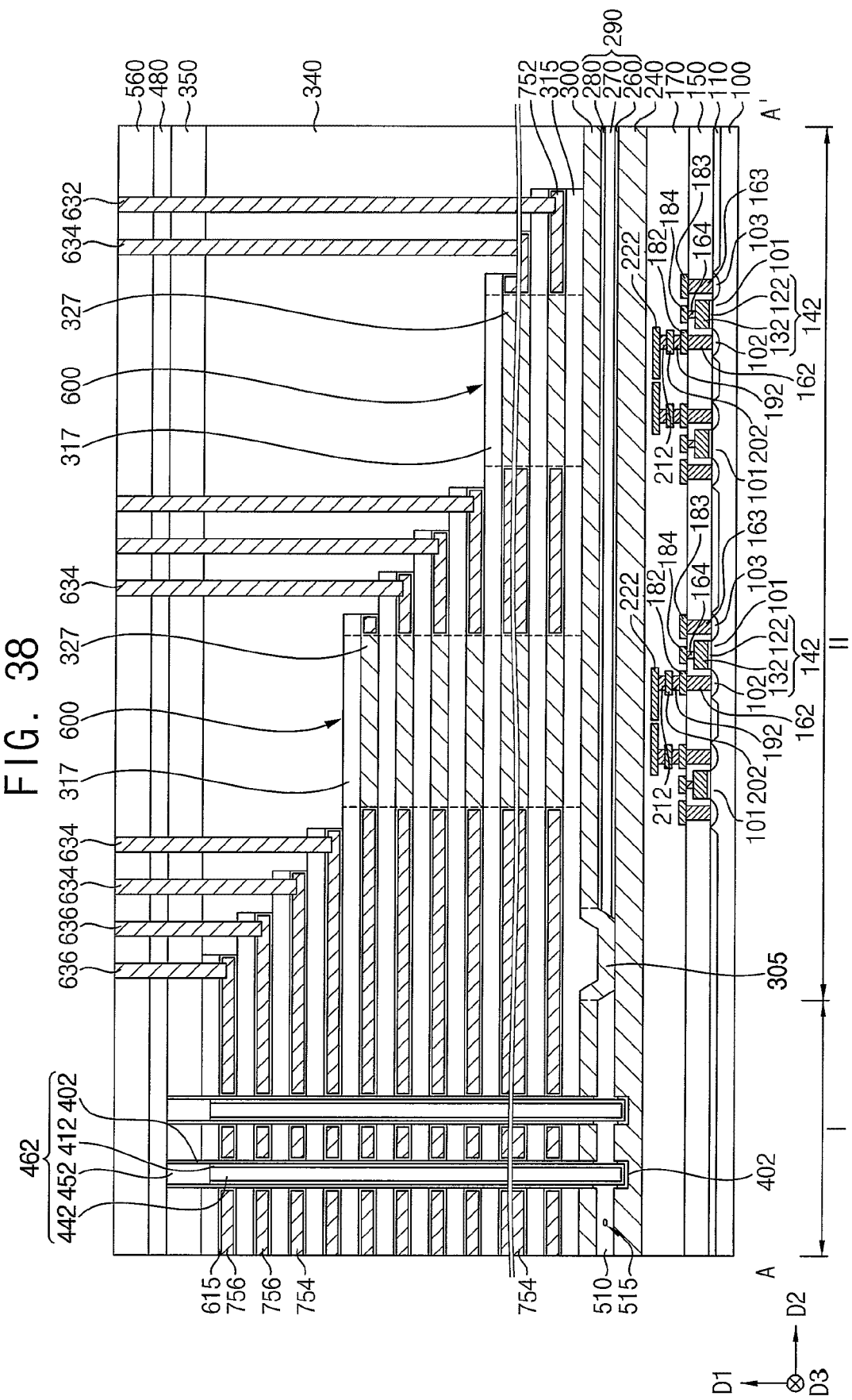

Referring to FIGS. 37 and 38, first to third upper contact plugs 632, 634, and 636 may be formed through the second support layer 560, the seventh to ninth insulating interlayers 340, 350, and 480, and the first insulation pattern 315 on the second region II of the substrate 100.

The first to third upper contact plugs 632, 634, and 636 may contact pads of the first to third gate electrodes 752, 754, and 756, respectively. In some example embodiments, each of the first to third upper contact plugs 632, 634, and 636 may be formed in an area surrounded by the support structure 464 in each of the first and second pads of the gate electrode structure. For example, the support structures 464 may be disposed at vertices of a rectangle in a plan view, and each of the first to third upper contact plugs 632, 634 and 636 may be formed in an inside of the rectangle.

FIGS. 37 and 38 shows an example layout of the first to third upper contact plugs 632, 634, and 636, however, the example embodiments are not limited thereto; for example, the numbers and layouts of the first to third upper contact plugs 632, 634, and 636 may be varied.

Figure 39:
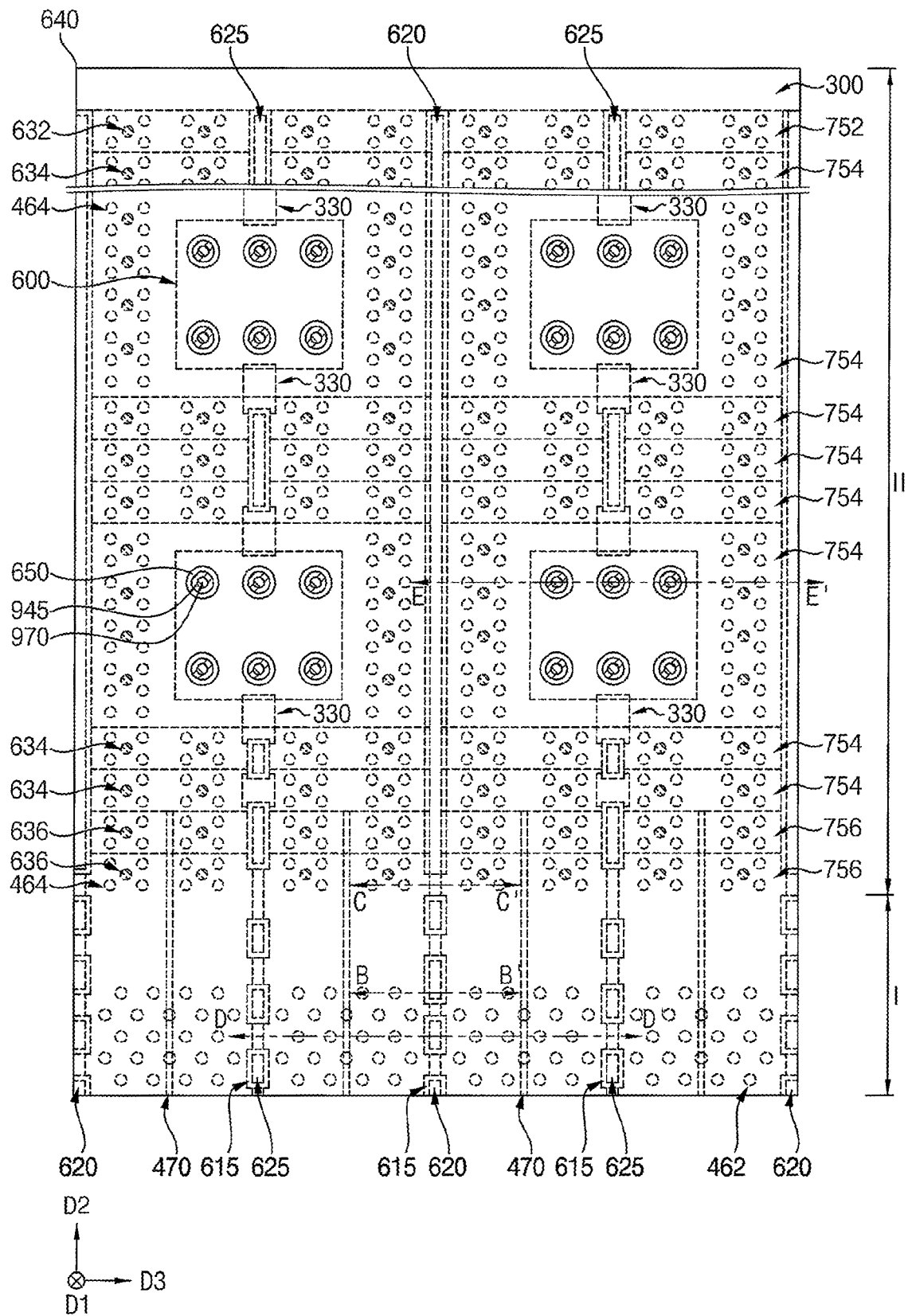
Figure 40A:
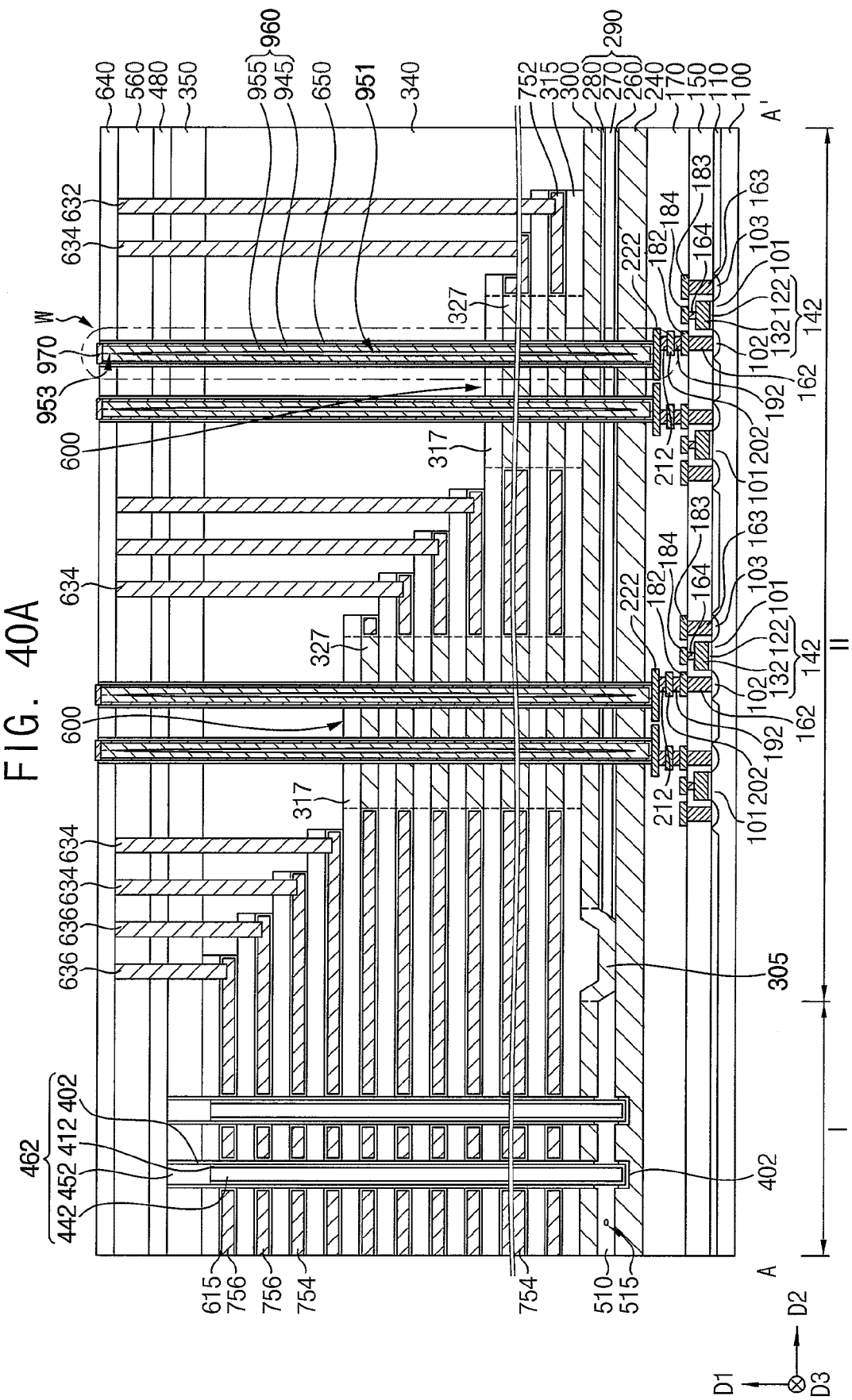
Figure 40B:
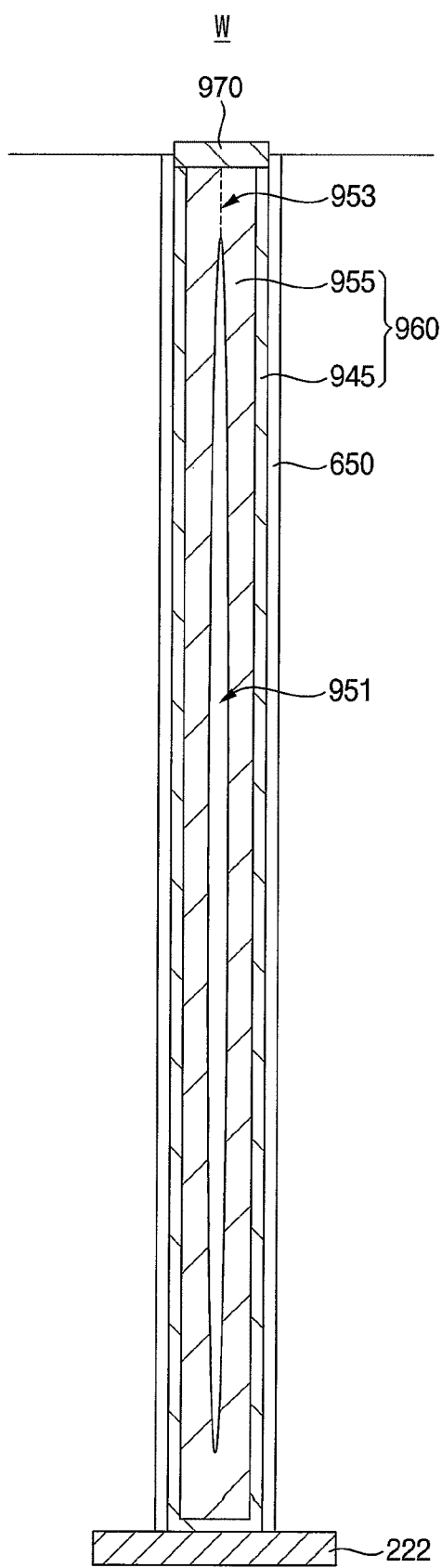

Referring to FIGS. 39, 40A and 40B, a tenth insulating interlayer 640 including an oxide (e.g., silicon oxide) may be formed on the second support layer 560 and the first to third upper contact plugs 632, 634, and 636, and a through via 960 may be formed through the seventh to tenth insulating interlayers 340, 350, 480, and 640, the second support layer 560, the insulation pattern structure 600, the first support layer 300, the first sacrificial layer structure 290, the CSP 240, and an upper portion of the sixth insulating interlayer 170 on the second region II of the substrate 100 to contact an upper surface of the eighth lower wiring 222.

A plurality of through vias 660 may be formed to be spaced apart from each other in an area where the insulation pattern structure 600 is formed. In the drawing, six through vias 660 are formed in each area; however, the example embodiments are not limited thereto.

In some embodiments, the through via 960 may extend through the insulating interlayer at an outside of the CSP 240, the seventh to tenth insulating interlayers 340, 350, 480, and 640 on the insulating interlayer, and an upper portion of the sixth insulating interlayer 170, instead of extending through the insulation pattern structure 600 in the gate electrode structure, the CSP 240 and the upper portion of the sixth insulating interlayer 170, to contact the upper surface of the eighth lower wiring 222.

A fourth insulation pattern 650 including an oxide (e.g., silicon oxide) may be formed on a sidewall of the through via 660, and may be electrically insulated from the first support layer 300 and the CSP 240. The through via 660 may extend through the insulation pattern structure 600 (e.g., the second and third insulation patterns 317 and 327) to be electrically insulated from the first to third gate electrodes 752, 754, and 756, and thus, if an additional insulation pattern is formed on sidewalls of the first support layer 300 and the CSP, the fourth insulation pattern 650 might not be formed.

In some example embodiments, the through via 960 may be formed by processes substantially the same as and/or similar to those illustrated with reference to FIGS. 1 and 2. Thus, the through via 960 may include a first metal pattern 955 and a first barrier pattern 945 covering a sidewall and a lower surface of the first metal pattern 955, and a fifth capping pattern 970 may be formed on the first metal pattern 955. The through via 960 may have a high aspect ratio, and thus a void 951 and/or a seam 953 may be formed therein. However, the source gas and/or an etching gas remaining in the void 951 and/or the seam 953 might not outgas out of the fifth capping pattern 970, so that neighboring structures might not be removed. Accordingly, the through via 960 may be protected by the fifth capping pattern 970, and might not be damaged by subsequent processes.

Referring to FIGS. 41A, 42, 43 and 44, an eleventh insulating interlayer 670 may be formed on the tenth insulating interlayer 640, the fourth insulation pattern 650 and the through via 960, and fourth to eighth upper contact plugs 682, 684, 686, 688, and 690 may be formed.

The fourth to sixth upper contact plugs 682, 684 and 686 may extend through the tenth and eleventh insulating interlayers 640 and 670 to contact upper surfaces of the first to third upper contact plugs 632, 634, and 636, respectively, the seventh upper contact plug 688 may extend through the eleventh insulating interlayer 670 to contact an upper surface of the fifth capping pattern 970 on the first metal pattern 955 of the through via 960, and the eighth upper contact plug 690 may extend through the second support layer 560 and the ninth to eleventh insulating interlayers 480, 640, and 670 to contact an upper surface of the third capping pattern 452.

A twelfth insulating interlayer 700 may be formed on the eleventh insulating interlayer 670 and the fourth to eighth upper contact plugs 682, 684, 686, 688, and 690, and first to fifth upper wirings 712, 714, 716, 718, and 720 may be formed through the twelfth insulating interlayer 700.

The first to fifth upper wirings 712, 714, 716, 718, and 720 may contact upper surfaces of the fourth to eighth upper contact plugs 682, 684, 686, 688, and 690, respectively.

Each of the eleventh and twelfth insulating interlayers 670 and 700 may include an oxide (e.g., silicon oxide, and each of the fourth to eighth upper contact plugs 682, 684, 686, 688, and 690 and the first to fifth upper wirings 712, 714, 716, 718 and 720 may include a metal, a metal nitride, a metal silicide, doped polysilicon, etc.

In example embodiments, the fifth upper wiring 720 may extend in the third direction D3, and a plurality of fifth upper wirings 720 may be spaced apart from each other in the second direction D2. The fifth upper wiring 720 may serve as a bit line of the semiconductor device. Alternatively, an upper via and a sixth upper wiring may be further formed on the fifth upper wiring 720, and the sixth upper wiring may serve as the bit line.

The first to fifth upper wirings 712, 714, 716, 718, and 720 may have various layouts on the second region II of the substrate 100.

The fabrication of the semiconductor device may be completed by the above processes. As illustrated above, the through via 960 may be formed between the eighth lower wiring 222 and the seventh upper contact plug 688 to have a high aspect ratio, and thus the void 951 and/or the seam 953 may be formed in the through via 960. The source gas may remain in the void 951 and/or the seam 953 to be combined with other elements to form an etching gas, however, the fifth capping pattern 970 may be further formed on the through via 960 so as to prevent the outgassing of the etching gas. Accordingly, the through via 960 may be prevented from being damaged by subsequent processes.

The semiconductor device may have the following structural characteristics.

Referring to FIGS. 40A to 44, the semiconductor device may include the lower circuit patterns on the substrate 100 including the first region I and the second region II at least partially surrounding the first region I; the CSP 240 over the lower circuit patterns; the gate electrode structure including the gate electrodes 752, 754, and 756, each of which may extend in the second direction D2, spaced apart from each other in the first direction D1 on the CSP 240; the memory channel structure 462 extending in the first direction D1 through the gate electrode structure on the first region I of the substrate 100 to be connected to the CSP 240; the support structure 464 extending through the gate electrode structure to be connected to the CSP 240 on the second region II of the substrate 100; the upper contact plugs 632, 634, and 636 extending in the first direction D1 to contact end portions in the second direction D2 (e.g., the pads of the gate electrodes 752, 754, and 756 on the second region II of the substrate 100); and the through via structure extending in the first direction D1 through the insulation pattern structure 600 in the gate electrode structure on the second region II of the substrate 100.

In some example embodiments, memory channel structure 462 may include the channel 412 extending in the first direction D1 and the charge storage structure 402 surrounding the outer sidewall of the channel 412.

In some example embodiments, the through via structure may include the through via 960 and the fifth capping pattern 970 contacting the upper surface of the through via 960. The through via 960 may extend in the first direction D1 to be electrically connected to the lower circuit patterns, and may include the first metal pattern 955 and the first barrier pattern 945 covering the sidewall and the lower surface of the first metal pattern 955. The lowermost surface of the edge portion of the fifth capping pattern 970 might not be higher than the lowermost surface of the central portion of the fifth capping pattern 970.

Figure 41B:
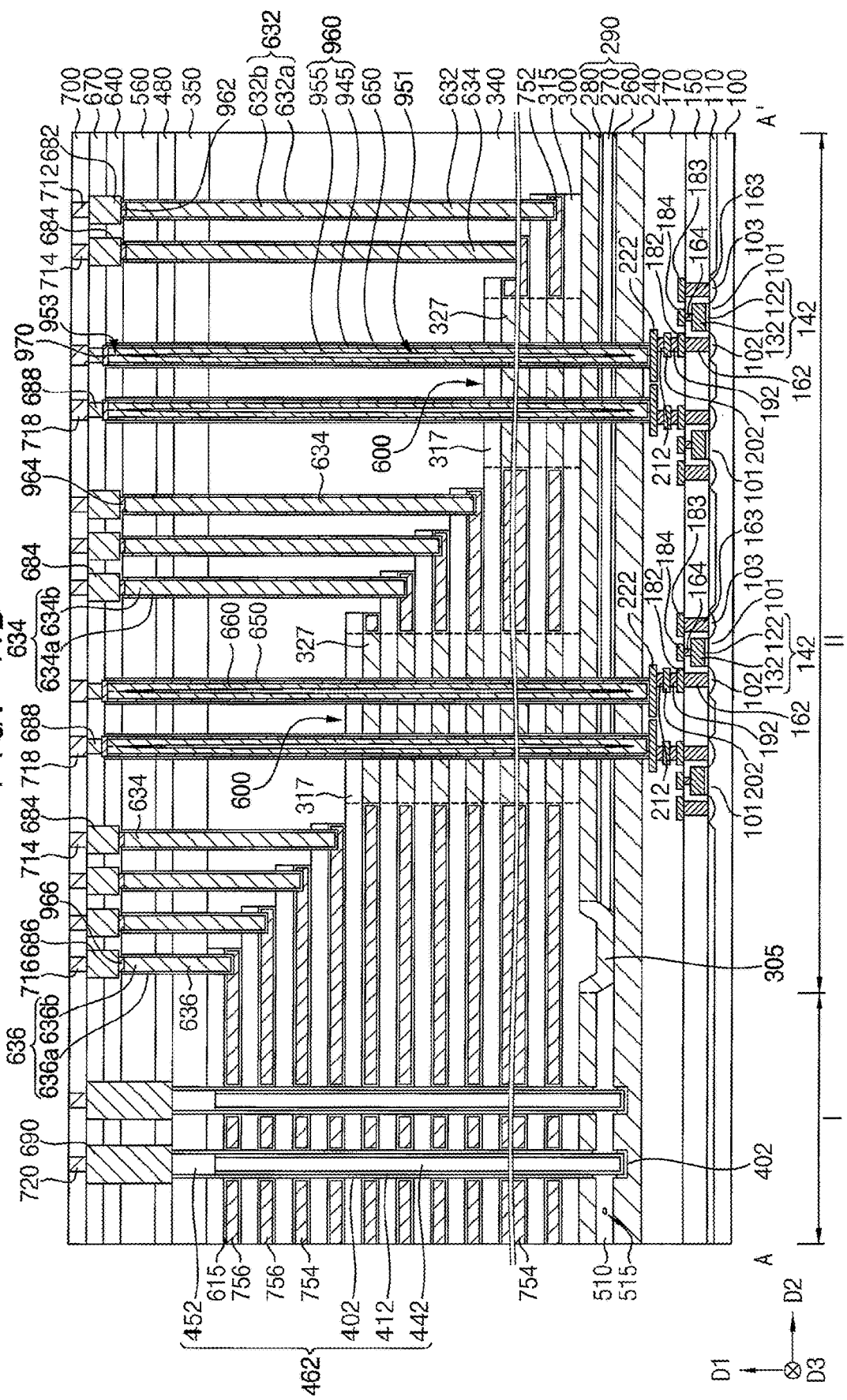
Figure 42:
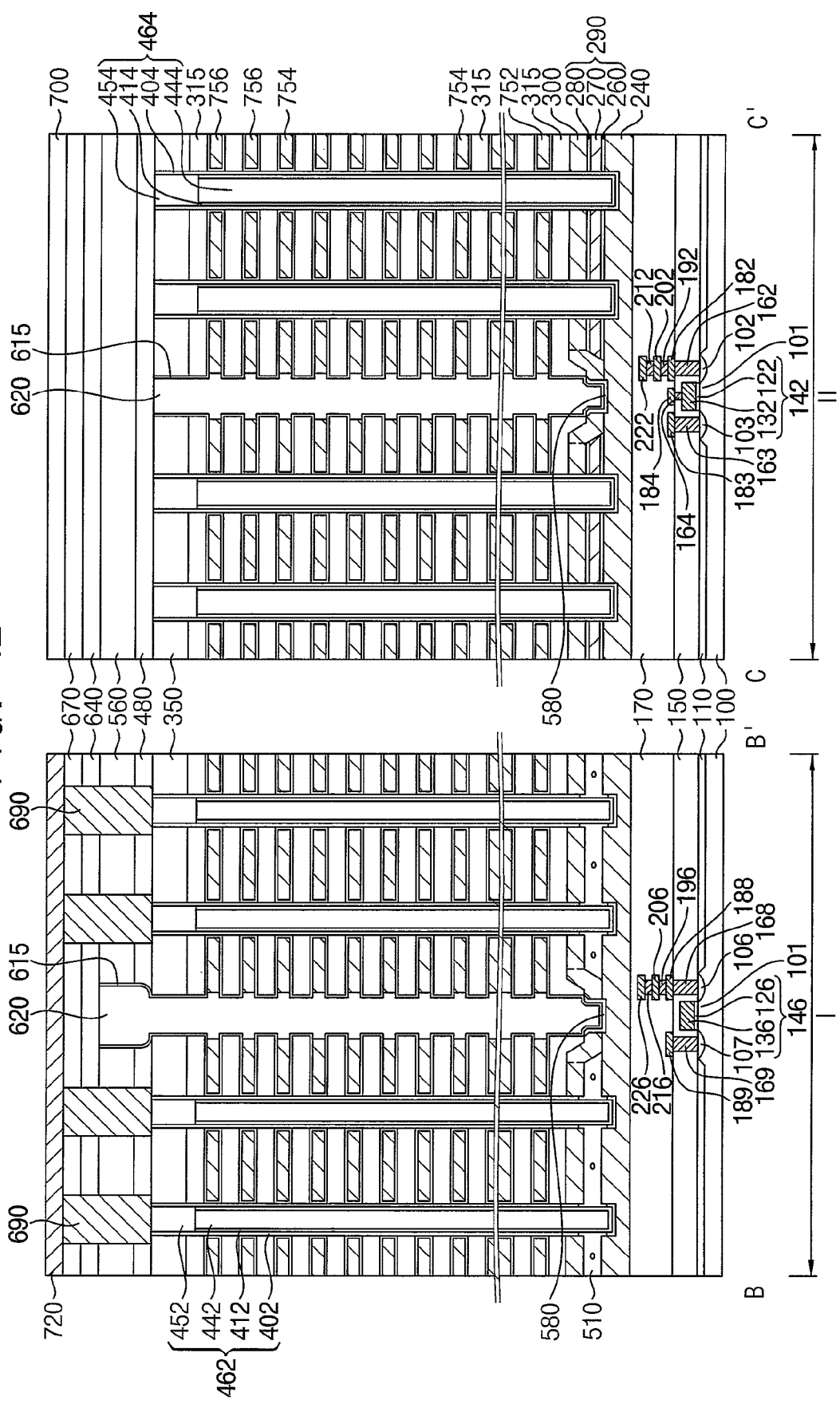

Referring to FIG. 41B, each of the first to third upper contact plugs 632, 634, and 636 may also have a structure similar to that of the through via 960, and the sixth to eighth capping patterns 972, 974, and 976 may be formed on the first to third upper contact plugs 632, 634, and 636, respectively.

Particularly, each of the first to third upper contact plugs 632, 634, and 636 may have a high aspect ratio, and thus a void and/or a seam may be formed therein. A source gas and/or an etching gas remaining in the void and/or the seam may outgas to damage neighboring structures and/or the first to third upper contact plugs 632, 634, and 636. However, the sixth to eighth capping patterns 972, 974, and 976 may be further formed on the first to third upper contact plugs 632, 634, and 636, respectively, to prevent the neighboring structures and/or the first to third upper contact plugs 632, 634, and 636 from being damaged.

The first upper contact plug 632 may include a second metal pattern 632b and a second barrier pattern 632a covering a sidewall and a lower surface of the second metal pattern 632b, the second upper contact plug 634 may include a third metal pattern 634b and a third barrier pattern 634a covering a sidewall and a lower surface of the third metal pattern 634b, and third upper contact plug 636 may include a fourth metal pattern 636b and a fourth barrier pattern 636a covering a sidewall and a lower surface of the fourth metal pattern 636b.

Figure 45:
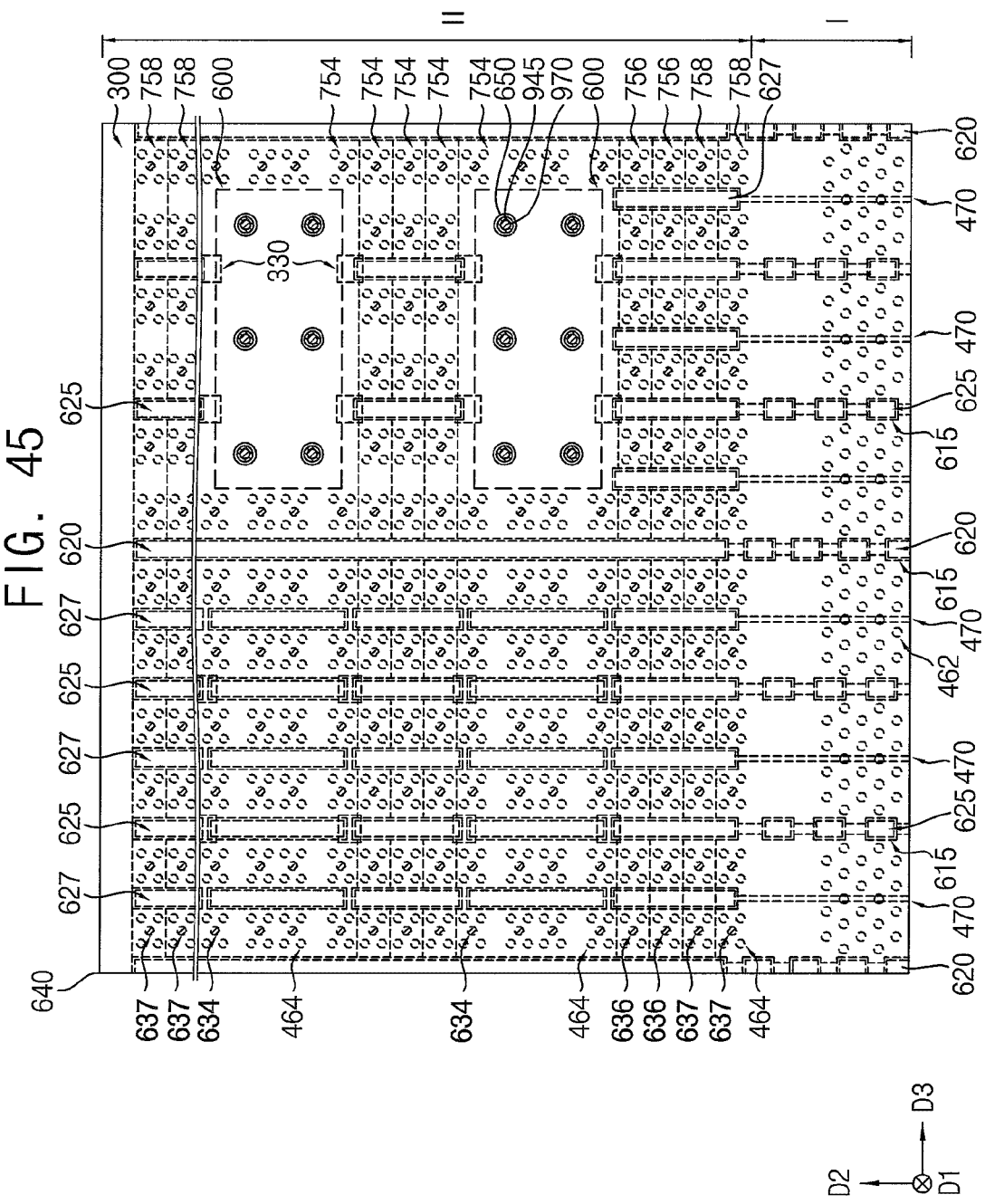
FIG. 45 is a plan view illustrating a semiconductor device in accordance with some example embodiments, which may correspond to FIG. 39.

FIG. 45 is a plan view illustrating a semiconductor device in accordance with some example embodiments, which may correspond to FIG. 39.

This semiconductor device may be substantially the same as and/or similar to that illustrated with reference to FIGS. 39 and 41 to 44, except for further including a GIDL gate electrode, an extension length of the second division pattern 470, and layouts of the fourth division pattern 625 and the insulation pattern structure 600.

Referring to FIG. 45, the gate electrode structure may further include fourth gate electrodes 758 under the first gate electrode 752 and over the third gate electrode 756, respectively, and a ninth upper contact plug 637 may be further formed on a pad of the fourth gate electrode 758, and may transfer electrical signals thereto. The fourth gate electrode 758 may be used in an erase operation for erasing data stored in the memory channel structure 462 by using a GIDL phenomenon.

In some example embodiments, the fourth gate electrodes 758 may be formed at two levels under the first gate electrode 752 and at upper two levels over the third gate electrode 756, however, the example embodiments are not limited thereto.

FIG. 45 shows two memory blocks arranged in the third direction D3, (e.g., first and second memory blocks that are separated from each other by the third division pattern 620).

In some example embodiments, in the first memory block, some of the fourth division patterns 625 may extend through the second pads of the gate electrode structure, and may be spaced apart from a remainder of the fourth division patterns 625 extending through the first pads of the gate electrode structure. In the second memory block, the insulation pattern structure 600 and the through via 960 extending in the first direction D1 through the insulation pattern structure 600 may be formed at the second pads of the gate electrode structure.

In the first memory block, two division pattern columns each of which may include a plurality of fourth division patterns 625 spaced apart from each other in the second direction D2 may be spaced apart from each other in the third direction D3 between neighboring ones of the third division patterns 620, and a fifth division pattern column including a plurality of fifth division patterns 627 spaced apart from each other in the second direction D2 may be further formed between the two fourth division pattern columns neighboring in the third direction D3 and between the third division pattern 620 and the fourth division pattern column neighboring in the third direction D3.

The second division pattern 470 may extend in the second direction D2 on the first region I of the substrate 100, and may also be formed on a portion of the second region II of the substrate 100 adjacent to the first region I of the substrate 100, and may contact one of the fifth division patterns 627 included in the fifth division pattern column, which is formed at an area adjacent to the first region I of the substrate 100 and extends through the third and fourth gate electrodes 756 and 758 at upper four levels. Thus, the third and fourth gate electrodes 756 and 758 at the four levels may be divided in the third direction D3 by the second division pattern 470 and the fifth division pattern 627.

The first division pattern 330 may overlap in the first direction D1 an area between the fourth division patterns 625 spaced apart from each other in the second direction D2 and extend through the first gate electrode 752, while the first division pattern 330 may not extend through a portion of the first gate electrode 752 overlapping in the first direction D1 an area between the fifth division patterns 627 spaced apart from each other in the second direction D2. Thus, the first gate electrode 752 might not be divided in the third direction D3 at the location of the fifth division patterns 627.

As a result, each first memory block may include three GSLs, one word line, and six SSLs at each level, and the second memory block may have the same numbers of the GSL, the word line and the SSL at each level.

Figure 43:
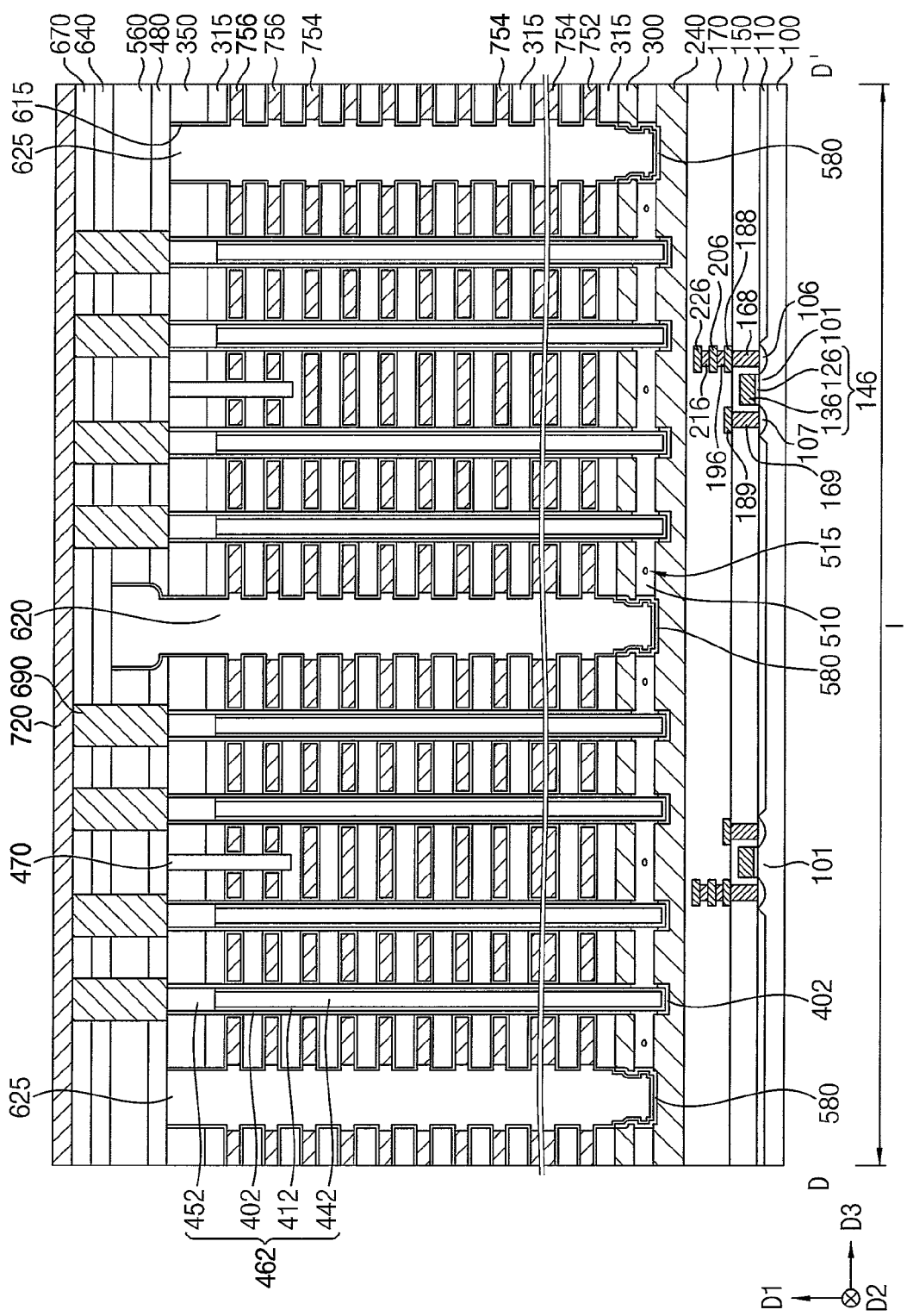
Figure 44:
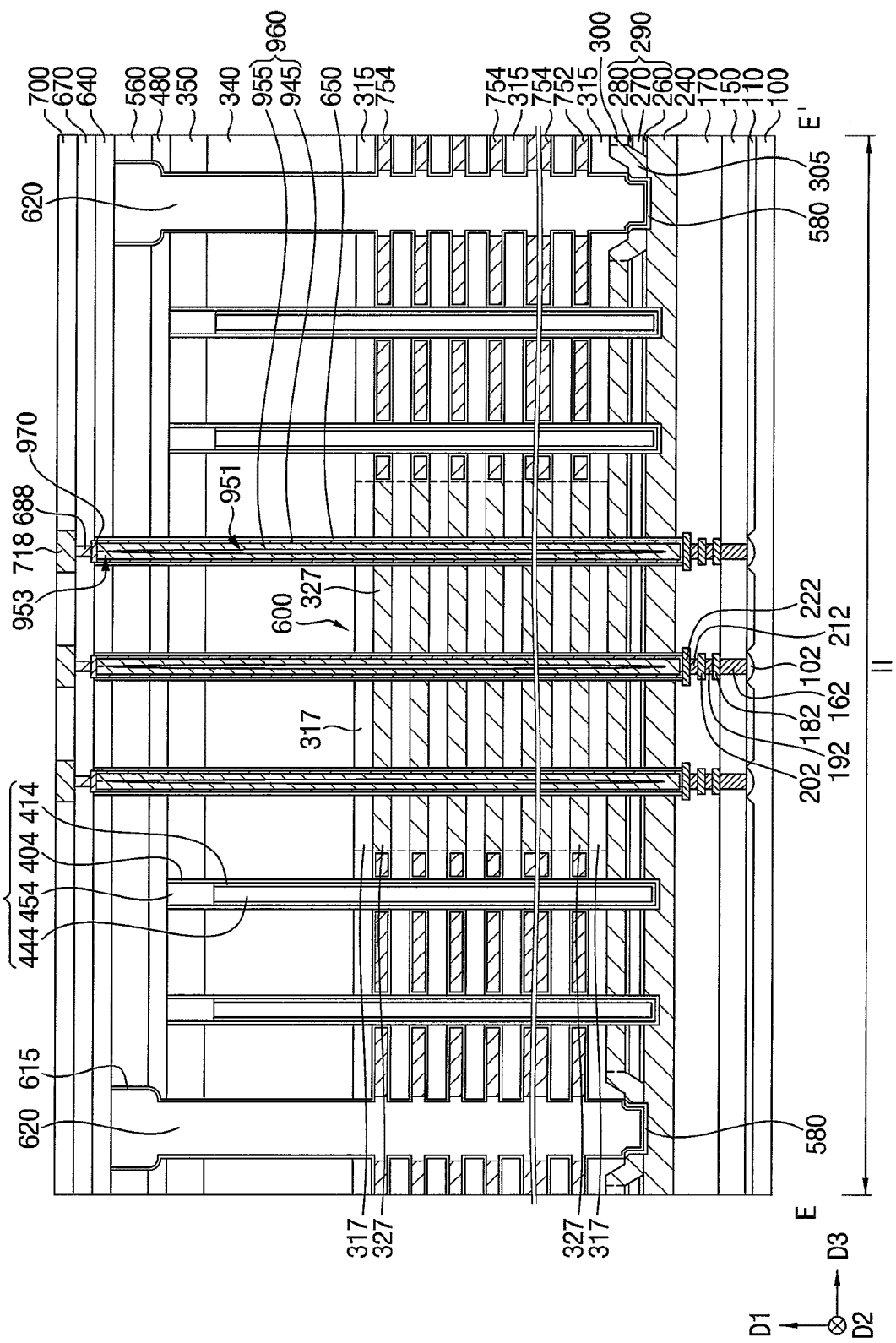
Figure 46:
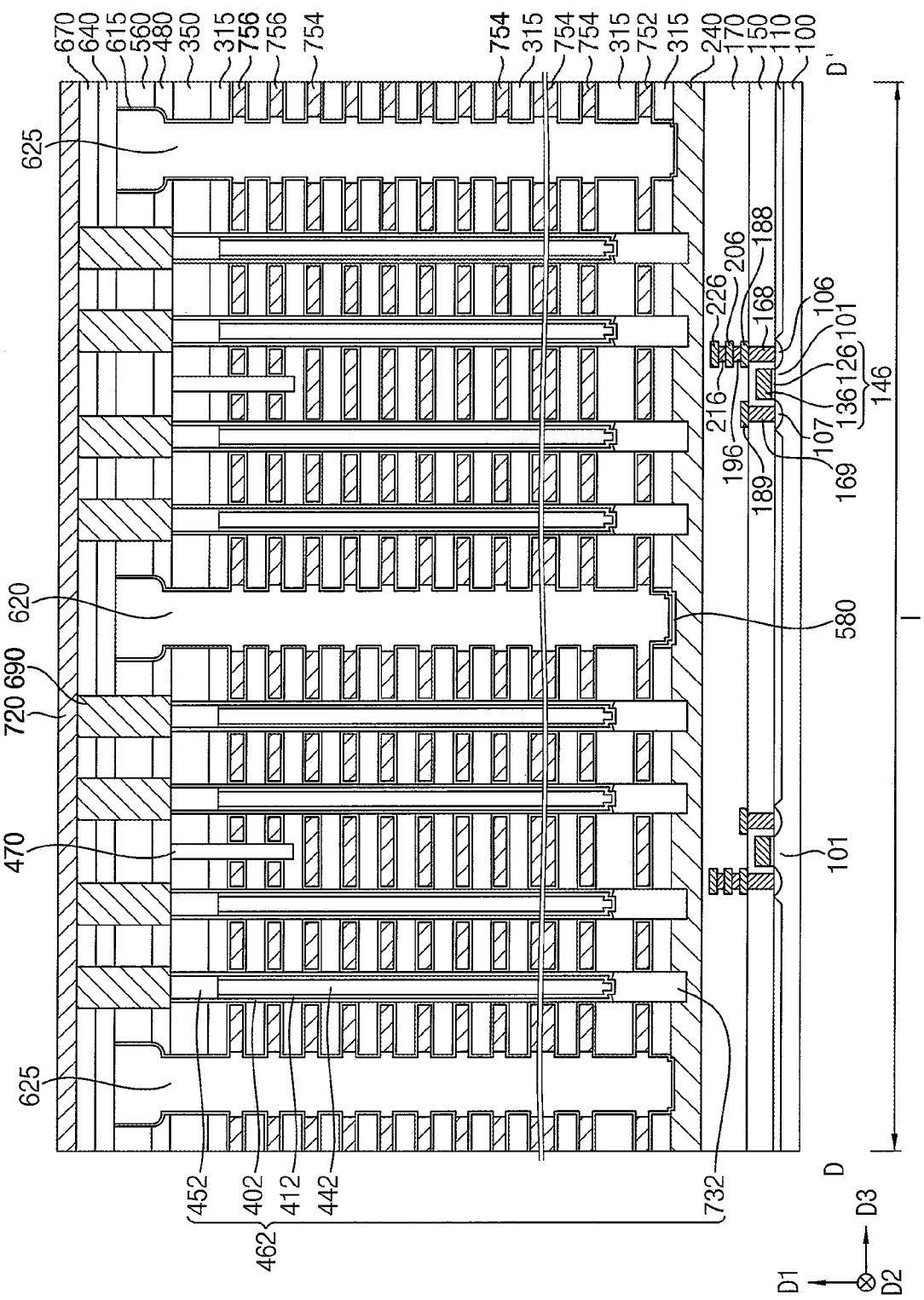
FIG. 46 is a cross-sectional view illustrating a semiconductor device in accordance with some example embodiments, which may correspond to FIG. 43.

FIG. 46 is a cross-sectional view illustrating a semiconductor device in accordance with some example embodiments, which may correspond to FIG. 43. This semiconductor device may be substantially the same as or similar to that of FIGS. 39 and 41 to 44, except for the memory channel structure 462, the channel connection pattern 510, the first support layer 300, the support pattern 305 and the protection layer 580.

The memory channel structure 462 may further include a first semiconductor pattern 732 on the substrate 100, and the charge storage structure 402, the channel 412, the first filling pattern 442, and the third capping pattern 452 may be formed on the first semiconductor pattern 732.

The first semiconductor pattern 732 may include a semiconductor (e.g., single crystalline silicon and/or polysilicon). In some example embodiments, an upper surface of the first semiconductor pattern 732 may be formed at a height between lower and upper surfaces of the first insulation pattern 315 between the first and second gate electrodes 752 and 754. The charge storage structure 402 may have a cup-like shape of which a central lower surface is opened, and may contact an edge upper surface of the first semiconductor pattern 732. The channel 412 may have a cup-like shape, and may contact a central upper surface of the first semiconductor pattern 732. Thus, the channel 412 may be electrically connected to the CSP 240 through the first semiconductor pattern 732.

The support structure 464 may further include a second semiconductor pattern on the substrate 100, and the dummy charge storage structure 404, the second filling pattern 444, and the fourth capping pattern 454 may be formed on the second semiconductor pattern.

The channel connection pattern 510, the first support layer 300, and the support pattern 305 might not be formed between the CSP 240 and the first gate electrode 752, and the protection layer 580 might not be formed. In some example embodiments, one of the first insulation patterns 315 between the first and second gate electrodes 752 and 754 may have a thickness greater than the first insulation patterns 315 at upper levels, respectively.

Figure 47:
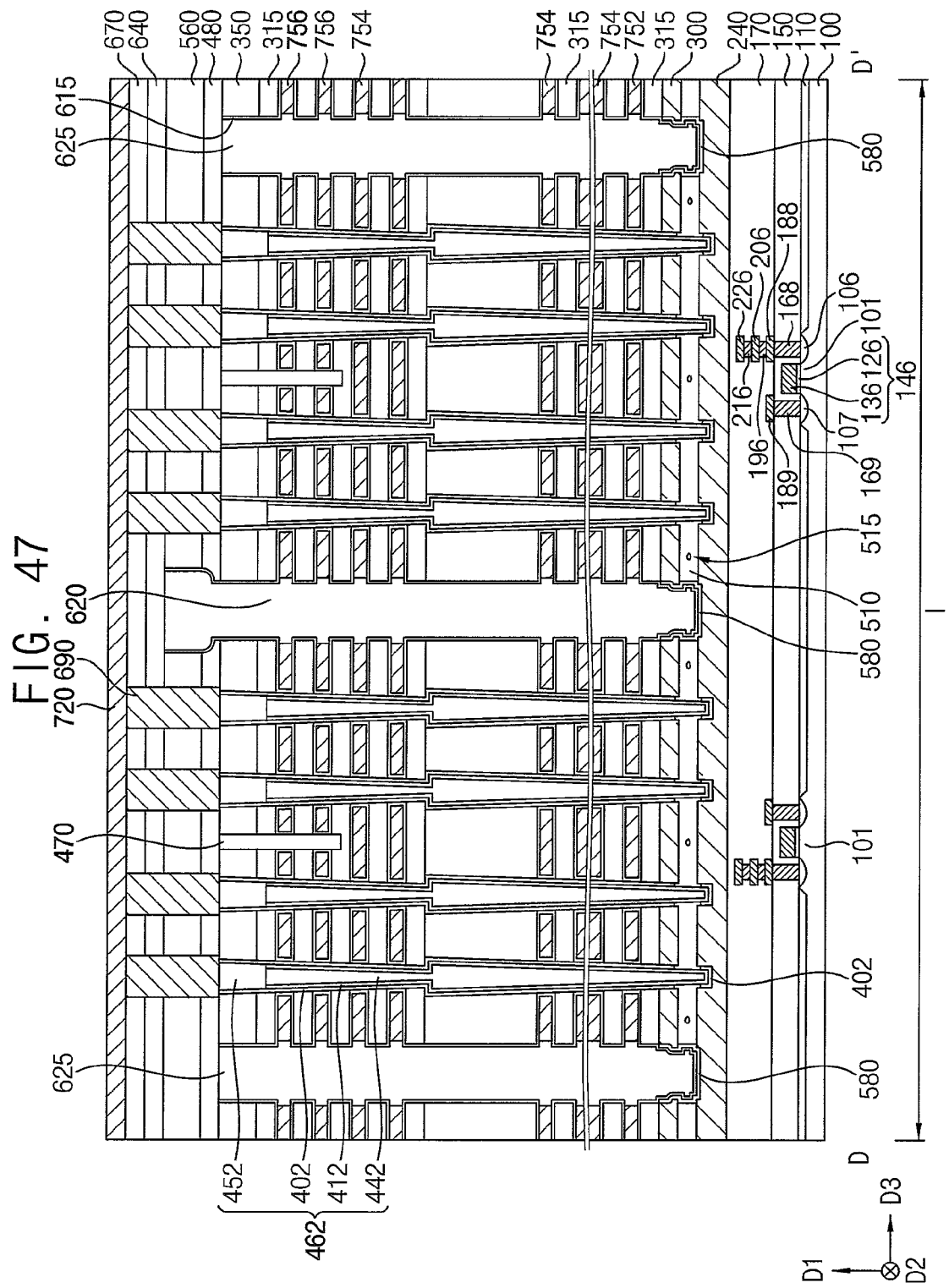
FIG. 47 is a cross-sectional view illustrating a semiconductor device in accordance with some example embodiments, which may correspond to FIG. 43.

FIG. 47 is a cross-sectional view illustrating a semiconductor device in accordance with some example embodiments, which may correspond to FIG. 43. This semiconductor device may be substantially the same as or similar to that of FIGS. 39 and 41 to 44, except for the shape of the memory channel structure 462.

The memory channel structure 462 may include lower and upper portions sequentially stacked, and each of the lower and upper portions may have a width gradually increasing from a bottom toward a top thereof. In example embodiments, a lower surface of the upper portion of the memory channel structure 462 may have an area less than that of an upper surface of the lower portion thereof.

In the drawing, the memory channel structure 462 includes two portions (e.g., the lower and upper portions); however, the example embodiments are not limited thereto, and may include more than two portions. Each of the portions of the memory channel structure 462 may have a width gradually increasing from a bottom toward a top thereof, and an area of a lower surface of an upper portion may be less than that of an upper surface of a lower portion that is directly under the upper portion.

Additionally, the support structure 464 may have the similar shape to that of the memory channel structure 462. For example, the support structure 464 may include a plurality of portions sequentially stacked, and each of the portions may have a width gradually increasing from a bottom toward a top thereof.

FIG. 48 is a cross-sectional view illustrating a semiconductor device in accordance with example embodiments, which may correspond to FIG. 43. This semiconductor device may be substantially the same as or similar to that of FIGS. 39 and 41 to 44, except that upper structures are overturned and bonding structures are further formed. The lower circuit patterns may corresponding to the peripheral circuit wirings 4110 of FIG. 10, and circuit structures including the lower circuit patterns may correspond to the first structure 4100 of FIG. 10.

In some example embodiments, thirteenth to sixteenth insulating interlayers 800, 820, 840, and 860 may be sequentially stacked on the eighth and ninth lower wirings 222 and 226 and the sixth insulating interlayer 170. Additionally, a first bonding pattern extending through the thirteenth insulating interlayer 800 to contact the eighth lower wiring 222, and a second bonding pattern 810 extending through the thirteenth insulating interlayer 800 to contact the ninth lower wiring 226 may be formed. Furthermore, a third bonding pattern extending through the fourteenth insulating interlayer 820 to contact the first bonding pattern, and a fourth bonding pattern 830 extending through the fourteenth insulating interlayer 820 to contact the second bonding pattern 810 may be formed. The first and third bonding patterns and the second and fourth bonding patterns 810 and 830 may include a metal (e.g., copper, aluminum, etc.), and may be formed by, e.g., a dual damascene process.

A seventh upper wiring extending through the fifteenth insulating interlayer 840 to contact the third bonding pattern, and an eighth upper wiring 850 extending through the fifteenth insulating interlayer 840 to contact the fourth bonding pattern 830 may be formed, and a first upper via extending through the sixteenth insulating interlayer 860 to contact the seventh upper wiring, and a second upper via 870 extending through the sixteenth insulating interlayer 860 to contact the eighth upper wiring 850 may be formed.

At least some of the first to fifth upper wirings 712, 714, 716, 718, and 720, and at least some of the sixth upper wirings may be electrically connected to the lower circuit patterns through the first and third bonding patterns or the second and fourth bonding patterns 810 and 830.

Any of the elements and/or functional blocks disclosed above, for example, the controller 1200, the peripheral circuit structure of the first structure 1100F, the electronic system 2000, may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While some example embodiments have been particularly shown and described, it will be understood by one of ordinary skill in the art that variations in form and detail may be made therein without departing from the spirit and scope of the claims.

What is claimed is:
1. A through via structure comprising:
a through via including
a metal pattern, the metal pattern extending in a vertical direction and fully enclosing a gap in the metal pattern, wherein the metal pattern includes a seam extending vertically from the gap in the metal pattern, and wherein an etching gas used to form the metal pattern remains in the gap in the metal pattern,
and
a barrier pattern on a sidewall and a lower surface of the metal pattern; and a capping pattern contacting an upper surface of the through via, the capping pattern including a lowermost edge portion, and the lowermost edge portion of the capping pattern is not higher than a lowermost central portion of the capping pattern.

2. The through via structure of claim 1, wherein the capping pattern is on an upper surface of the metal pattern, and is not on an uppermost surface of the barrier pattern.

3. The through via structure of claim 2, wherein an upper surface of the capping pattern is higher than the uppermost surface of the barrier pattern.

4. The through via structure of claim 2, wherein a lower surface of the capping pattern is lower than the uppermost surface of the barrier pattern.

5. The through via structure of claim 2, wherein the capping pattern includes at least one of a metal silicide of a metal included in the metal pattern or a compound of the metal included in the metal pattern and silicon nitride.

6. The through via structure of claim 5, wherein
the metal pattern includes tungsten, and
the capping pattern includes at least one of tungsten silicon nitride or tungsten silicide.

7. The through via structure of claim 2, wherein
the capping pattern is a first capping pattern, and
the through via structure further comprises a second capping pattern contacting the uppermost surface of the barrier pattern.

8. The through via structure of claim 7, wherein
the barrier pattern includes a metal nitride, and
the second capping pattern includes a compound of a metal included in the barrier pattern and silicon nitride.

9. The through via structure of claim 8, wherein
the barrier pattern includes titanium nitride, and
the second capping pattern includes titanium silicon nitride.

10. The through via structure of claim 1, further comprising:
an upper via contacting the capping pattern.

11. The through via structure of claim 10, wherein the upper via extends through the capping pattern and contacts the metal pattern.

12. The through via structure of claim 10, wherein
the upper via extends through an upper portion of the capping pattern, and
a lower surface of the upper via is lower than an uppermost surface of the capping pattern.

13. The through via structure of claim 1, wherein a lower surface of the capping pattern has a constant height.

14. A through via structure comprising:
an insulating interlayer;
a through via including a metal pattern extending through the insulating interlayer in a vertical direction, the metal pattern including a first metal and a gap fully enclosed in the metal pattern, wherein the metal pattern includes a seam extending vertically from the gap in the metal pattern, and wherein an etching gas used to form the metal pattern remains in the gap in the metal pattern,
and
a barrier pattern on a sidewall and a lower surface of the metal pattern, the barrier pattern including a nitride of a second metal; and a first capping pattern contacting an upper surface of the through via, the first capping pattern including at least one of a silicide of the first metal or a compound of the first metal and silicon nitride, the first capping pattern including a lowermost edge portion, the lower most edge portion of the first capping pattern is not higher than a lowermost central portion of the first capping pattern.

15. The through via structure of claim 14, wherein
an upper surface of the first capping pattern is higher than an uppermost surface of the barrier pattern, and
a lower surface of the first capping pattern is lower than the uppermost surface of the barrier pattern.

16. The through via structure of claim 14, further comprising:
a second capping pattern contacting an uppermost surface of the barrier pattern, the second capping pattern including a compound of the second metal and silicon nitride.

17. A semiconductor device comprising:
lower circuit patterns on a substrate;
a common source plate (CSP) over the lower circuit patterns;
a gate electrode structure on the CSP, the gate electrode structure including gate electrodes spaced apart from each other in a vertical direction perpendicular to an upper surface of the substrate, and each of the gate electrodes extending in a second direction parallel to the upper surface of the substrate;
a memory channel structure extending through the gate electrode structure on the substrate and connected to the CSP, the memory channel structure including
a channel extending in the vertical direction, and
a charge storage structure surrounding an outer sidewall of the channel;
and
a through via structure including a through via having
a metal pattern extending in the vertical direction and fully enclosing a gap in the metal pattern, wherein the metal pattern includes a seam extending vertically from the gap in the metal pattern, and wherein an etching gas used to form the metal pattern remains in the gap in the metal pattern,
and
a barrier pattern on a sidewall and a lower surface of the metal pattern, and
a capping pattern contacting an upper surface of the through via, the capping pattern including a lowermost edge portion of the capping pattern, the lowermost edge portion is not higher than a lowermost surface of a central portion of the capping pattern.

18. The semiconductor device of claim 17, wherein the through via extends through the gate electrode structure and the CSP to contact at least one of the lower circuit patterns.

19. The semiconductor device of claim 17, further comprising:
an insulating interlayer on sidewalls of the CSP and the gate electrode structure,
wherein the through via extends through the insulating interlayer to contact at least one of the lower circuit patterns.

* * * * *